(12) United States Patent
Yamazaki

(10) Patent No.: US 10,096,628 B2
(45) Date of Patent: Oct. 9, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 11 days.

(21) Appl. No.: 15/444,695

(22) Filed: Feb. 28, 2017

(65) Prior Publication Data

US 2017/0256572 A1 Sep. 7, 2017

(30) Foreign Application Priority Data

Mar. 4, 2016 (JP) ................. 2016-042358
Mar. 4, 2016 (JP) ................. 2016-042749

(51) Int. Cl.
*H01L 27/12* (2006.01)
*H01L 29/786* (2006.01)
*H01L 21/67* (2006.01)
*H01L 21/673* (2006.01)
*H01L 27/146* (2006.01)
(Continued)

(52) U.S. Cl.
CPC .......... *H01L 27/1255* (2013.01); *G06F 3/065* (2013.01); *G06F 3/0619* (2013.01); *G06F 3/0685* (2013.01); *G11C 11/418* (2013.01); *G11C 11/419* (2013.01); *H01L 21/67196* (2013.01); *H01L 21/67389* (2013.01); *H01L 27/14645* (2013.01); *H01L 29/78693* (2013.01)

(58) Field of Classification Search
USPC .......................................... 257/43
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 104662668 A 5/2015
DE 112013004655 7/2015
(Continued)

OTHER PUBLICATIONS

International Search Report (Application No. PCT/IB2017/051021) dated May 30, 2017.
(Continued)

*Primary Examiner* — Marcos D Pizarro
*Assistant Examiner* — Lawrence Tynes, Jr.
(74) *Attorney, Agent, or Firm* — Robinson Intellectual Property Law Office; Eric J. Robinson

(57) ABSTRACT

Provided is a novel semiconductor device. A switching element, specifically a transistor having a well potential structure is manufactured by utilizing a structure including at least a composite material in which a first region and a second region are stacked over a base like a superlattice. The thickness of each of the first region and the second region is greater than or equal to 0.5 nm and less than or equal to 5 nm. A band structure can be controlled by adjusting the number of stacks, which enables application to a variety of semiconductor elements.

10 Claims, 41 Drawing Sheets

(51) Int. Cl.
*G06F 3/06* (2006.01)
*G11C 11/419* (2006.01)
*G11C 11/418* (2006.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,049,258 B2 | 5/2006 | Ohsato et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,581,266 B2 * | 11/2013 | Nowatari | H01L 51/5016 257/87 |
| 8,729,547 B2 * | 5/2014 | Miyairi | H01L 27/1225 257/43 |
| 9,246,013 B2 * | 1/2016 | Ahmed | H01L 29/66969 |
| 9,478,603 B2 | 10/2016 | Yamazaki et al. | |
| 9,478,668 B2 | 10/2016 | Takahashi et al. | |
| 9,601,635 B2 * | 3/2017 | Yamazaki | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025676 A1 * | 2/2010 | Yamazaki | H01L 29/78618 257/43 |
| 2010/0025677 A1 * | 2/2010 | Yamazaki | H01L 27/1225 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0084267 A1 * | 4/2011 | Yamazaki | H01L 27/1225 257/43 |
| 2011/0084268 A1 * | 4/2011 | Yamazaki | H01L 27/1214 257/43 |
| 2011/0084272 A1 * | 4/2011 | Miyanaga | H01L 29/45 257/43 |
| 2014/0001032 A1 | 1/2014 | Yamazaki | |
| 2014/0084287 A1 | 3/2014 | Yamazaki | |
| 2014/0106502 A1 | 4/2014 | Tezuka et al. | |
| 2014/0346500 A1 | 11/2014 | Yamazaki | |
| 2015/0318171 A1 | 11/2015 | Yamazaki | |
| 2016/0118254 A1 | 4/2016 | Yamazaki | |
| 2016/0190346 A1 | 6/2016 | Kawata et al. | |
| 2016/0225620 A1 | 8/2016 | Yamazaki | |
| 2016/0247902 A1 | 8/2016 | Yamazaki | |
| 2016/0349557 A1 | 12/2016 | Shishido et al. | |
| 2016/0349558 A1 | 12/2016 | Shishido et al. | |
| 2016/0356645 A1 | 12/2016 | Yoneda et al. | |
| 2016/0365367 A1 | 12/2016 | Kimura et al. | |
| 2016/0372606 A1 | 12/2016 | Ito et al. | |
| 2016/0381266 A1 | 12/2016 | Ohmaru | |
| 2017/0256572 A1 * | 9/2017 | Yamazaki | G06F 3/0619 |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | | | |
|---|---|---|---|---|
| JP | 2002-076356 | A | 3/2002 | |
| JP | 2002-289859 | A | 10/2002 | |
| JP | 2003-086000 | A | 3/2003 | |
| JP | 2003-086808 | A | 3/2003 | |
| JP | 2004-103957 | A | 4/2004 | |
| JP | 2004-273614 | A | 9/2004 | |
| JP | 2004-273732 | A | 9/2004 | |
| JP | 2007-096055 | A | 4/2007 | |
| JP | 2013-084735 | A | 5/2013 | |
| JP | 2013-225551 | A | 10/2013 | |
| JP | WO 2014046220 | * | 3/2014 | ........... H01L 29/786 |
| JP | WO2014046220 | * | 3/2014 | ........... H01L 29/786 |
| JP | 2014-078706 | A | 5/2014 | |
| JP | 2014-199905 | A | 10/2014 | |
| KR | 2014-0049934 | A | 4/2014 | |
| KR | 2015-0058425 | A | 5/2015 | |
| TW | 201417293 | | 5/2014 | |
| WO | WO-20041114391 | | 12/2004 | |
| WO | WO-2014/046220 | | 3/2014 | |

OTHER PUBLICATIONS

Written Opinion (Application No. PCT/IB2017/051021) dated May 30, 2017.

Kamiya.T et al., "Electron-Beam-Induced Crystallization of Amorphous In—Ga—Zn—O Thin Films Fabricated by UHV Sputtering", IDW '13 : Proceedings of the 20th International Display Workshops, Dec. 4, 2013, pp. 280-281.

Yamazaki.S et al., "Properties of crystalline In—Ga—Zn-oxide semiconductor and its transistor characteristics", Jpn. J, Appl. Phys. (Japanese Journal of Applied Physics ) , Apr. 1, 2014, vol. 53, No. 4, pp. 04ED18-1-04ED18-10.

Yamazaki.S et al., "Back-channel-etched thin-film transistor using c-axis-aligned crystal In—Ga—Zn oxide", J. Soc. Inf, Display (Journal of the Society for Information Display), 2014, vol. 22, No. 1, pp. 55-67.

Yamazaki.S, "Crystalline Oxide Semiconductor Using CAAC-IGZO and its Application", ECS Transactions, Oct. 1, 2014, vol. 64, No. 10, pp. 155-164, The Electrochemical Society.

Hosemann.R, "Crystalline and Paracrystalline Order in High Polymers", J. Appl. Phys. (Journal of Applied Physics) , 1963, vol. 34, No. 1, pp. 25-41.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21,2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo,H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett, (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo,H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp, 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp, 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters ) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi,H et al., "39.1:Invited Paper:Optically Isotropic Nano-Structured Liquid Crystal Composites for Display Applications", SID Digest '09 : SID International Symposium Digest of Technical Papers, May 31, 2009, 578-581.

Kikuchi.H et al., "62.2:Invited Paper:Fast Electro-Optical Switching in Polymer-Stabilized Liquid Crystalline Blue Phases for display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000 ° C.", Journal of Solid State Chemistry, 1985, vol. 60, pp. 382-384.

Kimizuka.N. et al., "Syntheses and Single-Crystal Data of Homologous Compounds, In2O3(ZnO)m (m =3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics ) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics ) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters ) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al,, "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev, B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", SID Digest '09 : SID International Symposium Digest of Technical Papers, May 31, 2009, vol. 40, pp. 184-187.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. , (Applied Physics Letters ) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl, Phys. Lett. (Applied Physics Letters ) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett, (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp, 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

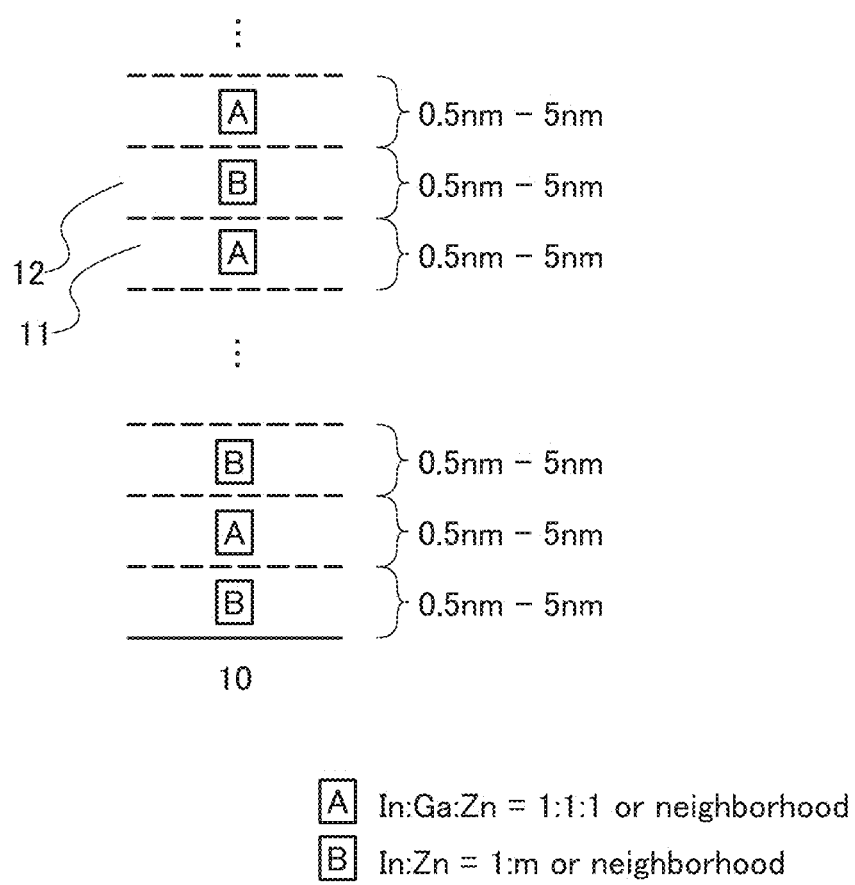

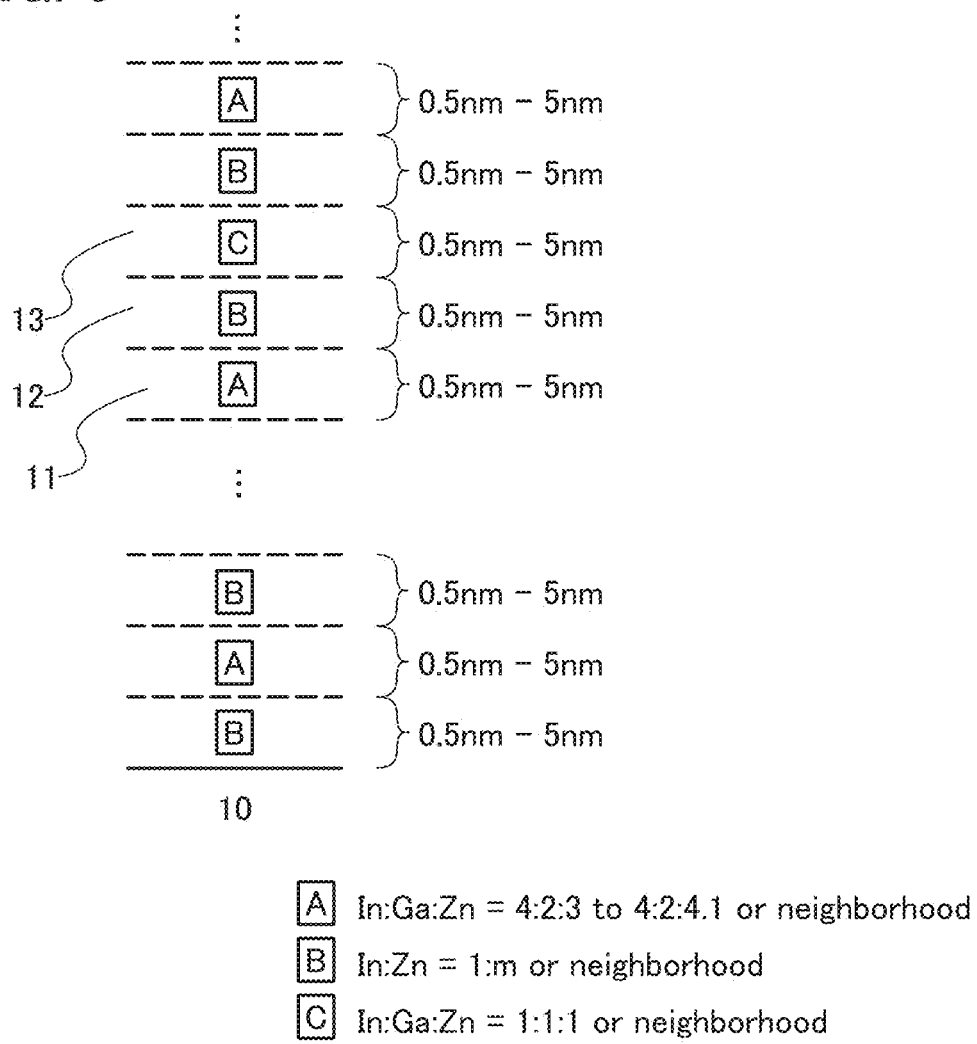

10

10

A  In:Ga:Zn = 4:2:3 to 4:2:4.1 or neighborhood
B  In:Ga:Zn = X:Y:Z (0<Y<Z, 0<Y<X) or neighborhood
* Ga concentration of B is lower than that of A

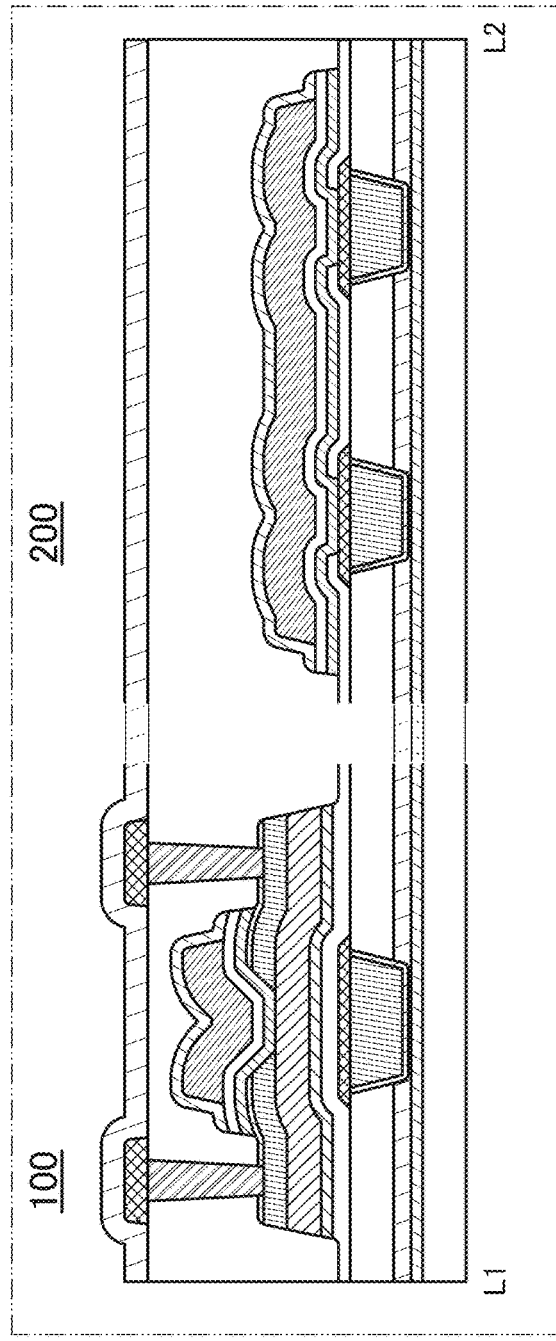
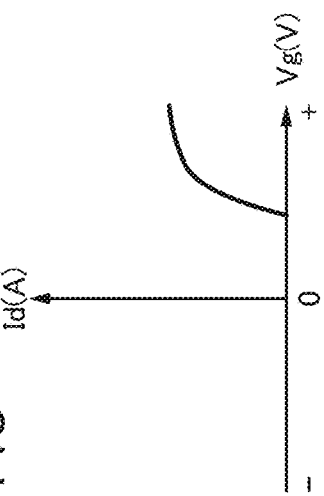
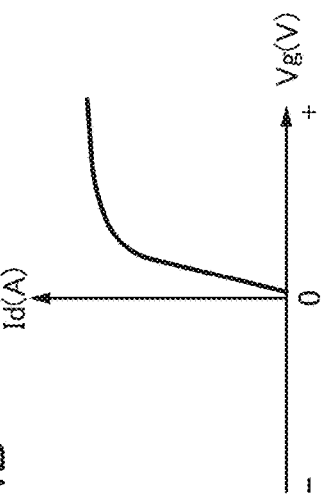

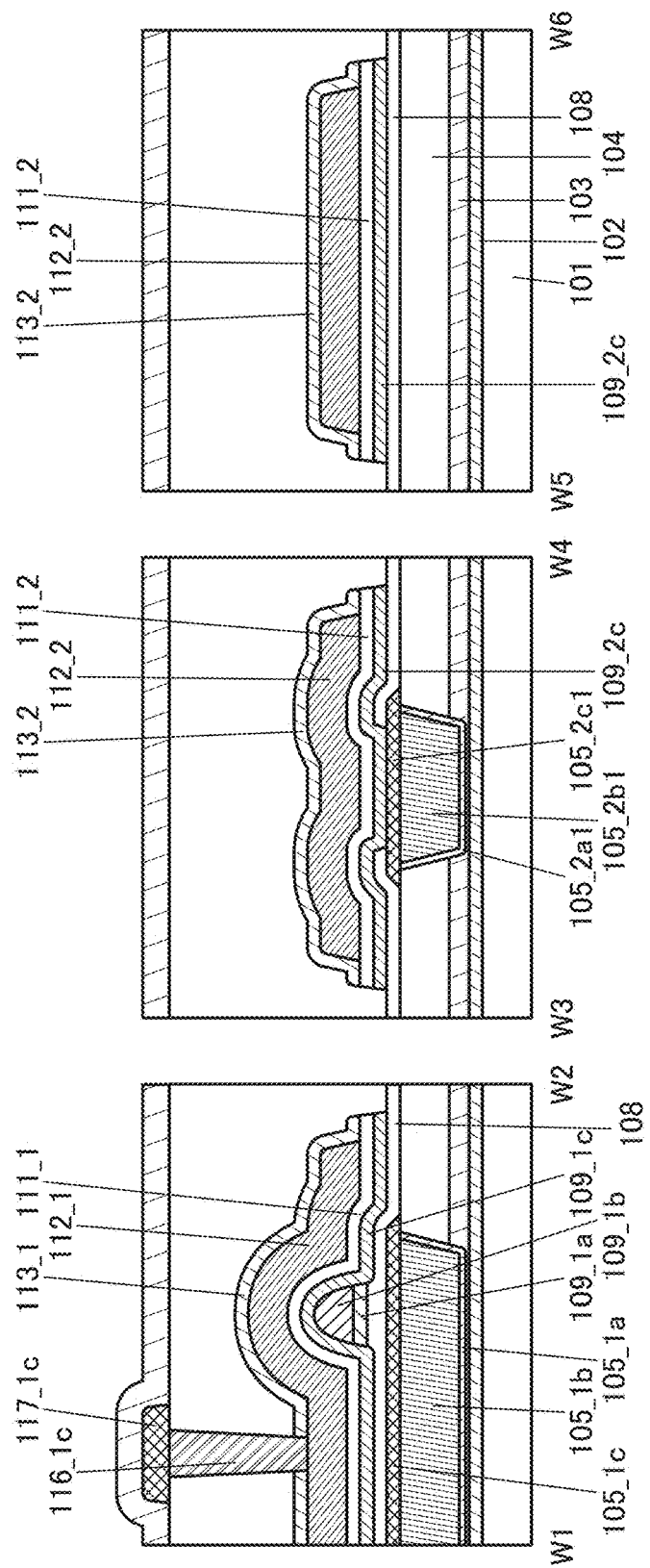

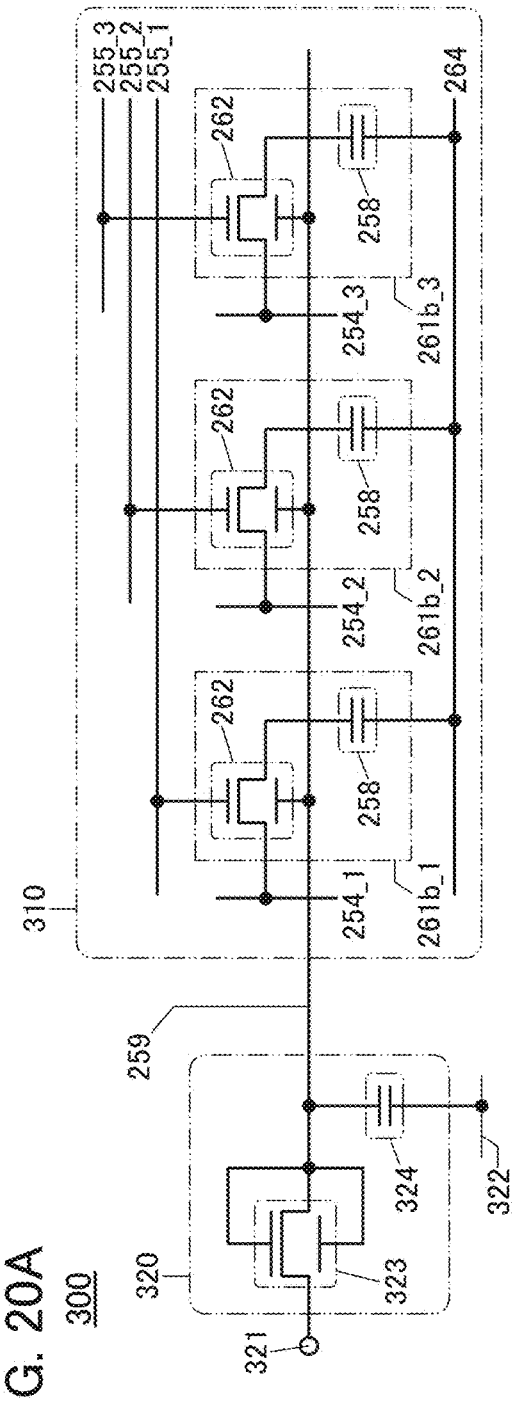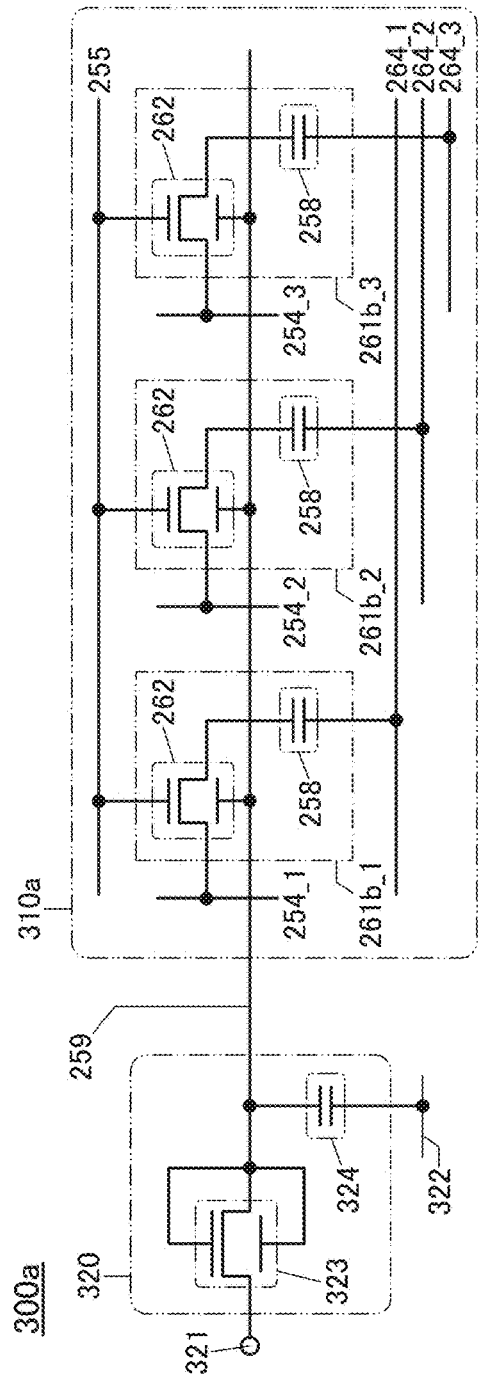

SEMICONDUCTOR DEVICE AND MANUFACTURING METHOD THEREOF

TECHNICAL FIELD

The present invention relates to a transistor, a semiconductor device, and manufacturing methods thereof, for example. The present invention relates to, for example, a display device, a light-emitting device, a lighting device, a power storage device, a memory device, an imaging device, a processor, and an electronic device. The present invention relates to a method for manufacturing a display device, a liquid crystal display device, a light-emitting device, a memory device, an imaging device, and an electronic device. The present invention relates to a driving method of a semiconductor device, a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

In recent years, transistors including oxide semiconductors (typically, In—Ga—Zn oxide) have been actively developed. Oxide semiconductors have been researched since early times. In 1988, there was a disclosure of a crystal In—Ga—Zn oxide that can be used for a semiconductor element (see Patent Document 1).

Non-Patent Document 1 discloses a homologous series represented by $In_{1-x}Ga_{1+x}O_3(ZnO)_m$ ($-1 \leq x \leq 1$, and m is a natural number). Furthermore, Non-Patent Document 1 discloses a solid solution range of the homologous series. For example, in the solid solution range of the homologous series in the case where m is 1, x ranges from −0.33 to 0.08, and in the solid solution range of the homologous series in the case where m is 2, x ranges from −0.68 to 0.32.

Furthermore, a technique for forming a transistor using an In—Ga—Zn-based oxide semiconductor is disclosed (see, for example, Patent Document 2).

[Patent Document]
[Patent Document 1] Japanese Published Patent Application No. S63-239117
[Patent Document 2] Japanese Published Patent Application No. 2007-096055
[Non-Patent Document]
[Non-Patent Document 1] M. Nakamura, N. Kimizuka, and T. Mohri, "The Phase Relations in the $In_2O_3$—$Ga_2ZnO_4$—ZnO System at 1350° C.," *J. Solid State Chem.*, 1991, Vol. 93, pp. 298-315.

DISCLOSURE OF INVENTION

A transistor, which is a typical semiconductor element, is required to have high electrical characteristics (e.g., high on-state current or high field-effect mobility), low power consumption, and high reliability. To achieve high integration of a semiconductor device, the transistor is also required to achieve fine processing, mass production by a relatively simple process, and low manufacturing cost.

A material used for a channel formation region, which influences the characteristics of a transistor most strongly, is amorphous silicon, polycrystalline silicon, single crystal silicon, or an oxide semiconductor, for example.

The transistors including oxide semiconductors have features different from those of the transistors including amorphous silicon or polycrystalline silicon.

There is a problem in that it is difficult to provide a high-performance display device where driver circuits are formed over the same substrate because a transistor including amorphous silicon has low field-effect mobility.

Polycrystalline silicon has a problem of a step of performing high-temperature heat treatment or laser light treatment on amorphous silicon.

Consequently, it is desirable to use a novel oxide semiconductor material to provide a transistor which has higher field-effect mobility than a transistor including polycrystalline silicon, without performing laser light treatment.

A display device in which a transistor including an oxide semiconductor is used is known to have low power consumption. An oxide semiconductor can be formed by a sputtering method or the like, and thus can be used in a transistor included in a large display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

An object is to provide a transistor with stable electrical characteristics. Another object is to provide a transistor having a low leakage current in an off state. Another object is to provide a transistor with high frequency characteristics. Another object is to provide a transistor having a high on-state current. Another object is to provide a transistor with normally-off electrical characteristics. Another object is to provide a transistor with a small subthreshold swing value. Another object is to provide a highly reliable transistor.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Non-Patent Document 1 discloses an example of $In_xZn_y$-$Ga_zO_w$, and when x, y, and z are set such that a composition in the neighborhood of $ZnGa_2O_4$ is obtained, that is, when x, y, and z are close to 0, 1, and 2, respectively, a spinel crystal structure is likely to be formed or mixed. A compound represented by $AB_2O_4$ (A and B are metals) is known as a compound having a spinel crystal structure.

However, when a spinel crystal structure is formed or mixed in an In—Ga—Zn-based oxide semiconductor, electrical characteristics or reliability of a semiconductor device (e.g., a transistor) including the In—Ga—Zn-based oxide semiconductor is adversely affected by the spinel crystal structure in some cases.

Therefore, a semiconductor element including a novel composite material is provided.

According to one embodiment of the present invention, a first region and a second region in contact with the first region are arranged in the thickness direction. The first region contains at least indium, gallium, and zinc, and the second region contains indium and zinc. The second region has a lower gallium concentration and higher carrier mobility than the first region.

The thickness of the first region in the above structure may be greater than or equal to 0.5 nm and less than or equal to 5 nm.

The thickness of the second region in the above structure may be greater than or equal to 0.5 nm and less than or equal to 5 nm.

The first region and the second region in the above structure may be alternately stacked.

The first region in the above structure may be non-single crystal.

The first region in the above structure may include a crystal portion, and have a portion in which a c-axis of the crystal portion is parallel to a normal vector of a formation surface of an oxide semiconductor film.

The second region in the above structure may be non-single crystal.

One embodiment of the present invention is a transistor including the oxide semiconductor having the above structure.

FIG. 1 is a schematic diagram illustrating an example of a novel composite material used for a semiconductor element.

As illustrated in FIG. 1, the novel composite material includes at least a composite in which a first region and a second region are stacked over a base. By adjusting the number of stacks, the band structure can be controlled, and application to a variety of semiconductor elements can be achieved. The stacked structure can be referred to as a structure like a superlattice. A transistor having the structure is a completely novel transistor.

The novel composite material illustrated in FIG. 1 includes at least a composite material (also referred to as a composite) including a stack in which a first region (specifically, with [In]:[Ga]:[Zn]=4:2:3 or a neighborhood thereof) is sandwiched between second regions (specifically, with [In]:[Zn]=1:m (m is a rational number) or a neighborhood thereof). The first region including an oxide material has a thickness of greater than or equal to 0.5 nm and less than or equal to 5 nm and includes In, Ga, and Zn. The second region including an oxide material has a thickness of greater than or equal to 0.5 nm and less than or equal to 5 nm and includes In and Zn.

Specifically, deposition is performed using a sputtering target having a composition represented by a region including [In]:[Ga]:[Zn]=4:2:3 and a neighborhood thereof, a composition represented by a region including [In]:[Ga]:[Zn]=5:2:5 and a neighborhood thereof, or a composition represented by a region including [In]:[Ga]:[Zn]=6:1:6 and a neighborhood thereof, adjusting the temperature to room temperature or lower than 140° C., and setting the ratio of an oxygen gas flow rate to an argon gas flow rate, that is, $O_2$/Ar to greater than or equal to 5% and less than or equal to 20%, preferably greater than or equal to 7% and less than or equal to 15%, and then oxygen is supplied from above or below the obtained composite material thin film, thus, the composite material including the first region and the second region is obtained. As a method for supplying oxygen from above or below the composite material thin film, oxygen plasma treatment and a method of providing a film containing excess oxygen above or below the composite material thin film, and then diffusing excess oxygen by heat treatment can be given. Excess oxygen is diffused into the second region to reduce oxygen vacancies therein.

In the case where the composite material is over and in contact with the base, the second region is provided to be in contact with the base. Zinc with the lowest atomic weight in the metal elements contained in the sputtering target for an oxide semiconductor is more easily deposited on the substrate side than the other elements with larger atomic weight than zinc, and bonds for forming hexagonal lattices are formed. Thus, the second region represented by [In]:[Zn]=1:m (m is a rational number) is formed in contact with the substrate surface. When the second region is formed, a crystal having a hexagonal crystal structure which has bonds for forming hexagonal lattices in the a-b plane parallel to the substrate surface thereover and in which c-axes are substantially perpendicular to the substrate surface which is substantially parallel to the a-b plane is easily formed. The crystal having the hexagonal crystal structure is a crystalline oxide semiconductor (c-axis aligned crystal; also referred to as CAAC OS) including a c-axis substantially perpendicular to the substrate plane and corresponds to the first region.

The CAAC-OS has c-axis alignment, its nanocrystals are connected in the a-b plane direction, and its crystal structure has distortion.

An a-like OS has a structure between those of the nc-OS and the amorphous oxide semiconductor. The a-like OS includes a void or a low-density region. That is, the a-like OS has an unstable structure as compared with the nc-OS and the CAAC-OS.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an amorphous-like oxide semiconductor (a-like OS) or an amorphous oxide semiconductor, depending on an analysis method.

One embodiment of the present invention is a semiconductor device including a semiconductor element, specifically a field-effect transistor, in which a first region and a second region in contact with the first region are stacked in the thickness direction. The first region includes at least indium, gallium, and zinc. The second region includes indium and zinc. The second region serves as a well portion of a well potential in the thickness direction. The second region has a smaller bandgap than the first region. The second region is located between the first regions in the thickness direction.

In the above structure, the thickness of each of the first region and the second region is greater than or equal to 0.5 nm and less than or equal to 5 nm. The first region and the second region have different main functions. The first region has a property of bending an energy band, and the second region has a function of making carriers flow. As the thickness of the first region is smaller, higher switching characteristics can be obtained.

In the above structure, a structure in which the first region and the second region are alternately stacked is used. Although the second region tends to be unstable, the second region becomes wholly stable by providing the second region between the first regions which are stable in the vertical direction. Furthermore, division into two layers occurs during deposition, and a structure in which the first region and the second region are alternately stacked by one-time deposition using a sputtering method is obtained. Part of the composite material including the first region and the second region may be periodically stacked.

In the above structure, the number of gallium atoms in the composite material including the first region and the second region is smaller than the number of indium atoms in the composite material and is smaller than the number of zinc atoms in the composite material, for example, the atomic ratio of indium to gallium and zinc is [In]:[Ga]:[Zn]=4:2:3 or neighborhood thereof. The atomic ratio of indium to gallium and zinc in the composite material may be [In]: [Ga]:[Zn]=5:2:5. The atomic ratio of indium, gallium, and zinc in the composite material may be [In]:[Ga]:[Zn]=6:1:6.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Therefore, the oxide semiconductor of one embodiment of the present invention is not uniquely determined by an atomic ratio. Meanwhile, the atomic ratio affects difficulty in forming the structure. Even with the same atomic ratio, the structure is not formed depending on a fabrication method in some cases. Therefore, the illustrated regions each represent an atomic ratio with which an oxide semiconductor has a layered structure, and boundaries of the regions A to C are not clear.

A sputtering apparatus and a deposition apparatus with which the oxide semiconductor is formed are described with reference to FIGS. 34A and 34B, FIGS. 35A and 35B, FIGS. 36A to 36C, FIG. 37, FIG. 38, FIGS. 39A and 39B, FIG. 40, and FIGS. 41A to 41C.

<Sputtering Apparatus>

Examples of sputtering apparatuses include a parallel-plate-type sputtering apparatus and a facing-targets sputtering apparatus. Note that deposition using a parallel-plate-type sputtering apparatus can also be referred to as parallel electrode sputtering (PESP), and deposition using a facing-targets sputtering apparatus can also be referred to as vapor deposition sputtering (VDSP).

[Parallel-Plate-Type Sputtering Apparatus (PESP)]

First, the parallel-plate-type sputtering apparatus is described. FIG. 34A is a cross-sectional view of a deposition chamber 2501 including a parallel-plate-type sputtering apparatus. The deposition chamber 2501 in FIG. 34A includes a target holder 2520, a backing plate 2510, a target 2500, a magnet unit 2530, and a substrate holder 2570. Note that the target 2500 is placed over the backing plate 2510. The backing plate 2510 is placed over the target holder 2520.

The magnet unit 2530 is placed under the target 2500 with the backing plate 2510 positioned therebetween. The substrate holder 2570 faces the target 2500. Note that in this specification, a magnet unit means a group of magnets. The term "magnet unit" can be replaced with "cathode", "cathode magnet", "magnetic member", "magnetic part", or the like. The magnet unit 2530 includes a magnet 2530N, a magnet 2530S, and a magnet holder 2532. Note that in the magnet unit 2530, the magnet 2530N and the magnet 2530S are placed over the magnet holder 2532. The magnet 2530N and the magnet 2530S are spaced. When a substrate 2560 is transferred into the deposition chamber 2501, the substrate 2560 is placed on the substrate holder 2570.

The target holder 2520 and the backing plate 2510 are fixed to each other with a screw (e.g., a bolt) and have the same potential. The target holder 2520 has a function of supporting the target 2500 with the backing plate 2510 positioned therebetween.

The target 2500 is fixed to the backing plate 2510. For example, the target 2500 can be fixed to the backing plate 2510 with a bonding member containing a low-melting-point metal such as indium.

FIG. 34A illustrates a magnetic line of force 2580a and a magnetic line of force 2580b formed by the magnet unit 2530.

The magnetic line of force 2580a is one of magnetic lines of force that form a horizontal magnetic field in the vicinity of the top surface of the target 2500. The vicinity of the top surface of the target 2500 corresponds to a region in which the vertical distance from the top surface of the target 2500 is, for example, greater than or equal to 0 mm and less than or equal to 10 mm, in particular, greater than or equal to 0 mm and less than or equal to 5 mm.

The magnetic line of force 2580b is one of magnetic lines of force that form a horizontal magnetic field in a plane apart from the top surface of the magnet unit 2530 by a vertical distance d. The vertical distance d is, for example, greater than or equal to 0 mm and less than or equal to 20 mm or greater than or equal to 5 mm and less than or equal to 15 mm.

Here, with the use of the strong magnet 2530N and the strong magnet 2530S, an intense magnetic field can be generated in the vicinity of the substrate 2560. Specifically, the magnetic flux density of the horizontal magnetic field in the vicinity of the substrate 2560 can be greater than or equal to 10 G and less than or equal to 100 G, preferably greater than or equal to 15 G and less than or equal to 60 G, further preferably greater than or equal to 20 G and less than or equal to 40 G.

Note that the intensity of the horizontal magnetic field may be measured when the intensity of the vertical magnetic field is 0 G.

By setting the intensity of the magnetic field in the deposition chamber 2501 to be in the above range, an oxide with high density and high crystallinity can be deposited. The deposited oxide hardly includes a plurality of kinds of crystalline phases and has a substantially single crystalline phase.

FIG. 34B is a top view of the magnet unit 2530. In the magnet unit 2530, the magnet 2530N having a circular or substantially circular shape and the magnet 2530S having a circular or substantially circular shape are fixed to the magnet holder 2532. The magnet unit 2530 can be rotated about a normal vector at the center of the top surface of the magnet unit 2530 or a normal vector substantially at the center of the top surface of the magnet unit 2530. For example, the magnet unit 2530 may be rotated with a beat (also referred to as rhythm, pulse, frequency, period, cycle, or the like) of greater than or equal to 0.1 Hz and less than or equal to 1 kHz.

Thus, a region where a magnetic field on the target 2500 is intense changes as the magnet unit 2530 is rotated. The region with an intense magnetic field is a high-density plasma region; thus, sputtering of the target 2500 easily occurs in the vicinity of the region. For example, when the region with an intense magnetic field is fixed, only a specific region of the target 2500 is used. In contrast, when the magnet unit 2530 is rotated as shown in FIG. 34B, the target 2500 can be uniformly used. By rotating the magnet unit 2530, a film with a uniform thickness and a film with uniform quality can be deposited.

By rotating the magnet unit 2530, the direction of the magnetic line of force in the vicinity of the substrate 2560 can also be changed.

Although the magnet unit 2530 is rotated in this example, one embodiment of the present invention is not limited to this example. For example, the magnet unit 2530 may be oscillated vertically and/or horizontally. For example, the magnet unit 2530 may be oscillated with a beat of greater than or equal to 0.1 Hz and less than or equal to 1 kHz. Alternatively, the target 2500 may be rotated or moved. For example, the target 2500 may be rotated or moved with a beat of greater than or equal to 0.1 Hz and less than or equal to 1 kHz. Further alternatively, the direction of a magnetic line of force in the vicinity of the substrate 2560 may be changed relatively by rotating the substrate 2560. These methods may be combined.

The deposition chamber 2501 may have a water channel inside or under the backing plate 2510. By making a fluid (air, nitrogen, a rare gas, water, oil, or the like) flow through the water channel, discharge anomaly due to an increase in the temperature of the target 2500 or damage to the deposition chamber 2501 due to deformation of a component can be prevented in the sputtering. In that case, the backing plate 2510 and the target 2500 are preferably adhered to each other with a bonding member because the cooling capability is increased.

A gasket is preferably provided between the target holder 2520 and the backing plate 2510, in which case an impurity is less likely to enter the deposition chamber 2501 from the outside, the water channel, or the like.

In the magnet unit 2530, the magnet 2530N and the magnet 2530S are placed such that their surfaces on the target 2500 side have opposite polarities. Here, the case where the pole of the magnet 2530N on the target 2500 side is the north pole and the pole of the magnet 2530S on the target 2500 side is the south pole is described. Note that the layout of the magnets and the poles in the magnet unit 2530 is not limited to that described here or that illustrated in FIG. 34A.

In the deposition, a potential applied to a terminal V1 connected to the target holder 2520 is, for example, lower than a potential applied to a terminal V2 connected to the substrate holder 2570. The potential applied to the terminal V2 connected to the substrate holder 2570 is, for example, the ground potential. A potential applied to the terminal V3 connected to the magnet holder 2532 is, for example, the ground potential. Note that the potentials applied to the terminals V1, V2, and V3 are not limited to the above description. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source or an RF power source may be used.

A cation in plasma 2540 is accelerated toward the target 2500 by a potential V1 applied to the target holder 2520. When the cation collides with the target 2500, sputtered particles are generated and deposited on the substrate 2560.

FIG. 34A illustrates an example where the backing plate 2510 and the target holder 2520 are not electrically connected to the magnet unit 2530 and the magnet holder 2532, but electrical connection is not limited thereto. For example, the backing plate 2510 and the target holder 2520 may be electrically connected to the magnet unit 2530 and the magnet holder 2532, and the backing plate 2510, the target holder 2520, the magnet unit 2530, and the magnet holder 2532 may have the same potential.

To increase the crystallinity of the deposited oxide, the temperature of the substrate 2560 may be set high. By setting the temperature of the substrate 2560 high, migration of sputtered particles in the vicinity of the substrate 2560 can be promoted. Thus, an oxide with higher density and higher crystallinity can be deposited. Note that the temperature of the substrate 2560 is, for example, higher than or equal to room temperature and lower than 540° C., preferably higher than or equal to room temperature and lower than or equal to 500° C., further preferably higher than or equal to 100° C. and lower than or equal to 450° C., still further preferably higher than or equal to 100° C. and lower than or equal to 400° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, still further preferably less than or equal to 15 vol %.

The vertical distance between the target 2500 and the substrate 2560 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2500 and the substrate 2560 can be, in some cases, small enough to suppress a decrease in the energy of the sputtered particles until the sputtered particles reach the substrate 2560. Within the above range, the vertical distance between the target 2500 and the substrate 2560 can be, in some cases, large enough to make the incident direction of the sputtered particle approximately vertical to the substrate 2560, so that damage to the substrate 2560 caused by collision of the sputtered particles can be reduced.

FIG. 35A illustrates an example of a deposition chamber including a sputtering apparatus different from that in FIG. 34A.

The deposition chamber 2501 in FIG. 35A includes a target holder 2520*a*, a target holder 2520*b*, a backing plate 2510*a*, a backing plate 2510*b*, a target 2500*a*, a target 2500*b*, a magnet unit 2530*a*, a magnet unit 2530*b*, a member 2542, and the substrate holder 2570. Note that the target 2500*a* is placed over the backing plate 2510*a*. The backing plate 2510*a* is placed over the target holder 2520*a*. The magnet unit 2530*a* is placed under the target 2500*a* with the backing plate 2510a positioned therebetween. The target 2500b is placed over the backing plate 2510b. The backing plate 2510b is placed over the target holder 2520b. The magnet unit 2530b is placed under the target 2500b with the backing plate 2510b positioned therebetween.

The magnet unit 2530a includes a magnet 2530N1, a magnet 2530N2, the magnet 2530S, and the magnet holder 2532. Note that in the magnet unit 2530a, the magnet 2530N1, the magnet 2530N2, and the magnet 2530S are placed over the magnet holder 2532. The magnet 2530N1, the magnet 2530N2, and the magnet 2530S are spaced. Note that the magnet unit 2530b has a structure similar to that of the magnet unit 2530a. When the substrate 2560 is transferred into the deposition chamber 2501, the substrate 2560 is placed in contact with the substrate holder 2570.

The target 2500a, the backing plate 2510a, and the target holder 2520a are separated from the target 2500b, the backing plate 2510b, and the target holder 2520b by the member 2542. Note that the member 2542 is preferably an insulator. However, the member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2500a with the backing plate 2510a positioned therebetween. The target holder 2520b and the backing plate 2510b are fixed to each other with a screw (e.g., a bolt) and have the same potential. The target holder 2520b has a function of supporting the target 2500b with the backing plate 2510b positioned therebetween.

The backing plate 2510a has a function of fixing the target 2500a. The backing plate 2510b has a function of fixing the target 2500b.

FIG. 35A illustrates the magnetic line of force 2580a and the magnetic line of force 2580b formed by the magnet unit 2530a.

The magnetic line of force 2580a is one of magnetic lines of force that form a horizontal magnetic field in the vicinity of the target 2500a. The vicinity of the target 2500a corresponds to a region in which the vertical distance from the target 2500a is, for example, greater than or equal to 0 mm and less than or equal to 10 mm, in particular, greater than or equal to 0 mm and less than or equal to 5 mm.

The magnetic line of force 2580b is one of magnetic lines of force that form a horizontal magnetic field in a plane apart from the top surface of the magnet unit 2530a by a vertical distance d. The vertical distance d is, for example, greater than or equal to 0 mm and less than or equal to 20 mm or greater than or equal to 5 mm and less than or equal to 15 mm.

Here, with the use of the strong magnet 2530N1, the strong magnet 2530N2, and the strong magnet 2530S, an intense magnetic field can be generated in the vicinity of the substrate 2560. Specifically, the intensity of the horizontal magnetic field in the vicinity of the substrate 2560 can be greater than or equal to 10 G and less than or equal to 100 G, preferably greater than or equal to 15 G and less than or equal to 60 G, further preferably greater than or equal to 20 G and less than or equal to 40 G.

By setting the intensity of the magnetic field in the deposition chamber 2501 to be in the above range, an oxide with high density and high crystallinity can be deposited. The deposited oxide hardly includes a plurality of kinds of crystalline phases and has a substantially single crystalline phase.

Note that the magnet unit 2530b forms magnetic lines of force similar to those formed by the magnet unit 2530a.

FIG. 35B is a top view of the magnet units 2530a and 2530b. The magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown in FIG. 35B. For example, the magnet unit 2530a may be oscillated with a beat of greater than or equal to 0.1 Hz and less than or equal to 1 kHz.

Thus, a region where a magnetic field on the target 2500a is intense changes as the magnet unit 2530a is rotated. The region with an intense magnetic field is a high-density plasma region; thus, sputtering of the target 2500a easily occurs in the vicinity of the region. For example, when the region with an intense magnetic field is fixed, only a specific region of the target 2500a is used. Meanwhile, as illustrated in FIG. 35B, in the magnet unit 2530a, the magnets 2530N1 and 2530N2 and the magnet 2530S are placed such that their surfaces on the target 2500a side have opposite polarities. Here, the case where the pole of each of the magnets 2530N1 and 2530N2 on the target 2500a side is the north pole and the pole of the magnet 2530S on the target 2500a side is the south pole is described. Note that the layout of the magnets and the poles in the magnet unit 2530a is not limited to that described here or that illustrated in FIGS. 35A and 35B. The same applies to the magnet unit 2503b.

By oscillating the magnet unit 2530a, the state of the magnetic lines of force in the vicinity of the substrate 2560 can also be changed. The same applies to the magnet unit 2530b.

Although the magnet unit 2530a and the magnet unit 2530b are oscillated in this example, one embodiment of the present invention is not limited to this example. For example, the magnet unit 2530a and the magnet unit 2530b may be rotated. For example, the magnet unit 2530a and the magnet unit 2530b may be rotated with a beat of greater than or equal to 0.1 Hz and less than or equal to 1 kHz. Alternatively, the target 2500 may be rotated or moved. For example, the target 2500 may be rotated or moved with a beat of greater than or equal to 0.1 Hz and less than or equal to 1 kHz. Further alternatively, the state of magnetic lines of force on the top surface of the substrate 2560 can be changed relatively by rotating the substrate 2560. These methods may be combined.

The deposition chamber 2501 may have a water channel inside or under the backing plate 2510a and the backing plate 2510b. By making a fluid (air, nitrogen, a rare gas, water, oil, or the like) flow through the water channel, discharge anomaly due to an increase in the temperature of the target 2500a and the target 2500b or damage to the deposition chamber 2501 due to deformation of a component can be prevented in the sputtering. In that case, the backing plate 2510a and the target 2500a are preferably adhered to each other with a bonding member because the cooling capability is increased. Furthermore, the backing plate 2510b and the target 2500b are preferably adhered to each other with a bonding member because the cooling capability is increased.

A gasket is preferably provided between the target holder 2520a and the backing plate 2510a, in which case an impurity is less likely to enter the deposition chamber 2501 from the outside, the water channel, or the like. A gasket is preferably provided between the target holder 2520b and the backing plate 2510b, in which case an impurity is less likely to enter the deposition chamber 2501 from the outside, the water channel, or the like.

In the magnet unit 2530a, the magnets 2530N1 and 2530N2 and the magnet 2530S are placed such that their surfaces on the target 2500a side have opposite polarities. Here, the case where the pole of each of the magnets 2530N1 and 2530N2 on the target 2500a side is the north pole and the pole of the magnet 2530S on the target 2500a side is the south pole is described. Note that the layout of the magnets and the poles in the magnet unit 2530a is not limited to that described here or that illustrated in FIG. 35A. The same applies to the magnet unit 2530b.

In the deposition, a potential applied to the terminal V1 connected to the target holder 2520a and a potential applied to the terminal V4 connected to the target holder 2520b may be alternately switched between a high level and a low level. A potential applied to the terminal V2 connected to the substrate holder 2570 is, for example, the ground potential. A potential applied to the terminal V3 connected to the magnet holder 2532 is, for example, the ground potential. Note that the potentials applied to the terminals V1, V2, V3, and V4 are not limited to the above description. Not all the target holder 2520a, the target holder 2520b, the substrate holder 2570, and the magnet holder 2532 are necessarily supplied with potentials. For example, the substrate holder 2570 may be electrically floating. Note that the potential applied to the terminal V1 connected to the target holder 2520a and the potential applied to the terminal V4 connected to the target holder 2520b are alternately switched between the high level and the low level (i.e., an AC sputtering method) in the example illustrated in FIG. 35A; however, one embodiment of the present invention is not limited thereto.

FIG. 35A illustrates an example where the backing plate 2510a and the target holder 2520a are not electrically connected to the magnet unit 2530a and the magnet holder 2532, but electrical connection is not limited thereto. For example, the backing plate 2510a and the target holder 2520a may be electrically connected to the magnet unit 2530a and the magnet holder 2532, and the backing plate 2510a, the target holder 2520a, the magnet unit 2530a, and the magnet holder 2532 may have the same potential. The backing plate 2510b and the target holder 2520b are not electrically connected to the magnet unit 2530b and the magnet holder 2532 in the example, but electrical connection is not limited thereto. For example, the backing plate 2510a and the target holder 2520b may be electrically connected to the magnet unit 2530b and the magnet holder 2532, and the backing plate 2510a, the target holder 2520b, the magnet unit 2530b, and the magnet holder 2532 may have the same potential.

To increase the crystallinity of the deposited oxide, the temperature of the substrate 2560 may be set high. By setting the temperature of the substrate 2560 high, migration of sputtered particles in the vicinity of the substrate 2560 can be promoted. Thus, an oxide with higher density and higher crystallinity can be deposited. Note that the temperature of the substrate 2560 is, for example, higher than or equal to room temperature and lower than 440° C., preferably higher than or equal to room temperature and lower than or equal to 400° C., further preferably higher than or equal to 150° C. and lower than or equal to 300° C., still further preferably higher than or equal to 100° C. and lower than or equal to 200° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas.

For example, the proportion of oxygen in the whole deposition gas is less than 50 vol %, preferably less than or equal to 33 vol %, further preferably less than or equal to 20 vol %, still further preferably less than or equal to 15 vol %.

The vertical distance between the target 2500a and the substrate 2560 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2500a and the substrate 2560 can be, in some cases, small enough to suppress a decrease in the energy of the sputtered particles until the sputtered particles reach the substrate 2560. Within the above range, the vertical distance between the target 2500a and the substrate 2560 can be, in some cases, large enough to make the incident direction of the sputtered particle approximately vertical to the substrate 2560, so that damage to the substrate 2560 caused by collision of the sputtered particles can be reduced.

The vertical distance between the target 2500b and the substrate 2560 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 2500b and the substrate 2560 can be, in some cases, small enough to suppress a decrease in the energy of the sputtered particles until the sputtered particles reach the substrate 2560. Within the above range, the vertical distance between the target 2500b and the substrate 2560 can be, in some cases, large enough to make the incident direction of the sputtered particle approximately vertical to the substrate 2560, so that damage to the substrate 2560 caused by collision of the sputtered particles can be reduced.

[Facing-Targets Sputtering Apparatus (VDSP)]

Next, the facing-targets sputtering apparatus is described. FIG. 36A is a cross-sectional view of a deposition chamber including a facing-targets sputtering apparatus. The deposition chamber illustrated in FIG. 36A includes the target 2500a, the target 2500b, the backing plate 2510a for holding the target 2500a, the backing plate 2510b for holding the target 2500b, the magnet unit 2530a placed behind the target 2500a with the backing plate 2510a positioned therebetween, and the magnet unit 2530b placed behind the target 2500b with the backing plate 2510b positioned therebetween. The substrate holder 2570 is placed between the target 2500a and the target 2500b. The substrate 2560 is transferred into the deposition chamber, and then the substrate 2560 is fixed to the substrate holder 2570.

As illustrated in FIG. 36A, a power source 2590 and a power source 2591 for applying potentials are connected to the backing plates 2510a and 2510b. It is preferable to use AC power sources, which alternately apply a high-level potential and a low-level potential to the backing plate 2510a and the backing plate 2510b. When one of the high-level potential and the low-level potential is applied to the backing plate 2510a, the other of the high-level potential and the low-level potential is applied to the backing plate 2510b. Although AC power sources are used as the power sources 2590 and 2591 illustrated in FIG. 36A, one embodiment of the present invention is not limited thereto. For example, RF power sources, DC power sources, or the like can be used as the power sources 2590 and 2591. Alternatively, different kinds of power sources may be used as the power sources 2590 and 2591.

The substrate holder 2570 is preferably connected to GND. The substrate holder 2570 may be in a floating state.

FIGS. 36B and 36C each show potential distribution of plasma 2540 along dashed-dotted line A-B in FIG. 36A. FIG. 36B shows the potential distribution in the case where a high potential is applied to the backing plate 2510a and a low potential is applied to the backing plate 2510b. In that case, a cation is accelerated toward the target 2500a. FIG. 36C shows the potential distribution in the case where a low potential is applied to the backing plate 2510a and a high potential is applied to the backing plate 2510b. In that case, a cation is accelerated toward the target 2500b. The deposition can be performed by alternating the state in FIG. 36B and the state in FIG. 36C.

The deposition is preferably performed while the plasma 2540 completely reaches the surface of the substrate 2560. For example, the substrate holder 2570 and the substrate 2560 are preferably placed in the plasma 2540 as illustrated in FIG. 36A. It is particularly preferable that the substrate holder 2570 and the substrate 2560 be placed in a positive column of the plasma 2540. The positive column of the plasma 2540 is, in each of FIGS. 36B and 36C, a region where the gradient of the potential distribution is small. When the substrate 2560 is placed in the positive column of the plasma 2540 as illustrated in FIG. 36A, the substrate 2560 is not exposed to a high electric field portion in the plasma 2540; thus, damage to the substrate 2560 due to the plasma 2540 can be reduced and defects can be reduced.

It is preferable to place the substrate holder 2570 and the substrate 2560 in the plasma 2540 during deposition as illustrated in FIG. 36A also because utilization efficiencies of the targets 2500a and 2500b are increased.

As illustrated in FIG. 36A, the horizontal distance between the substrate holder 2570 and the target 2500a is referred to as L1 and the horizontal distance between the substrate holder 2570 and the target 2500b is referred to as L2. It is preferable that the distance L1 and the distance L2 each be substantially equal to the length of the substrate 2560 in the horizontal direction in FIG. 36A. In addition, it is preferable that the distances L and L2 be adjusted as appropriate so that the substrate 2560 is placed in the positive column of the plasma 2540 as described above. The distances L1 and L2 can each be, for example, greater than or equal to 10 mm and less than or equal to 200 mm.

In FIG. 36A, the target 2500a and the target 2500b are parallel to each other. Moreover, the magnet unit 2530a and the magnet unit 2530b are placed so that opposite poles face each other. Magnetic lines of force run from the magnet unit 2530b to the magnet unit 2530a. Therefore, in the deposition, the plasma 2540 is confined in the magnetic field formed by the magnet units 2530a and 2530b. The substrate holder 2570 and the substrate 2560 are placed in a region where the target 2500a and the target 2500b face each other (also referred to as a region between targets). Note that although the substrate holder 2570 and the substrate 2560 are placed parallel to the direction in which the target 2500a and the target 2500b face each other in FIG. 36A, the substrate holder 2570 and the substrate 2560 may be inclined to the direction. By inclination of the substrate holder 2570 and the substrate 2560 at 30° or more and 60° or less (typified by 45°), for example, the proportion of sputtered particles that perpendicularly reach the substrate 2560 during deposition can be increased.

A structure illustrated in FIG. 37 is different from that illustrated in FIG. 36A in that the target 2500a and the target 2500b that face each other are not parallel but inclined to each other (in V-shape). Thus, the description for FIG. 36A is referred to for the description except for the arrangement of the targets. The magnet unit 2530a and the magnet unit 2530b are placed so that opposite poles face each other. The substrate holder 2570 and the substrate 2560 are placed in the region between targets. With the targets 2500a and 2500b placed as illustrated in FIG. 37, the proportion of sputtered particles that reach the substrate 2560 can be increased; accordingly, the deposition rate can be increased.

Although FIG. 36A illustrates a state in which the substrate holder 2570 and the substrate 2560 are placed in the plasma 2540, one embodiment of the present invention is not limited to this state. The substrate holder 2570 and the substrate 2560 may be placed outside the plasma 2540 as illustrated in FIG. 38, for example. In that case, the substrate 2560 is not exposed to a high electric field region of the plasma 2540, leading to a reduction in damage due to the plasma 2540. Note that the utilization efficiencies of the targets 2500a and 2500b are decreased as the distance between the plasma 2540 and the substrate 2560 is increased. It is preferable that the position of the substrate holder 2570 be adjustable as illustrated in FIG. 38.

The substrate holder 2570 may be placed either above or below the region between targets. Alternatively, the substrate holders 2570 may be placed above and below the region. Providing the substrate holders 2570 above and below the region allows deposition on two or more substrates at once, leading to an increase in productivity. Note that the position above or below the region where the target 2500a and the target 2500b face each other can also be referred to as the side of the region where the target 2500a and the target 2500b face each other.

The facing-targets sputtering apparatus can stably generate plasma even in a high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in a high vacuum or deposition with less plasma damage and thus can provide a film with high crystallinity even when the temperature of the substrate 2560 is low (e.g., higher than or equal to 10° C. and lower than 100° C.).

FIG. 39A illustrates another example of a facing-targets sputtering apparatus.

FIG. 39A is a schematic cross-sectional view of a deposition chamber of a facing-targets sputtering apparatus. Unlike in the deposition chamber illustrated in FIG. 34A, a target shield 2522 and a target shield 2523 are provided. The power source 2591 connected to the backing plates 2510a and 2510b is also provided.

The target shields 2522 and 2523 are connected to GND as illustrated in FIG. 39A. This means that the plasma 2540 is generated by a potential difference between the backing plates 2510a and 2510b to which a potential of the power source 2591 is applied and the target shields 2522 and 2523 to which GND is applied.

The deposition is preferably performed while the plasma 2540 completely reaches the surface of the substrate 2560. For example, the substrate holder 2570 and the substrate 2560 are preferably placed in the plasma 2540 as illustrated in FIG. 39A. It is particularly preferable that the substrate holder 2570 and the substrate 2560 be placed in a positive column of the plasma 2540. The positive column of the plasma is a region where the gradient of the potential distribution is small. When the substrate 2560 is placed in the positive column of the plasma 2540 as illustrated in FIG. 39A, the substrate 2560 is not exposed to a high electric field portion in the plasma 2540; thus, damage to the substrate 2560 due to the plasma 2540 can be reduced and an oxide with a favorable film quality can be obtained.

It is preferable to place the substrate holder 2570 and the substrate 2560 in the plasma 2540 during deposition as illustrated in FIG. 39A also because utilization efficiencies of the targets 2500a and 2500b are increased.

As illustrated in FIG. 39A, the horizontal distance between the substrate holder 2570 and the target 2500a is referred to as L1 and the horizontal distance between the substrate holder 2570 and the target 2500b is referred to as L2. It is preferable that the distance L1 and the distance L2 each be substantially equal to the length of the substrate 2560 in the horizontal direction in FIG. 39A. In addition, it is preferable that the distances L1 and L2 be adjusted as appropriate so that the substrate 2560 is placed in the positive column of the plasma 2540 as described above.

Although FIG. 39A illustrates a state in which the substrate holder 2570 and the substrate 2560 are placed in the plasma 2540, one embodiment of the present invention is not limited to this state. The substrate holder 2570 and the substrate 2560 may be placed outside the plasma 2540 as illustrated in FIG. 39B, for example. In that case, the substrate 2560 is not exposed to a high electric field region of the plasma 2540, leading to a reduction in damage due to the plasma 2540. Note that the utilization efficiencies of the targets 2500a and 2500b are decreased as the distance between the plasma 2540 and the substrate 2560 is increased. It is preferable that the position of the substrate holder 2570 be adjustable as illustrated in FIG. 39B.

The substrate holder 2570 may be placed above a region where the target 2500a and the target 2500b face each other as illustrated in FIG. 39B, or may be placed below the region. Alternatively, the substrate holders 2570 may be placed above and below the region. Providing the substrate holders 2570 above and below the region allows deposition on two or more substrates at once, leading to an increase in productivity.

In the above-described facing-targets sputtering apparatuses, plasma is confined by magnetic fields between targets; thus, plasma damage to a substrate can be reduced. Furthermore, a deposited film can have improved step coverage because an incident angle of a sputtered particle to a substrate can be made smaller by the inclination of the target. Moreover, deposition in a high vacuum enables the concentration of impurities contained in the film to be reduced.

Note that a parallel-plate-type sputtering apparatus or an ion beam sputtering apparatus may be provided in the deposition chamber.

<Deposition Apparatus>

A deposition apparatus with a deposition chamber including a sputtering apparatus with which the oxide of one embodiment of the present invention can be deposited is described below.

First, a structure of a deposition apparatus that hardly allows the entry of impurities into a film during deposition or the like will be described with reference to FIG. 40 and FIGS. 41A to 41C.

FIG. 40 is a schematic top view of a single wafer multi-chamber deposition apparatus 2700. The single wafer multi-chamber deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of which a target is placed for deposition. Note that for the deposition chambers 2706a, 2706b, and 2706c, the structure of a deposition chamber which will be described later can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate transfer chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, or the like can be freely determined. Note that the number of transfer chambers, the number of deposition chambers, the number of load lock chambers, the number of unload lock chambers, and the number of substrate heating chambers are not limited to the above, and the numbers thereof can be set as appropriate depending on the space for installation or the process conditions.

Next, FIG. 41A, FIG. 41B, and FIG. 41C are a cross-sectional view taken along dashed-dotted line V1-V2, a cross-sectional view taken along dashed-dotted line W1-W2, and a cross-sectional view taken along dashed-dotted line W2-W3, respectively, in the deposition apparatus 2700 illustrated in FIG. 40.

FIG. 41A illustrates a cross section of the substrate heating chamber 2705 and the transfer chamber 2704, and the substrate heating chamber 2705 includes a plurality of heating stages 2765 which can hold a substrate. Note that the substrate heating chamber 2705 is connected to a vacuum pump 2770 through a valve. As the vacuum pump 2770, a dry pump and a mechanical booster pump can be used, for example.

As a heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are illustrated for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 from the atmospheric pressure to low or medium vacuum (approximately 0.1 Pa) and then the valves are switched and exhaust is performed using the cryopump 2771 from the medium vacuum to high or ultra-high vacuum (0.1 Pa to $1 \times 10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 41B illustrates a cross section of the deposition chamber 2706b, the transfer chamber 2704, and the load lock chamber 2703a.

Here, the details of the deposition chamber including the sputtering apparatus are described with reference to FIG. 41B. The deposition chamber 2706b illustrated in FIG. 41B includes a target 2766a, a target 2766b, a target shield 2767a, a target shield 2767b, a magnet unit 2790a, a magnet unit 2790b, a substrate holder 2768, and a power source 2791. Although not illustrated, the targets 2766a and 2766b are each fixed to a target holder with a backing plate positioned therebetween. The power source 2791 is electrically connected to each of the target 2766a and the target 2766b. The magnet units 2790a and 2790b are placed behind the targets 2766a and 2766b, respectively. The target shield 2767a is provided so as to surround an end portion of the target 2766a and the target shield 2767b is provided so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the targets 2766a and 2766b (a region between targets). Providing the substrate holder 2768 supporting the substrate 2769 in the region between targets can reduce damage due to plasma in some cases, for example. Although not illustrated, the substrate holder 2768 may include a substrate holding mechanism that holds the substrate 2769, a heater that heats the substrate 2769 from the back side, or the like.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas which is introduced to the deposition chamber 2706b can be heated to a temperature higher than or equal to 40° C. and lower than or equal to 400° C., preferably higher than or equal to 50° C. and lower than or equal to 200° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are illustrated for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity; on the other hand, it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, further preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, further preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, further preferably less than or equal to $3 \times 10^{-6}$ Pa. Furthermore, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, further preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b which are described above preferably have a small amount of external leakage or internal leakage.

For example, in each of the transfer chamber 2704, the substrate heating chamber 2705, and the deposition chamber 2706b which are described above, the leakage rate is less than or equal to $3 \times 10^{-6}$ Pa·m³/s, preferably less than or equal to $1 \times 10^{-6}$ Pa·m³/s. The leakage rate of a gas molecule (atom) having a mass-to-charge ratio (m/z) of 18 is less than or equal to $1 \times 10^{-7}$ Pa·m³/s, preferably less than or equal to $3 \times 10^{-8}$ Pa·m³/s. The leakage rate of a gas molecule (atom) having a mass-to-charge ratio (m/z) of 28 is less than or equal to $1 \times 10^{-5}$ Pa·m³/s, preferably less than or equal to $1 \times 10^{-6}$ Pa·m³/s. The leakage rate of a gas molecule (atom) having a mass-to-charge ratio (m/z) of 44 is less than or equal to $3 \times 10^{-6}$ Pa·m³/s, preferably less than or equal to $1 \times 10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen, which is the main component of the oxide, is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. As the dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703a illustrated in FIG. 41B and the atmosphere-side substrate transfer chamber 2702 and the atmosphere-side substrate supply chamber 2701 illustrated in FIG. 41C are described. Note that FIG. 41C illustrates a cross section of the atmosphere-side substrate transfer chamber 2702 and the atmosphere-side substrate supply chamber 2701.

For the transfer chamber 2704 illustrated in FIG. 41B, the description of the transfer chamber 2704 illustrated in FIG. 41A can be referred to.

The load lock chamber 2703a includes a substrate delivery stage 2752. When a pressure in the load lock chamber 2703a becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703a is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703a is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703b illustrated in FIG. 40 can have a structure similar to that of the load lock chamber 2703a.

The atmosphere-side substrate transfer chamber 2702 includes the transfer robot 2763. The transfer robot 2763 can deliver a substrate from the cassette port 2761 to the load lock chamber 2703a or deliver a substrate from the load lock chamber 2703a to the cassette port 2761. Furthermore, a mechanism for suppressing entry of dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$.

Furthermore, an oxide semiconductor whose nitrogen concentration measured by SIMS is lower than $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$ can be deposited.

Moreover, an oxide semiconductor whose carbon concentration measured by SIMS is lower than $5 \times 10^{19}$ atoms/cm$^3$, preferably lower than or equal to $5 \times 10^{19}$ atoms/cm$^3$, further preferably lower than or equal to $1 \times 10^{18}$ atoms/cm$^3$, still further preferably lower than or equal to $5 \times 10^{17}$ atoms/cm$^3$ can be deposited.

An oxide having few impurities and oxygen vacancies is an oxide with low carrier density (specifically, lower than $8\times10^{11}/cm^3$, preferably lower than $1\times10^{11}/cm^3$, further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide having stable characteristics.

Furthermore, an oxide semiconductor can be deposited in which the released amount of each of the following gas molecules (atoms) measured by thermal desorption spectroscopy (TDS) is less than or equal to $1\times10^{19}/cm^3$, preferably less than or equal to $1\times10^{18}/cm^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide can be suppressed. Furthermore, when a film in contact with the oxide is formed with the use of the above deposition apparatus, the entry of impurities into the oxide from the film in contact therewith can be suppressed.

<Transistor Including Oxide Semiconductor>

Next, the case where the oxide semiconductor is used for a transistor is described.

FIG. 9 shows $I_d$-$V_g$ characteristics, which are the electrical characteristics of a transistor.

First, drain current-gate voltage characteristics ($I_d$-$V_g$ characteristics) of a transistor are described. FIG. 9 illustrates an example of $I_d$-$V_g$ characteristics of the transistor. In FIG. 9, the vertical axis and the horizontal axis represent $I_d$ and $V_g$, respectively.

$I_d$-$V_g$ characteristics are broadly divided into three regions. A first region, a second region, and a third region are referred to as an off region (OFF region), a subthreshold region, and an on region (ON region), respectively. A gate voltage at a boundary between the subthreshold region and the on region is referred to as a threshold voltage ($V_{th}$).

To obtain favorable characteristics of the transistor, it is preferable that the drain current in the off region (also referred to as off-state current or $I_{off}$) be low and the drain current in the on region (also referred to as on-state current or $I_{on}$) be high. As an index of the on-state current of the transistor, the field-effect mobility is often used. The details of the field-effect mobility are described later.

To drive the transistor at a low voltage, the slope of the $I_d$-$V_g$ characteristics in the subthreshold region is preferably steep. An index of the degree of change in the $I_d$-$V_g$ characteristics in the subthreshold region is referred to as subthreshold swing (SS) or an S value.

The S value is a minimum value of the amount of change in gate voltage which is needed for changing a drain current by an order of magnitude in the subthreshold region. As the S value is smaller, switching operation between on and off states can be performed rapidly.

Next, field-effect mobility is described. As an index of current drive capability of a transistor, the field-effect mobility is used. As described above, the on region of the transistor is divided into the linear region and the saturation region. From the characteristics in the regions, the field-effect mobility of the transistor can be calculated on the basis of the analytic formulae of the drain current based on GCA. The field-effect mobility in the linear region and the field-effect mobility in the saturation region are referred to as linear mobility and saturation mobility, respectively, when they need to be distinguished from each other.

The $I_d$-$V_g$ characteristics of the transistor in FIG. 9 are $I_d$-$V_g$ characteristics of the transistor including an oxide semiconductor film which has a composition of [In]:[Ga]:[Zn]=4:2:3 or a neighborhood thereof and is obtained using a target with [In]:[Ga]:[Zn]=4:2:4.1. Note that the proportion of oxygen to the whole deposition gas is referred to as "oxygen flow rate" in some cases. The oxygen flow rate percentage in deposition of the oxide semiconductor film of the transistor illustrated in FIG. 9 is 10%.

The transistor has high field-effect mobility as shown in FIG. 9.

Next, a density of shallow defect states (also referred to as sDOS) in an oxide semiconductor film is described. The sDOS of an oxide semiconductor film can be estimated from electrical characteristics of a transistor including the oxide semiconductor film. In the description below, the density of interface states of the transistor was measured. In addition, there is a method for estimating subthreshold leakage current in consideration of the density of interface states and the number of electrons trapped by the interface states, $N_{trap}$.

The number of electrons trapped by the interface state, $N_{trap}$, can be measured by comparing drain current-gate voltage ($I_d$-$V_g$) characteristics of the transistor that were actually measured and drain current-gate voltage ($I_d$-$V_g$) characteristics that were calculated. The sDOS in the oxide semiconductor film influences the mobility curve of the field-effect mobility. In particular, in the vicinity of the threshold voltage, the shape of the mobility curve is changed because electrons are trapped by the sDOS.

To measure sDOS in the oxide semiconductor film of the transistor having electrical characteristics in FIG. 9, transistors for measurement of sDOS were fabricated. The transistors were fabricated by the same manufacturing method. The size of each of the transistors is L/W=6/50 μm. Detailed description of a method for measuring sDOS will be made later. The results of sDOS of the transistor for measurement of sDOS show that the peak value of the shallow defect states is extremely low, less than $1.5\times10^{12}$ cm$^{-2}$ eV$^{-1}$.

The field-effect mobility of the transistor obtained by deposition using the same sputtering target in an oxygen atmosphere (oxygen gas: 100%) is smaller than that of the transistor in FIG. 9. The results of sDOS of the transistor for measurement of sDOS are over $2.5\times10^{12}$ cm$^{-2}$ eV$^{-1}$.

These results indicate that the oxide semiconductor film of the transistor in FIG. 9 includes the composite material in FIG. 1. In other words, when the oxygen flow rate is less than 20%, preferably less than or equal to 10% in deposition, a plurality of stacks each including a first region and a second region are formed, excess oxygen is diffused into the second region, and oxygen vacancies in the second region are reduced. The second region has a main function of making carriers flow, and the first region has a property of bending an energy band. As a result, high electrical characteristics (e.g., high field-effect mobility or a small S value) and small sDOS can be realized. A region where sDOS is small, that is, the density of shallow defect states is less than $1.0\times10^{-12}$ cm$^{-2}$ is provided. The sDOS is a density of shallow defect states of an oxide semiconductor and can be estimated from electrical characteristics of a transistor including the oxide semiconductor film. The sDOS in the oxide semiconductor film influences the mobility curve of the field-effect mobility. In particular, in the vicinity of the threshold voltage, the shape of the mobility curve is changed because electrons are trapped by the sDOS.

Furthermore, when the sputtering target is formed using the composite material in FIG. 1, the composite material film may be formed.

With a novel composite material (also referred to as a composite semiconductor material), high electrical characteristics (e.g., a high on-state current) are realized, and a highly reliable semiconductor device can be provided. The high on-state current value can achieve a further decrease in channel width (W). A highly integrated semiconductor device can be provided. A semiconductor device which can operate at high speed can be provided.

A semiconductor device with low power consumption can be provided. A semiconductor device with high productivity can be provided. A semiconductor device with high manufacturing yield can be provided. A novel semiconductor device can be provided. A module including the semiconductor device can be provided. An electronic device including the semiconductor device or the module can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIG. 2 is a schematic cross-sectional view of one embodiment of the present invention in the thickness direction.

FIG. 3 is a schematic cross-sectional view of one embodiment of the present invention in the thickness direction.

FIG. 14A is a cross-sectional view of a semiconductor device of one embodiment of the present invention and FIGS. 14B and 14C show electrical characteristics of the semiconductor device.

FIGS. 17A to 17C illustrate a semiconductor device of one embodiment of the present invention.

FIGS. 20A and 20B are each a circuit diagram of a memory device of one embodiment of the present invention.

BEST MODE FOR CARRYING OUT THE INVENTION

Embodiments of the present invention will be described below in detail with reference to the drawings. However, the present invention is not limited to the description below, and it is easily understood by those skilled in the art that modes and details disclosed herein can be modified in various ways. Furthermore, the present invention is not construed as being limited to the description of the embodiments given below.

(Embodiment 1)

Figure 1:
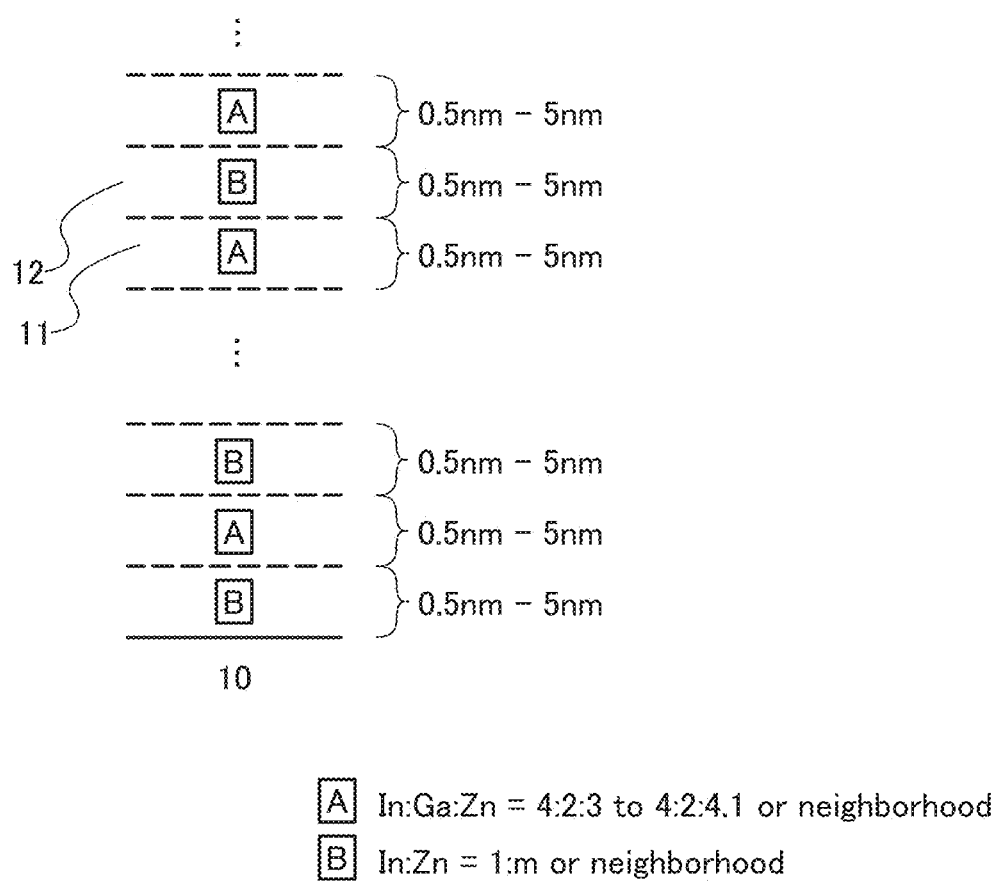
FIG. 1 is a schematic cross-sectional view of one embodiment of the present invention in the thickness direction.

FIG. 1 is a conceptual view of a composite material described in this embodiment. The terms of the atomic ratios of indium to gallium and zinc contained in the composite material are denoted by [In], [Ga], and [Zn].

The composite material has a structure in which a plurality of stacks each including a first region 11 and a second region 12 are provided over a base 10. Each of the first region 11 and the second region 12 has a thickness of greater than or equal to 0.5 nm and less than or equal to 5 nm. In FIG. 1, the interface between layers is denoted by a dotted line; however, the dotted line does not indicate a clear boundary and shows that carriers can flow through either layer but are more likely flow in the second region 12 than in the first region 11.

A substrate having an insulating surface (e.g., a glass substrate, a sapphire substrate, or a ceramic substrate), a single crystal semiconductor substrate or a polycrystalline semiconductor substrate made of silicon, silicon carbide, or the like, a compound semiconductor substrate made of silicon germanium or the like, an SOI substrate, or the like may be used as the base 10. Alternatively, any of these substrates provided with a semiconductor element may be used as the base 10.

A switching element, specifically a transistor including a well potential structure, can be manufactured by utilizing a structure like a superlattice illustrated in FIG. 1. The term "superlattice" means a structure in which thin films are stacked periodically or partly periodically. The structure is not limited to the structure to have a crystal lattice, and includes the case where a crystal lattice cannot be observed clearly. The first region 11 and the second region 12 in contact with the first region 11 are placed in the thickness direction. The first region 11 contains at least indium, gallium, and zinc, and the second region 12 contains indium and zinc. The second region 12 serves as a well portion of the well potential and has a smaller bandgap than the first region 11. Thus, a semiconductor element in which the second region 12 is sandwiched between the first regions 11 in the thickness direction can be formed.

The first region 11 preferably contains at least indium, an element M, and zinc. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. In this embodiment, an example of the first region 11 containing indium, gallium, and zinc is shown.

Figure 7:
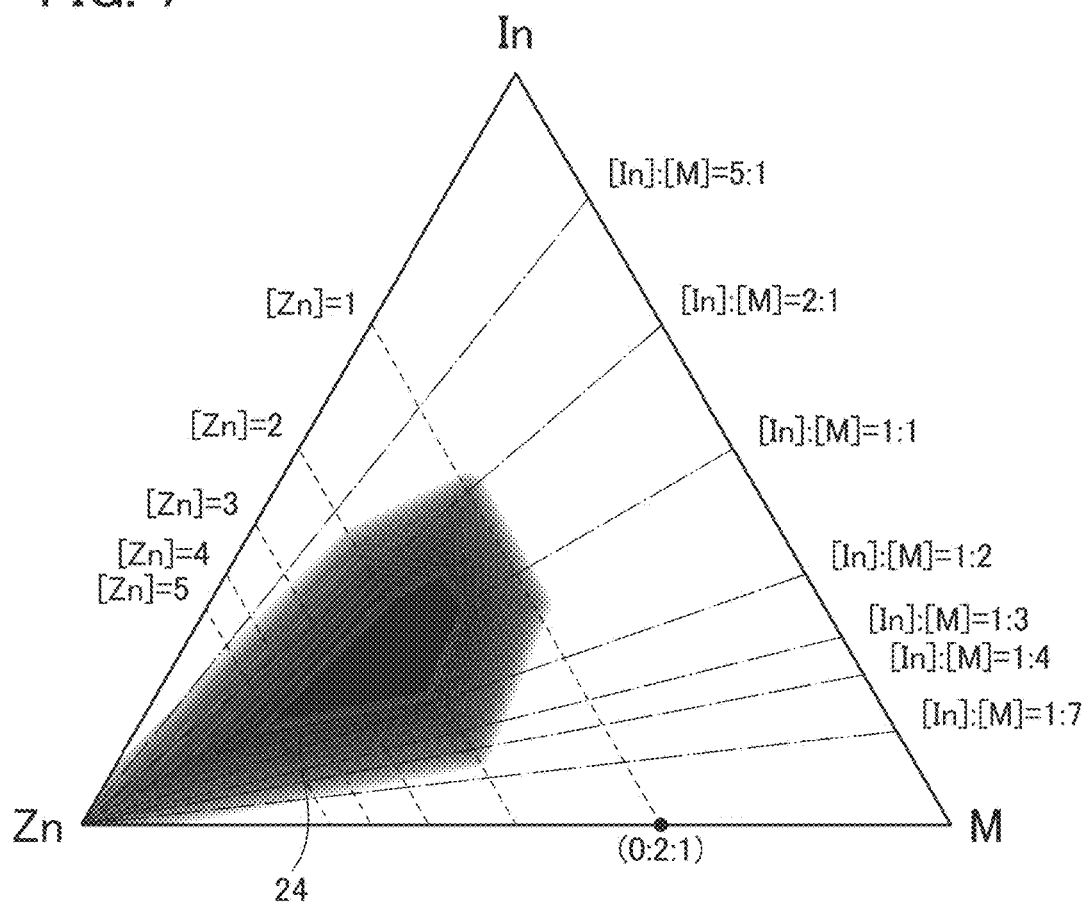
FIG. 7 shows an atomic ratio of a first region.

The first region 11 may be included within a range of a region 24 shown in FIG. 7. FIG. 7 is a phase diagram, and in the case where a substance contains an element X, an element Y, and an element Z, the atomic ratio of the elements is denoted by x:y:z where x, y, and z correspond to the number of atoms of the elements X, Y, and Z, and the atomic ratio can be shown as coordinates (x:y:z) in drawings. Note that the proportion of oxygen atoms is not shown in FIG. 7.

In this embodiment, an example is shown in which the first region 11 has an atomic ratio of [In]:[Ga]:[Zn]=4:2:3 or a neighborhood thereof. The first region 11 can have a c-axis aligned crystalline oxide semiconductor (CAAC-OS) structure, a polycrystalline oxide semiconductor structure, or a nanocrystalline oxide semiconductor (nc-OS) structure. The CAAC-OS includes a crystal part, and a portion in which a c-axis of the crystal part is aligned parallel to a normal vector of a surface where the film is formed. Among the non-single crystal structures, the CAAC-OS structure has the lowest density of defect states; thus, the CAAC-OS is suitable for the first region 11.

The second region 12 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

In this embodiment, an example is shown in which the second region 12 does not contain gallium and has a lower concentration of gallium than the first region 11.

Figure 6:
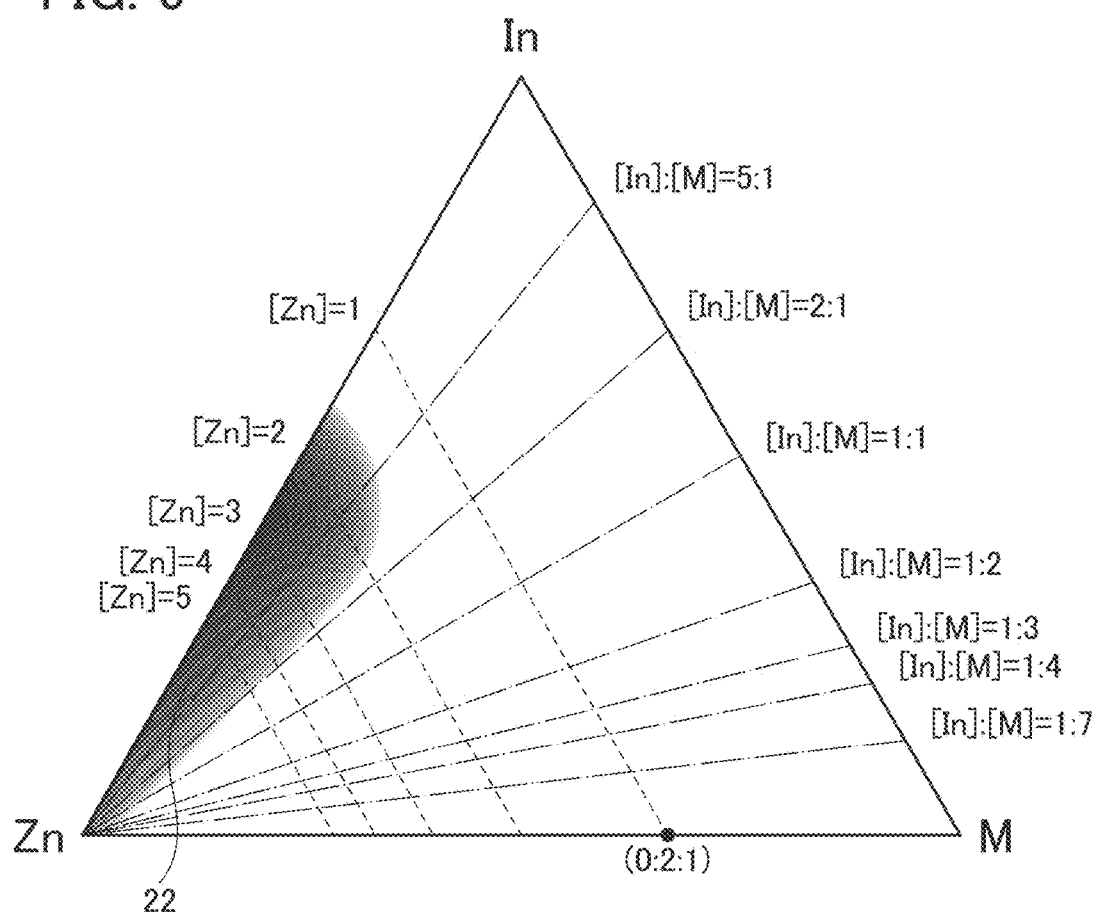
FIG. 6 shows an atomic ratio of a second region.

The second region 12 may be included within a range of a region 22 shown in FIG. 6. The second region 12 may have crystallinity and have a nanocrystalline oxide semiconductor (nc-OS) structure, for example. The second region 12 itself is unstable but becomes stable when the second region 12 is sandwiched between the first regions 11.

In this embodiment, an example is shown in which the first region 11 has an atomic ratio of [In]:[Zn]=1:m (m is a rational number).

The first region 11 and the second region 12 have different main functions: the first region 11 has a property of bending an energy band and the second region 12 has a function of making carriers flow.

FIG. 1 shows the structure in which the first region 11 and the second region 12 are alternately stacked; however, one embodiment of the present invention is not particularly limited thereto. Indium oxide may be included between the first region 11 and the second region 12. A composite material having a novel periodic structure may be formed by changing the number of layers included in each stack as appropriate.

An example of a method for manufacturing the composite material illustrated in FIG. 1 is described.

The temperature at which the composite material thin film is formed is preferably higher than or equal to room temperature and lower than 140° C. Note that room temperature includes not only the case where temperature control is not performed but also the case where temperature control is performed. Oxygen and argon are used as deposition gases for the composite material thin film, and the percentage of oxygen flow rate is higher than or equal to 5% and lower than or equal to 20%, preferably higher than or equal to 7% and lower than or equal to 15%.

Figure 5:
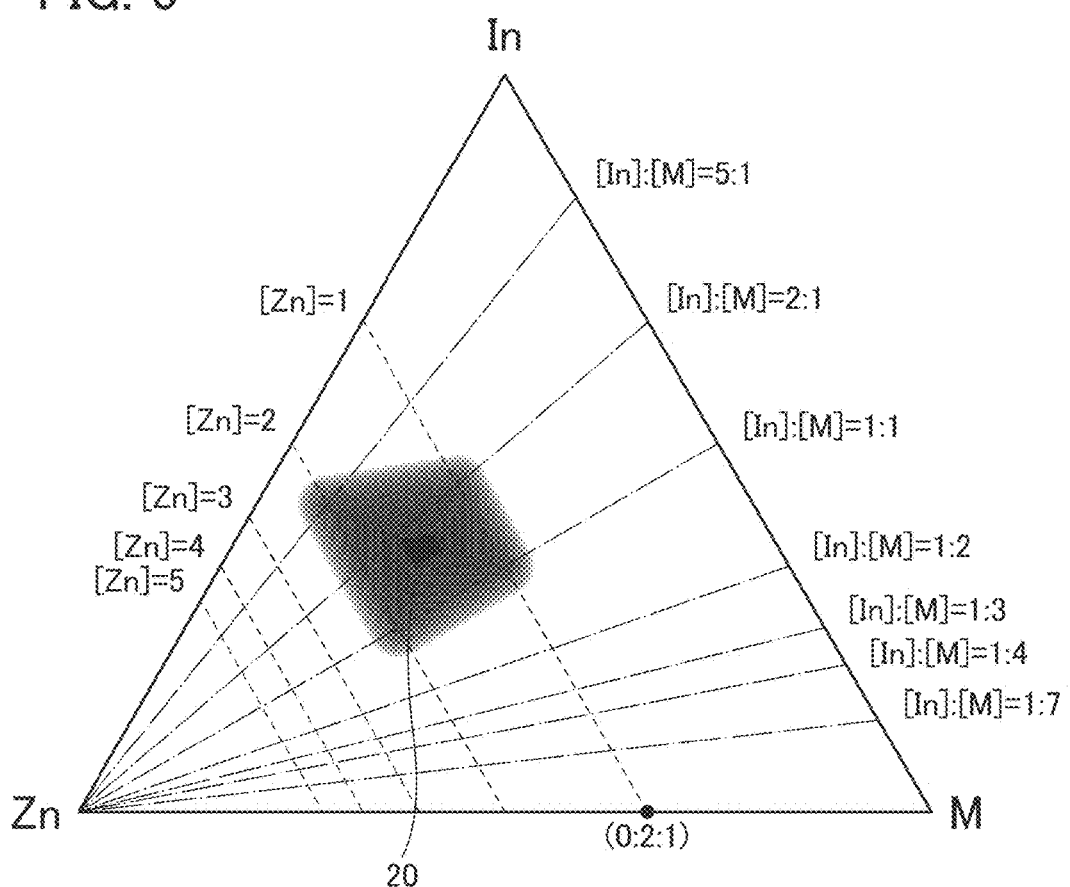
FIG. 5 shows an atomic ratio of a composite material.

As a sputtering target, an In—Ga—Zn metal oxide target having an atomic ratio shown in the region 20 in FIG. 5 (e.g., [In]:[Ga]:[Zn]=4:2:4.1) is used.

In the case where the composite material thin film is deposited by a sputtering method, as a sputtering gas, a rare gas (typically, argon), oxygen, or a mixed gas of a rare gas and oxygen is used as appropriate. In the case of using the mixed gas of a rare gas and oxygen, the proportion of oxygen to the rare gas is preferably increased. In addition, increasing the purity of the sputtering gas is necessary. For example, when a gas which is highly purified to have a dew point of −40° C. or lower, preferably −80° C. or lower, further preferably −100° C. or lower, still further preferably −120° C. or lower, is used as the sputtering gas, i.e., the oxygen gas or the argon gas, entry of moisture or the like into the composite material thin film can be minimized.

In the case where the composite material thin film is deposited by a sputtering method, the sputtering gas containing oxygen is preferably used. When the composite material thin film is deposited using the sputtering gas containing oxygen, oxygen can be added to a film under the composite material thin film (here, the insulating film 207) at the same time as the deposition of the composite material thin film. Therefore, an oxygen-excess region can be provided in the insulating film 207.

In the case where the composite material thin film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the composite material thin film, as much as possible. Alternatively, a turbo molecular pump and a cold trap are preferably combined so as to prevent a backflow of a gas, especially a gas containing carbon or hydrogen from an exhaust system to the inside of the chamber.

A structure in which the first region 11 and the second region 12 are alternately stacked can be obtained by one-time deposition using a sputtering method. By one-time deposition using a sputtering method, part of a composite material including the first region 11 and the second region 12 may be periodically stacked.

In this embodiment, an example where a sputtering target containing a polycrystalline oxide semiconductor (having an atomic ratio of [In]:[Ga]:[Zn]=4:2:4.1) is used is shown; however, one embodiment of the present invention is not limited thereto. The deposition may be performed using a sputtering target that is a composite material including the stacks illustrated in FIG. 1 and has a structure like a superlattice.

(Embodiment 2)

In this embodiment, an example which is partly different from Embodiment 1 is described with reference to FIG. 2.

This embodiment is the same as Embodiment 1 except that the composition of the first region 11 is different; thus, the detailed description of the same portions is omitted.

As illustrated in FIG. 2, the first region 11 has an atomic ratio of [In]:[Ga]:[Zn]=1:1:1 or a neighborhood thereof.

Also in FIG. 2, the composite material has a structure in which a plurality of stacks each including the first region 11 and the second region 12 are provided over the base 10. Each of the first region 11 and the second region 12 has a thickness of greater than or equal to 0.5 nm and less than or equal to 5 nm. A stacked structure in which at least two stacks are repeated may be used.

A switching element, specifically a transistor including a well potential structure, can be manufactured by utilizing a structure like a superlattice illustrated in FIG. 2. A three-layer structure in which the second region 12 which serves as a well portion is sandwiched between the first regions 11 in the vertical direction is used so that a well portion of a transistor is sandwiched between barrier portions. The first region 11 and the second region 12 in contact with the first region 11 are placed in the thickness direction. The first region 11 contains at least indium, gallium, and zinc, and the second region 12 contains indium and zinc. Current is more likely to flow in the second region 12 than in the first region 11. The second region 12 serves as a well portion of the well potential, and the second region 12 has a smaller bandgap than the first region 11. Thus, a semiconductor element in which the second region 12 is sandwiched between the first regions 11 in the thickness direction can be formed.

This embodiment can be freely combined with any of the other embodiments.

(Embodiment 3)

In this embodiment, an example which is partly different from Embodiment 1 is described with reference to FIG. 3.

This embodiment is the same as Embodiment 1 except that there is a portion in which one more layer is added to the structure in Embodiment 1; thus, the detailed description of the same portions is omitted.

In FIG. 3, the composite material has a structure in which a plurality of stacks each including the first region 11, the second region 12, and a third region 13 are provided over the base 10. Each of the first region 11, the second region 12, and the third region 13 has a thickness of greater than or equal to 0.5 nm and less than or equal to 5 nm. A stacked structure in which at least three stacks are repeated may be used.

The third region 13 may have a different composition from the first region 11, and may be included within the range of the region 24 shown in FIG. 7.

A switching element, specifically a transistor including a well potential structure, can be manufactured by utilizing a structure like a superlattice illustrated in FIG. 3. A structure in which a well portion of a transistor is sandwiched between two types of barrier portions is used. A three-layer structure in which the second region 12 serving as a first well portion is sandwiched between the first region 11 and the third region 13 is used. The first region 11, the second region 12 in contact with the first region 11, and the third region 13 in contact with the second region 12 are placed in the thickness direction. The first region 11 contains at least indium, gallium, and zinc. The second region 12 contains indium and zinc. Current is more likely to flow in the second region 12 than in the first region 11 and the third region 13. The second region 12 serves as a well portion of the well potential, and the second region 12 has a smaller bandgap than the first region 11 and the third region 13. Thus, a semiconductor element in which the second region 12 is sandwiched between the first region 11 and the third region 13 in the thickness direction can be formed.

This embodiment can be freely combined with any of the other embodiments.

(Embodiment 4)

Figure 4A:
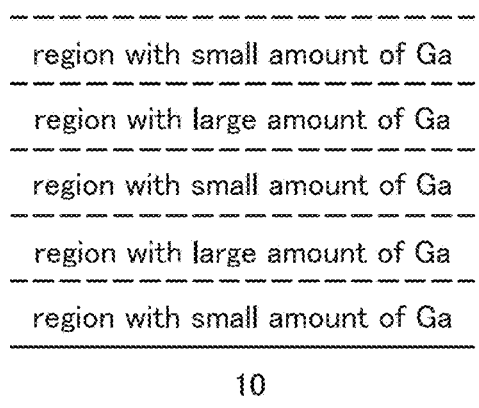
FIGS. 4A and 4B are schematic cross-sectional views of one embodiment of the present invention in the thickness direction.

In this embodiment, an example which is partly different from Embodiment 1 is described with reference to FIG. 4B. FIG. 4A is a schematic diagram showing a superordinate concept of FIG. 4B and shows a structure like a superlattice in which a region with a small amount of gallium and a region with a large amount of gallium are stacked. The interface between the region with a small amount of gallium and the region with a large amount of gallium is denoted by a dotted line, but the boundary is not clear and the regions are partially mixed in some cases.

This embodiment is the same as Embodiment 1 except that the composition of the second region 12 is different; thus, the detailed description of the same portions is omitted.

The second region 12 has an atomic ratio of [In]:[Ga]:[Zn]=X:Y:Z (0<Y<Z, 0<Y<X) or a neighborhood thereof and is formed using a material having a lower gallium concentration than that for the first region 11. Note that the second region 12 with a small amount of gallium has a relatively lower concentration of gallium than the first region 11 with a large amount of gallium. For example, the second region 12 may have an atomic ratio of [In]:[Ga]:[Zn]=6:1:6 or a neighborhood thereof.

Figure 4B:
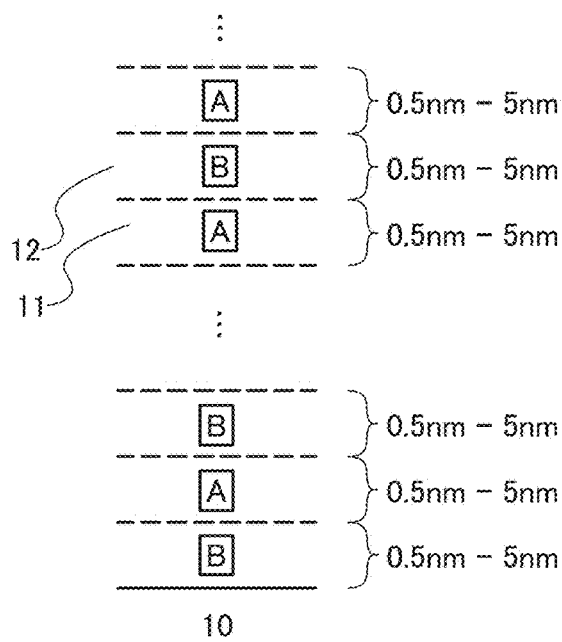

In FIG. 4B, the composite material has a structure in which a plurality of stacks each including the first region 11 and the second region 12 are provided over the base 10. Each of the first region 11 and the second region 12 has a thickness of greater than or equal to 0.5 nm and less than or equal to 5 nm. A stacked structure in which at least two stacks are repeated may be used.

Electric conduction is easily caused in the second region 12 with a small amount of gallium, whereas electric conduction is hardly caused in the first region 11 with a large amount of gallium. Therefore, the composite material illustrated in FIGS. 4A and 4B can be used as a material with favorable semiconductor characteristics for a transistor, and the transistor can have high field-effect mobility and high switching characteristics.

A switching element, specifically a transistor including a well potential structure, can be manufactured by utilizing such a structure like a superlattice illustrated in FIG. 4B. A three-layer structure in which the second region 12 which serves as a well portion is sandwiched between the first regions 11 in the vertical direction is used so that a well portion of a transistor is sandwiched between barrier portions. The first region 11 and the second region 12 in contact with the first region 11 are placed in the thickness direction. Each of the first region 11 and the second region 12 contains at least indium, gallium, and zinc. Current is more likely to flow in the second region 12 than in the first region 11. The second region 12 serves as a well portion of the well potential, and the second region 12 has a smaller bandgap than the first region 11. Thus, a semiconductor element in which the second region 12 is sandwiched between the first regions 11 in the thickness direction can be formed.

This embodiment can be freely combined with any of the other embodiments.

(Embodiment 5)

In this embodiment, an example where a transistor is manufactured as a semiconductor element including the composite material described in any one of Embodiments 1 to 4 in a channel formation region is described. A structure of the transistor is described with reference to FIGS. 8A to 8C, and evaluation results of electrical characteristics of the transistor are shown in FIG. 9.

[Structure Example of Transistor]

Figure 8A:
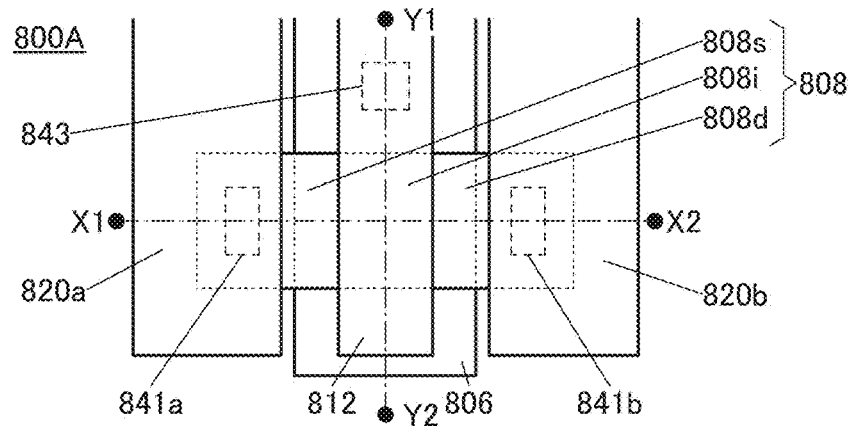
FIGS. 8A to 8C are a top view and cross-sectional views illustrating a transistor.
Figure 8B:
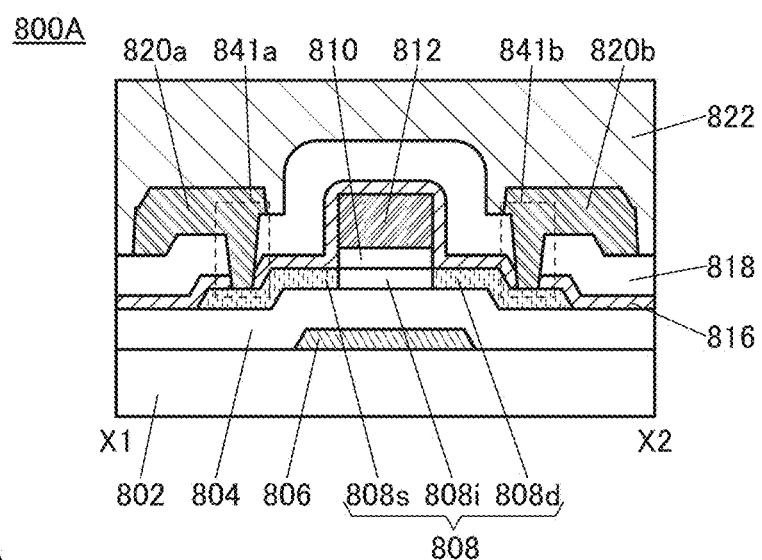
Figure 8C:
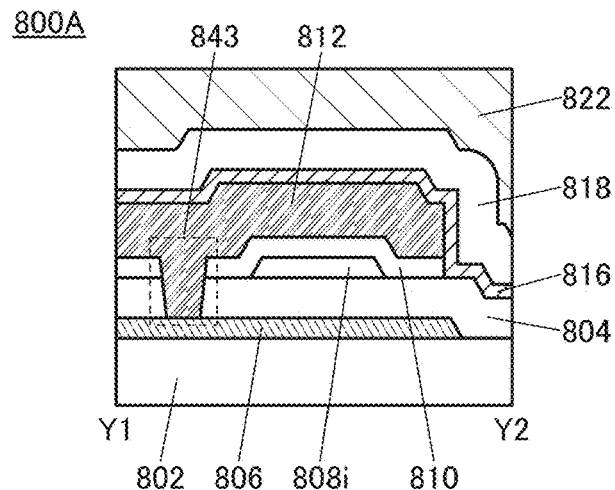
Figure 9:
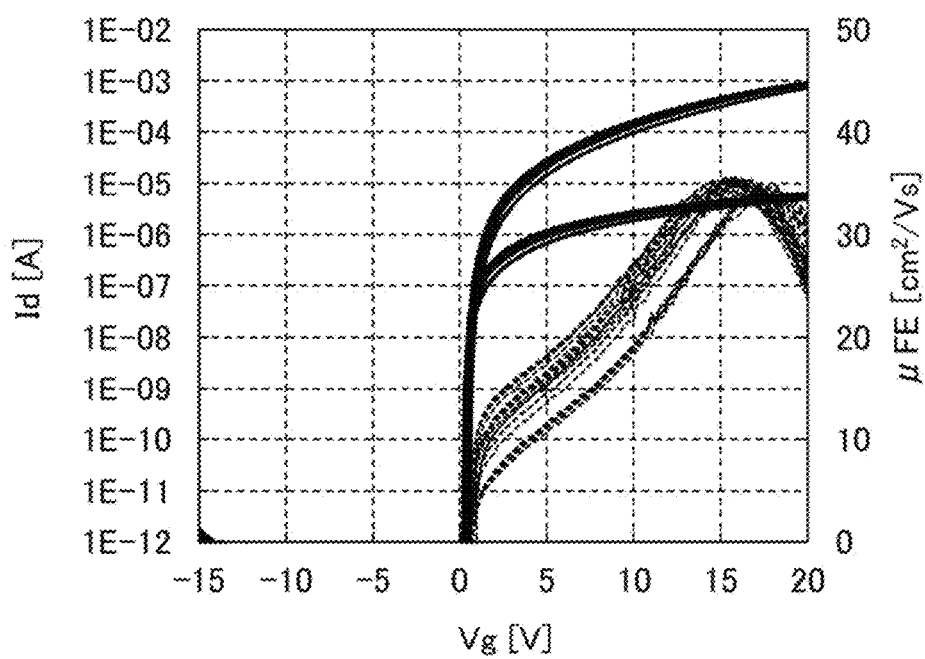
FIG. 9 is a graph showing $I_d$-$V_g$ characteristics of transistors.

FIG. 8A is a top view of a transistor 800A. FIG. 8B is a cross-sectional view taken along the dashed-dotted line X1-X2 in FIG. 8A. FIG. 8C is a cross-sectional view taken along the dashed-dotted line Y1-Y2 in FIG. 8A. For clarity, some components such as an insulating film 810 are not illustrated in FIG. 8A. As in FIG. 8A, some components are not illustrated in some cases in top views of transistors described below. In addition, the direction of the dashed-dotted line X1-X2 may be referred to as the channel length (L) direction, and the direction of the dashed-dotted line Y1-Y2 may be referred to as the channel width (W) direction.

The transistor 800A illustrated in FIGS. 8A to 8C includes a conductive film 806 over a substrate 802, an insulating film 804 over the conductive film 806, a semiconductor film 808 over the insulating film 804, the insulating film 810 over the semiconductor film 808, a conductive film 812 over the insulating film 810, and an insulating film 816 over the insulating film 804, the semiconductor film 808, and the conductive film 812. The semiconductor film 808 is a composite material film obtained using an oxide semiconductor target and includes a channel region 808$i$ overlapping with the conductive film 812, a source region 808$s$ in contact with the insulating film 816, and a drain region 808$d$ in contact with the insulating film 816.

The insulating film 816 contains nitrogen or hydrogen. The insulating film 816 is in contact with the source region 808$s$ and the drain region 808$d$, so that nitrogen or hydrogen that is contained in the insulating film 816 is added to the source region 808$s$ and the drain region 808$d$. The source region 808$s$ and the drain region 808$d$ each have a high carrier density when nitrogen or hydrogen is added thereto.

The transistor 800A may further include an insulating film 818 over the insulating film 816, a conductive film 820$a$ electrically connected to the source region 808$s$ through an opening 841$a$ provided in the insulating films 816 and 818, and a conductive film 820$b$ electrically connected to the drain region 808$d$ through an opening 841$b$ provided in the insulating films 816 and 818. In addition, an insulating film 822 may be provided over the insulating film 818, the conductive film 820$a$, and the conductive film 820$b$. Although the structure where the insulating film 822 is provided is shown in FIGS. 8B and 8C, one embodiment of the present invention is not limited thereto, and the insulating film 822 is not necessarily provided.

In this specification and the like, the insulating film 804 may be referred to as a first insulating film, the insulating film 810 may be referred to as a second insulating film, the insulating film 816 may be referred to as a third insulating film, the insulating film 818 may be referred to as a fourth insulating film, and the insulating film 822 may be referred to as a fifth insulating film. The insulating film 804 functions as a first gate insulating film and the insulating film 810 functions as a second gate insulating film. The insulating films 816 and 818 function as a protective insulating film and the insulating film 822 functions as a planarization film.

The insulating film 810 includes an excess oxygen region. Since the insulating film 810 includes the excess oxygen region, excess oxygen can be supplied to the channel region 808$i$ included in the semiconductor film 808. As a result, oxygen vacancies that might be formed in the channel region 808$i$ can be filled with excess oxygen, which can provide a highly reliable semiconductor device.

To supply excess oxygen to the semiconductor film 808, excess oxygen may be supplied to the insulating film 804 that is formed under the semiconductor film 808. In that case, excess oxygen contained in the insulating film 804 might also be supplied to the source region 808$s$ and the drain region 808$d$ included in the semiconductor film 808. When excess oxygen is supplied to the source region 808$s$ and the drain region 808$d$, the resistance of the source region 808$s$ and the drain region 808$d$ might be increased.

In contrast, in the structure in which the insulating film 810 formed over the semiconductor film 808 contains excess oxygen, excess oxygen can be selectively supplied only to the channel region 808$i$. Alternatively, the carrier density of the source and drain regions 808$s$ and 808$d$ can be selectively increased after excess oxygen is supplied to the channel region 808$i$ and the source and drain regions 808$s$ and 808$d$, in which case an increase in the resistance of the source and drain regions 808$s$ and 808$d$ can be prevented.

Furthermore, each of the source region 808$s$ and the drain region 808$d$ included in the semiconductor film 808 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. The element that forms an oxygen vacancy is diffused from the insulating film 816 to the source region 808$s$ and the drain region 808$d$ in the case where the insulating film 816 contains one or more such elements. In addition or alternatively, the element that forms an oxygen vacancy is added to the source region 808$s$ and the drain region 808$d$ by impurity addition treatment.

An impurity element added to the semiconductor film cuts a bond between a metal element and oxygen in the semiconductor film, so that an oxygen vacancy is formed. Alternatively, when an impurity element is added to the semiconductor film, oxygen bonded to a metal element in the semiconductor film is bonded to the impurity element and detached from the metal element, so that an oxygen vacancy is formed. As a result, the semiconductor film has a higher carrier density, and thus, the conductivity thereof becomes higher.

The conductive film 806 functions as a first gate electrode and the conductive film 812 functions as a second gate electrode. The conductive film 820$a$ functions as a source electrode and the conductive film 820$b$ functions as a drain electrode.

As illustrated in FIG. 8C, an opening 843 is provided in the insulating films 804 and 810. The conductive film 806 is electrically connected to the conductive film 812 through the opening 843. Thus, the same potential is applied to the conductive film 806 and the conductive film 812. Note that different potentials may be applied to the conductive film 806 and the conductive film 812 without providing the opening 843. Alternatively, the conductive film 806 may be used as a light-shielding film without providing the opening 843. For example, when the conductive film 806 is formed using a light-shielding material, light irradiation of the channel region 808i from the bottom can be reduced.

As illustrated in FIGS. 8B and 8C, the semiconductor film 808 faces the conductive film 806 functioning as a first gate electrode and the conductive film 812 functioning as a second gate electrode and is positioned between the two conductive films functioning as the gate electrodes.

Furthermore, the length of the conductive film 812 in the channel width direction is larger than the length of the semiconductor film 808 in the channel width direction. In the channel width direction, the whole semiconductor film 808 is covered with the conductive film 812 with the insulating film 810 placed therebetween. Since the conductive film 812 is connected to the conductive film 806 through the opening 843 provided in the insulating films 804 and 810, a side surface of the semiconductor film 808 in the channel width direction faces the conductive film 812 with the insulating film 810 placed therebetween.

In other words, in the channel width direction of the transistor 800A, the conductive films 806 and 812 are connected to each other through the opening 843 provided in the insulating films 804 and 810, and the conductive films 806 and 812 surround the oxide semiconductor film 808 with the insulating films 804 and 810 positioned therebetween.

Such a structure enables the semiconductor film 808 included in the transistor 800A to be electrically surrounded by electric fields of the conductive film 806 functioning as a first gate electrode and the conductive film 812 functioning as a second gate electrode. A device structure of a transistor, like that of the transistor 800A, in which electric fields of a first gate electrode and a second gate electrode electrically surround the semiconductor film 808 in which a channel region is formed can be referred to as a surrounded channel (S-channel) structure.

Since the transistor 800A has the S-channel structure, an electric field for inducing a channel can be effectively applied to the semiconductor film 808 by the conductive film 806 or the conductive film 812; thus, the current drive capability of the transistor 800A can be improved and high on-state current characteristics can be obtained. As a result of the high on-state current, it is possible to reduce the size of the transistor 800A. Furthermore, since the transistor 800A has a structure in which the semiconductor film 808 is surrounded by the conductive film 806 and the conductive film 812, the mechanical strength of the transistor 800A can be increased.

When seen in the channel width direction of the transistor 800A, an opening different from the opening 843 may be formed on the side of the semiconductor film 808 on which the opening 843 is not formed.

<Components of Transistor>

Next, details of the components of the transistor in FIGS. 8A to 8C will be described.

[Substrate]

The substrate 802 can be formed using a material having heat resistance high enough to withstand heat treatment in the manufacturing process.

Specifically, non-alkali glass, soda-lime glass, potash glass, crystal glass, quartz, sapphire, or the like can be used. Alternatively, an inorganic insulating film may be used. Examples of the inorganic insulating film include a silicon oxide film, a silicon nitride film, a silicon oxynitride film, and an aluminum oxide film.

The non-alkali glass may have a thickness of greater than or equal to 0.2 mm and less than or equal to 0.7 mm, for example. The non-alkali glass may be polished to obtain the above thickness.

As the non-alkali glass, a large-area glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, as the substrate 802, a single-crystal semiconductor substrate or a polycrystalline semiconductor substrate made of silicon or silicon carbide, a compound semiconductor substrate made of silicon germanium or the like, an SOI substrate, or the like may be used.

For the substrate 802, an inorganic material such as a metal may be used. Examples of the inorganic material such as a metal include stainless steel and aluminum.

Alternatively, for the substrate 802, an organic material such as a resin, a resin film, or plastic may be used. Examples of the resin film include polyester, polyolefin, polyamide (e.g., nylon or aramid), polyimide, polycarbonate, polyurethane, an acrylic resin, an epoxy resin, polyethylene terephthalate (PET), polyethylene naphthalate (PEN), polyether sulfone (PES), and a resin having a siloxane bond.

For the substrate 802, a composite material of an inorganic material and an organic material may be used. Examples of the composite material include a resin film to which a metal plate or a thin glass plate is bonded, a resin film into which a fibrous or particulate metal or a fibrous or particulate glass is dispersed, and an inorganic material into which a fibrous or particulate resin is dispersed.

The substrate 802 can at least support films or layers formed thereover or thereunder and may be one or more of an insulating film, a semiconductor film, and a conductive film.

[First Insulating Film]

The insulating film 804 can be formed by a sputtering method, a CVD method, an evaporation method, a pulsed laser deposition (PLD) method, a printing method, a coating method, or the like as appropriate. For example, the insulating film 804 can be formed to have a single-layer structure or stacked-layer structure of an oxide insulating film and/or a nitride insulating film. To improve the properties of the interface with the semiconductor film 808, at least a region of the insulating film 804 which is in contact with the semiconductor film 808 is preferably formed using an oxide insulating film. When the insulating film 804 is formed using an oxide insulating film from which oxygen is released by heating, oxygen contained in the insulating film 804 can be moved to the semiconductor film 808 by heat treatment.

The thickness of the insulating film 804 can be greater than or equal to 50 nm, greater than or equal to 100 nm and less than or equal to 3000 nm, or greater than or equal to 200 nm and less than or equal to 1000 nm. By increasing the thickness of the insulating film 804, the amount of oxygen released from the insulating film 804 can be increased, and interface states at the interface between the insulating film 804 and the semiconductor film 808 and oxygen vacancies included in the channel region 808*i* of the semiconductor film 808 can be reduced.

For example, the insulating film 804 can be formed to have a single-layer structure or stacked-layer structure of a silicon oxide film, a silicon oxynitride film, a silicon nitride oxide film, a silicon nitride film, an aluminum oxide film, a hafnium oxide film, a gallium oxide film, a Ga—Zn oxide film, or the like. In this embodiment, the insulating film 804 has a stacked-layer structure of a silicon nitride film and a silicon oxynitride film. With the insulating film 804 having such a layered structure including a silicon nitride film as a lower layer and a silicon oxynitride film as an upper layer, oxygen can be efficiently introduced into the semiconductor film 808.

[Semiconductor Film]

For the semiconductor film 808, the composite material described in any one of Embodiments 1 to 4 is used. With the composite material described in any one of Embodiments 1 to 4, high electrical characteristics (e.g., high field-effect mobility or a small S value) can be achieved.

[Second Insulating Film]

The insulating film 810 has a function of supplying oxygen to the semiconductor film 808, particularly to the channel region 808*i*. The insulating film 810 can be formed to have a single-layer structure or a stacked-layer structure of an oxide insulating film or a nitride insulating film, for example. To improve the interface properties with the semiconductor film 808, a region which is in the insulating film 810 and in contact with the semiconductor film 808 is preferably formed using at least an oxide insulating film. For example, a silicon oxide film, a silicon oxynitride film, a silicon nitride oxide film, or a silicon nitride film may be used as the insulating film 810.

The thickness of the insulating film 810 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating film 810 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 810, a silicon oxide film or a silicon oxynitride film whose spin density of a signal due to the E' center is lower than or equal to $3 \times 10^{17}$ spins/cm$^3$, preferably lower than or equal to $5 \times 10^{16}$ spins/cm$^3$ may be used.

In addition to the above-described signal, a signal due to nitrogen dioxide ($NO_2$) might be observed in the insulating film 810. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1 \times 10^{17}$ spins/cm$^3$ and lower than $1 \times 10^{18}$ spins/cm$^3$ as the insulating film 810, for example.

Note that a nitrogen oxide ($NO_x$) such as nitrogen dioxide ($NO_2$) forms a state in the insulating film 810. The state is positioned in the energy gap of the semiconductor film 808. Thus, when nitrogen oxide ($NO_x$) is diffused to the interface between the insulating film 810 and the semiconductor film 808, an electron might be trapped by the state on the insulating film 810 side. As a result, the trapped electron remains in the vicinity of the interface between the insulating film 810 and the semiconductor film 808, leading to a positive shift of the threshold voltage of the transistor. Accordingly, the use of a film with a low nitrogen oxide content as the insulating film 810 can reduce a shift of the threshold voltage of the transistor.

As an insulating film that releases a small amount of nitrogen oxide ($NO_x$), for example, a silicon oxynitride film can be used. The silicon oxynitride film releases more ammonia than nitrogen oxide ($NO_x$) in thermal desorption spectroscopy (TDS); the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount of ammonia released by heat treatment in a range of 50° C. to 650° C. or 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that in the case where the insulating film 810 is analyzed by SIMS, nitrogen concentration in the film is preferably lower than or equal to $6 \times 10^{20}$ atoms/cm$^3$.

The insulating film 810 may be formed using a high-k material such as hafnium silicate ($HfSiO_x$), hafnium silicate containing nitrogen ($HfSi_xO_yN_z$), hafnium aluminate containing nitrogen ($HfAl_xO_yN_z$), or hafnium oxide. The use of such a high-k material enables a reduction in gate leakage current of a transistor.

[Third Insulating Film]

The insulating film 816 contains nitrogen or hydrogen. The insulating film 816 may contain fluorine. As the insulating film 816, for example, a nitride insulating film can be used. The nitride insulating film can be formed using silicon nitride, silicon nitride oxide, silicon oxynitride, silicon nitride fluoride, silicon fluoronitride, or the like. The hydrogen concentration in the insulating film 816 is preferably higher than or equal to $1 \times 10^{22}$ atoms/cm$^3$. Furthermore, the insulating film 816 is in contact with the source region 808*s* and the drain region 808*d* of the semiconductor film 808. Thus, the concentration of an impurity (nitrogen or hydrogen) in the source region 808*s* and the drain region 808*d* in contact with the insulating film 816 is increased, leading to an increase in the carrier density of the source region 808*s* and the drain region 808*d*.

[Fourth Insulating Film]

As the insulating film 818, an oxide insulating film can be used. Alternatively, a layered film of an oxide insulating film and a nitride insulating film can be used as the insulating film 818. The insulating film 818 can be formed using, for example, silicon oxide, silicon oxynitride, silicon nitride oxide, aluminum oxide, hafnium oxide, gallium oxide, or Ga—Zn oxide.

Furthermore, the insulating film 818 preferably functions as a barrier film against hydrogen, water, and the like from the outside.

The thickness of the insulating film 818 can be greater than or equal to 30 nm and less than or equal to 500 nm, or greater than or equal to 100 nm and less than or equal to 400 nm.

[Fifth Insulating Film]

The insulating film 822 has an insulating property and is formed using an inorganic material or an organic material.

Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

[Conductive Film]

The conductive films 806, 812, 820a, and 820b can be formed by a sputtering method, a vacuum evaporation method, a PLD method, a thermal CVD method, or the like. As each of the conductive films 806, 812, 820a, and 820b, a conductive metal film, a conductive film that has a function of reflecting visible light, or a conductive film having a function of transmitting visible light may be used.

A material containing a metal element selected from aluminum, gold, platinum, silver, copper, chromium, tantalum, titanium, molybdenum, tungsten, nickel, iron, cobalt, palladium, and manganese can be used for the metal film having conductivity. Alternatively, an alloy containing any of the above metal elements may be used.

For the metal film having conductivity, specifically a two-layer structure in which a copper film is stacked over a titanium film, a two-layer structure in which a copper film is stacked over a titanium nitride film, a two-layer structure in which a copper film is stacked over a tantalum nitride film, a three-layer structure in which a titanium film, a copper film, and a titanium film are stacked in this order, or the like may be used. In particular, a conductive film containing a copper element is preferably used because the resistance can be reduced. As an example of the conductive film containing a copper element, an alloy film containing copper and manganese is given. The alloy film is favorable because it can be processed by a wet etching method.

Note that a tantalum nitride film is preferably used as the conductive films 806, 812, 820a, and 820b. A tantalum nitride film has conductivity and a high barrier property against copper or hydrogen. Because a tantalum nitride film releases little hydrogen from itself, it can be favorably used as a metal film in contact with the semiconductor film 808 or a metal film in the vicinity of the semiconductor film 808.

As the conductive film having conductivity, a conductive macromolecule or a conductive polymer may be used.

For the conductive film having a function of reflecting visible light, a material containing a metal element selected from gold, silver, copper, and palladium can be used. In particular, a conductive film containing a silver element is preferably used because reflectance of visible light can be improved.

For the conductive film having a function of transmitting visible light, a material containing an element selected from indium, tin, zinc, gallium, and silicon can be used. Specifically, an In oxide, a Zn oxide, an In—Sn oxide (also referred to as ITO), an In—Sn—Si oxide (also referred to as ITSO), an In—Zn oxide, an In—Ga—Zn oxide, or the like can be used.

As the conductive film having a function of transmitting visible light, a film containing graphene or graphite may be used. The film containing graphene can be formed in the following manner: a film containing graphene oxide is formed and is reduced. As a reducing method, a method with application of heat, a method using a reducing agent, or the like can be employed.

The conductive films 812, 820a, and 820b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

When the conductive film is formed by electroless plating, a diffusion prevention film may be formed under the conductive film to prevent component elements of the conductive film from diffusing outward. A seed layer that can make the conductive film grow may be formed between the diffusion prevention film and the conductive film. The diffusion prevention film can be formed by a sputtering method, for example. For the diffusion prevention film, a tantalum nitride film or a titanium nitride film can be used, for example. The seed layer can be formed by an electroless plating method. For the seed layer, a material similar to the material for the conductive film that can be formed by an electroless plating method can be used.

Note that an oxide semiconductor typified by an In—Ga—Zn oxide may be used for the conductive film 812. The oxide semiconductor can have a high carrier density when nitrogen or hydrogen is supplied from the insulating film. In other words, the oxide semiconductor functions as an oxide conductor (OC). Accordingly, the oxide semiconductor can be used for a gate electrode.

The conductive film 812 can have, for example, a single-layer structure of an oxide conductor (OC), a single-layer structure of a metal film, or a stacked-layer structure of an oxide conductor (OC) and a metal film.

Note that it is suitable that the conductive film 812 has a single-layer structure of a light-shielding metal film or a stacked-layer structure of an oxide conductor (OC) and a light-shielding metal film because the channel region 808i formed under the conductive film 812 can be shielded from light. In the case where the conductive film 812 has a stacked-layer structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive films 806, 812, 820a, and 820b can be greater than or equal to 30 nm and less than or equal to 500 nm, or greater than or equal to 100 nm and less than or equal to 400 nm.

[Calculation of Density of Shallow Defect States (sDOS) in Semiconductor Film]

Calculation of a density of shallow defect states (sDOS) in a semiconductor film is described below in detail.

The number of electrons trapped by the interface state, $N_{trap}$, can be measured by comparing drain current-gate voltage ($I_d$-$V_g$) characteristics of the transistor that were actually measured and drain current-gate voltage ($I_d$-$V_g$) characteristics that were calculated.

Figure 10:
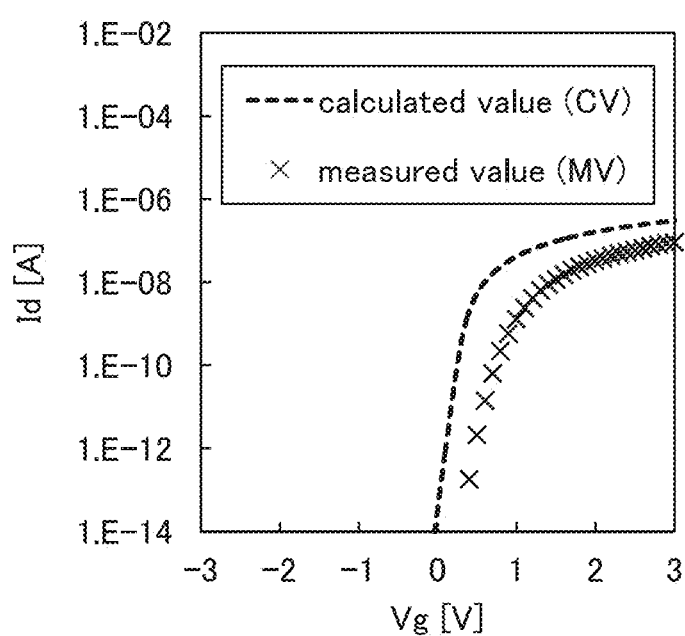
FIG. 10 is a graph showing $I_d$-$V_g$ characteristics.

FIG. 10 illustrates ideal $I_d$-$V_g$ characteristics obtained by calculation and the actually measured $I_d$-$V_g$ characteristics of the transistor when a source voltage $V_s$ is 0 V and a drain voltage $V_d$ is 0.1 V. Note that only values more than or equal to $1 \times 10^{-13}$ A at which drain voltage $I_d$ can be easily measured were plotted among the measurement results of the transistor.

A change of the drain current $I_d$ with respect to the gate voltage $V_g$ is more gradual in the actually measured $I_d$-$V_g$ characteristics than in the ideal $I_d$-$V_g$ characteristics obtained by calculation. This is probably because an electron is trapped by a shallow interface state positioned near energy at the bottom of the conduction band (represented as Ec). In this measurement, the density of interface states $N_{it}$ can be estimated more accurately in consideration of the number of electrons (per unit area and unit energy) trapped by a shallow interface state, $N_{trap}$, with use of the Fermi distribution function.

Figure 11:
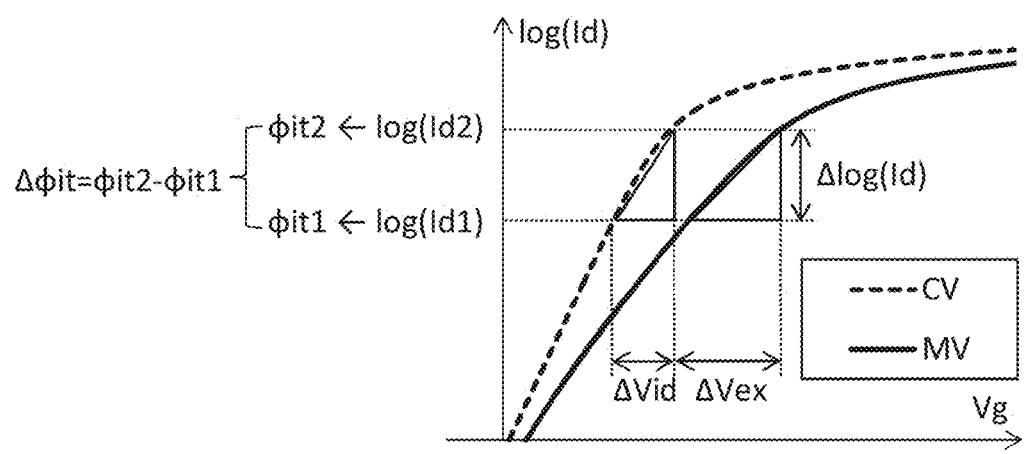
FIG. 11 is a graph showing $I_d$-$V_g$ characteristics.

First, a method for evaluating the number of electrons trapped by an interface trap state, $N_{trap}$, by using schematic $I_d$-$V_g$ characteristics illustrated in FIG. 11 is described. The dashed line indicates ideal $I_d$-$V_g$ characteristics without trap state and is obtained by the calculation. On the dashed line, a change in gate voltage $V_g$ when the drain current changes from $I_d1$ to $I_d2$ is represented by $\Delta V_{id}$. The solid line indicates the actually measured $I_d$-$V_g$ characteristics. On the solid line, a change in gate voltage $V_g$ when the drain current changes from $I_d1$ to $I_d2$ is represented by $\Delta V_{ex}$. The potential at the target interface when the drain current is $I_d1$, the potential at the target interface when the drain current is $I_d2$, and the amount of change are represented by $\phi_{it1}$, $\phi_{it2}$, and $\Delta\phi_{it}$, respectively.

The slope of the actually measured values is smaller than that of the calculated values in FIG. 11, which indicates that $\Delta V_{ex}$ is always larger than $\Delta V_{id}$. Here, a difference between $\Delta V_{ex}$ and $\Delta V_{id}$ corresponds to a potential difference that is needed for trapping of an electron in a shallow interface state. Therefore, $\Delta Q_{trap}$ which the amount of change in charge due to trapped electrons can be expressed by Formula 1 shown below.

$$\Delta Q_{trap} = -C_{tg}(\Delta V_{ex} - \Delta V_{id}) \quad \text{[Formula 1]}$$

$C_{tg}$ is combined capacitance of an insulator and a semiconductor per unit area. In addition, $\Delta Q_{trap}$ can be expressed by Formula 2 by using the number of trapped electrons $N_{trap}$ (per unit area and per unit energy). Note that q represents elementary charge.

$$\Delta Q_{trap} = -qN_{trap}\Delta\phi_{it} \quad \text{[Formula 2]}$$

Simultaneously solving Formulae 1 and 2 gives Formula 3.

$$-C_{tg}(\Delta V_{ex} - V_{id}) = -qN_{trap}\Delta\phi_{it} \quad \text{[Formula 3]}$$

Then, taking the limit zero of $\Delta\phi_{it}$ in Formula 3 gives Formula 4.

$$N_{trap} = \frac{C_{tg}}{q} \lim_{\Delta\phi_{it} \to 0}\left(\frac{\Delta V_{ex}}{\Delta\phi_{it}} - \frac{\Delta V_{id}}{\Delta\phi_{it}}\right) \quad \text{[Formula 4]}$$
$$= C_{tg}\left(\frac{\partial V_{ex}}{\partial \phi_{it}} - \frac{\partial V_{id}}{\partial \phi_{it}}\right)$$

In other words, the number of electrons trapped by an interface surface, $N_{trap}$, can be estimated by using the ideal $I_d$-$V_g$ characteristics, the actually measured $I_d$-$V_g$ characteristics, and Formula 4. Note that the relationship between the drain current and the potential at the interface surface can be obtained by calculation with the device simulator described above.

The relationship between the number of electrons $N_{trap}$ per unit area and per unit energy and the density of interface states $N_{it}$ is expressed by Formula 5.

$$N_{trap} = \frac{\partial}{\partial \phi_{it}} \int_{-\infty}^{\infty} N_{it}(E)f(E)dE \quad \text{[Formula 5]}$$

Here, f(E) is Fermi distribution function. The $N_{trap}$ obtained from Formula 4 is fitted with Formula 5 to determine $N_{it}$. The conduction characteristics including $I_d$<0.1 pA can be obtained by the device simulator to which the $N_{it}$ is set.

Figure 12:
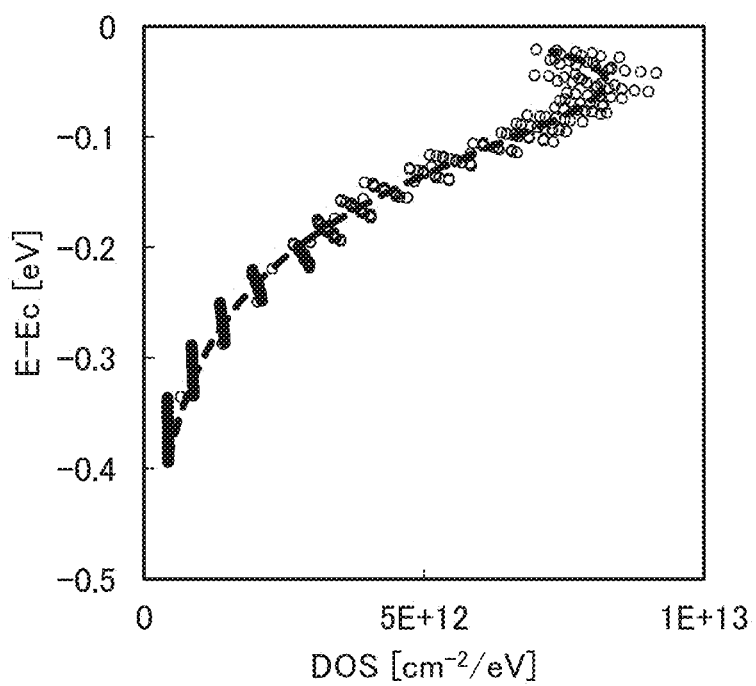
FIG. 12 shows calculation results of a density of interface states.

The actually measured $I_d$-$V_g$ characteristics in FIG. 10 are applied to Formula 4 and the results of extracting $N_{trap}$ are plotted as white circles in FIG. 12. The vertical axis in FIG. 12 represents Fermi energy Ef at the bottom of the conduction band Ec of a semiconductor. The maximum value is positioned on the dashed line just under Ec. When tail distribution of Formula 6 is assumed as $N_{it}$ of Formula 5, $N_{trap}$ can be fitted well like the dashed line in FIG. 12. As a result, the peak value $N_{ta}$=1.67×10$^{13}$ cm$^{-2}$ eV$^{-1}$ and the characteristic width $W_{ta}$=0.105 eV are obtained as the fitting parameters.

$$N_{it}(E) = N_{ta}\exp\left[\frac{E - E_c}{W_{ta}}\right] \quad \text{[Formula 6]}$$

Figure 13A:
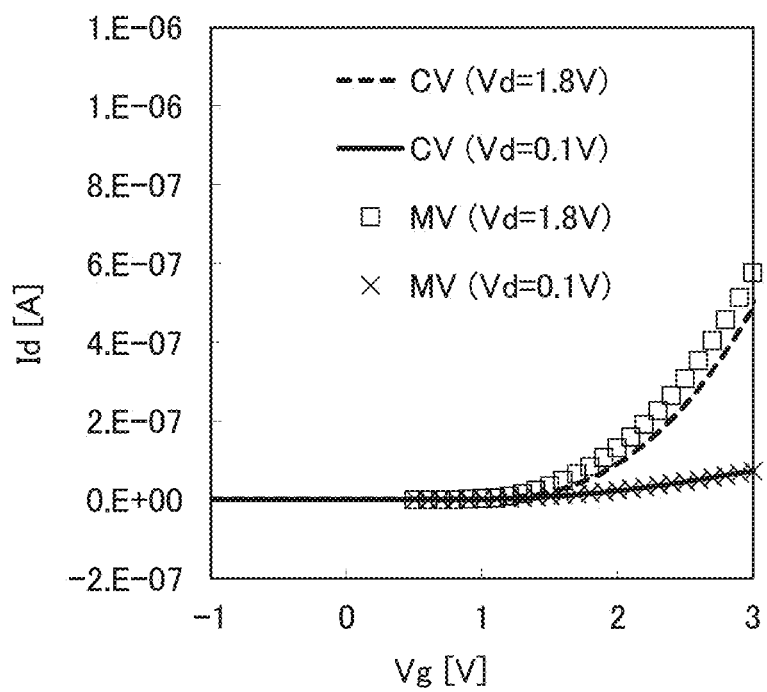
FIGS. 13A and 13B are graphs showing $I_d$-$V_g$ characteristics.
Figure 13B:
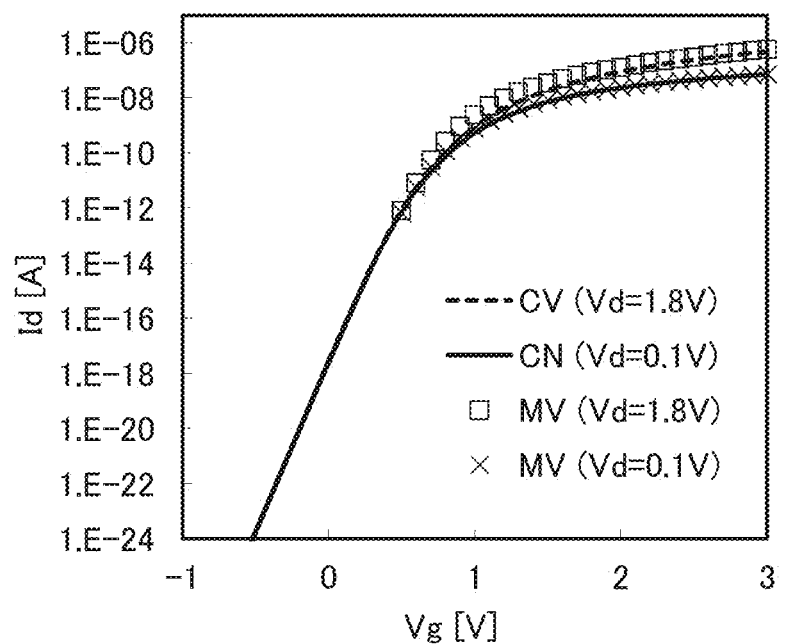

FIGS. 13A and 13B show the inverse calculation results of $I_d$-$V_g$ characteristics by feeding back the obtained fitting curve of interface state to the calculation using the device simulator. FIG. 13A shows the calculated $I_d$-$V_g$ characteristics when the drain voltage $V_d$ is 0.1 V and 1.8V and the actually measured $I_d$-$V_g$ characteristics when the drain voltage $V_d$ is 0.1 V and 1.8V. FIG. 13B is a graph in which the drain current $I_d$ is a logarithm in FIG. 13A.

The curve obtained by the calculation substantially matches with the plot of the actually measured values, which suggests that the calculated values and the measured values are highly reproducible. Accordingly, the above method is quite appropriate as a method for calculating the density of shallow defect states.

The sDOS in the semiconductor film including the above composite material influences the mobility curve of the field-effect mobility. In particular, in the vicinity of the threshold voltage, the shape of the mobility curve is changed because electrons are trapped by the sDOS. The sDOS in the semiconductor film including the composite material is represented by the product of $N_{ta}$ and $W_{ta}$ in Formula 6 and $t_{OS}$.

(Embodiment 6)

Providing transistors having different electrical characteristics over the same layer can increase the degree of freedom in design of a semiconductor device and the integration degree in the semiconductor device. In this embodiment, an example of an embodiment where transistors having different electrical characteristics are provided over the same layer while an increase in the number of manufacturing steps is suppressed will be described.

<Structure Example of Semiconductor Device 1000>

FIG. 14A is a cross-sectional view of a semiconductor device 1000. The semiconductor device 1000 includes a transistor 100 and a transistor 200. The transistors 100 and 200 have different structures. FIG. 14A illustrates cross sections of the transistors 100 and 200 over the substrate 101. FIG. 14A corresponds to a portion taken along dashed-dotted line L1-L2 in the top view in FIG. 15.

Figure 15:
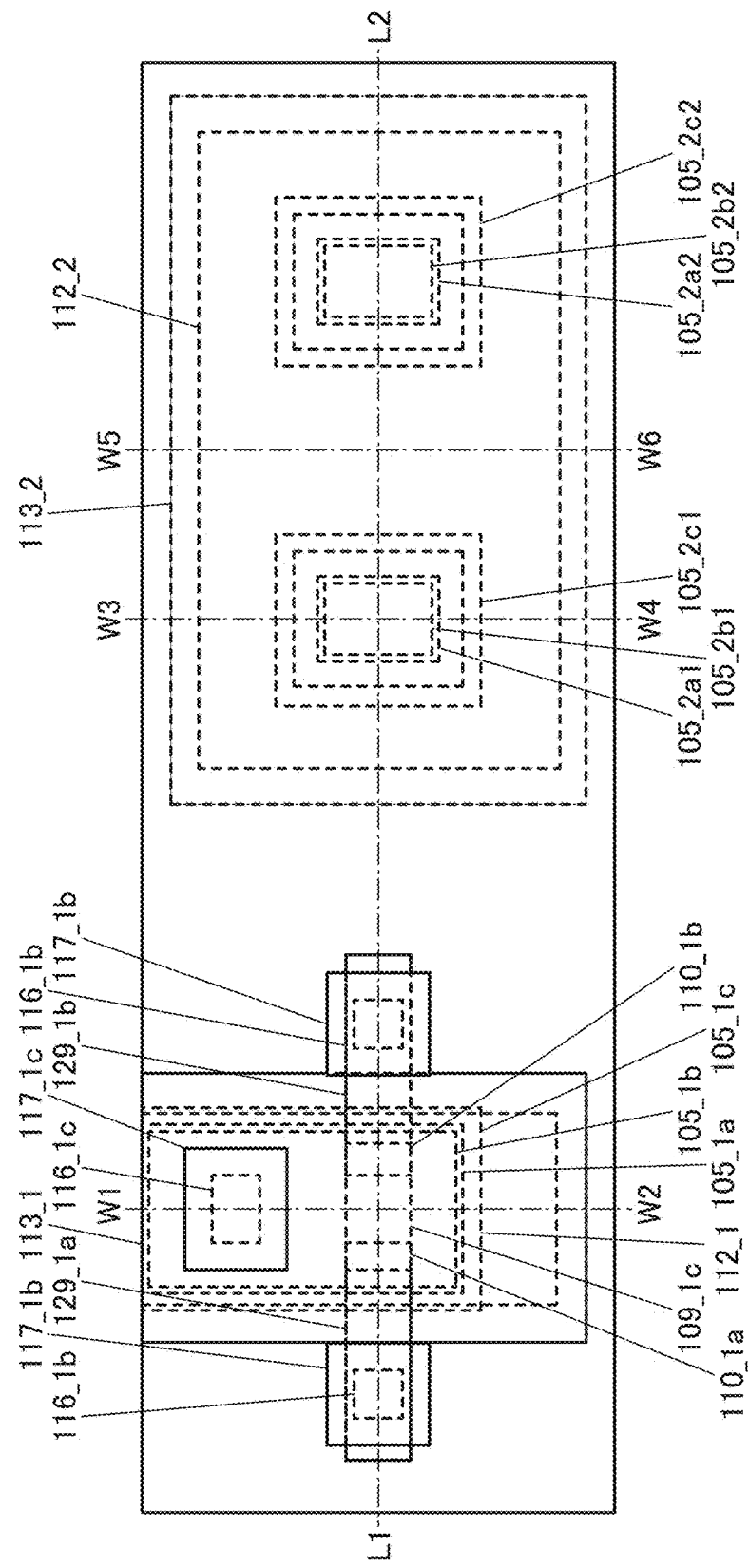
FIG. 15 illustrates a semiconductor device of one embodiment of the present invention.
Figure 16:
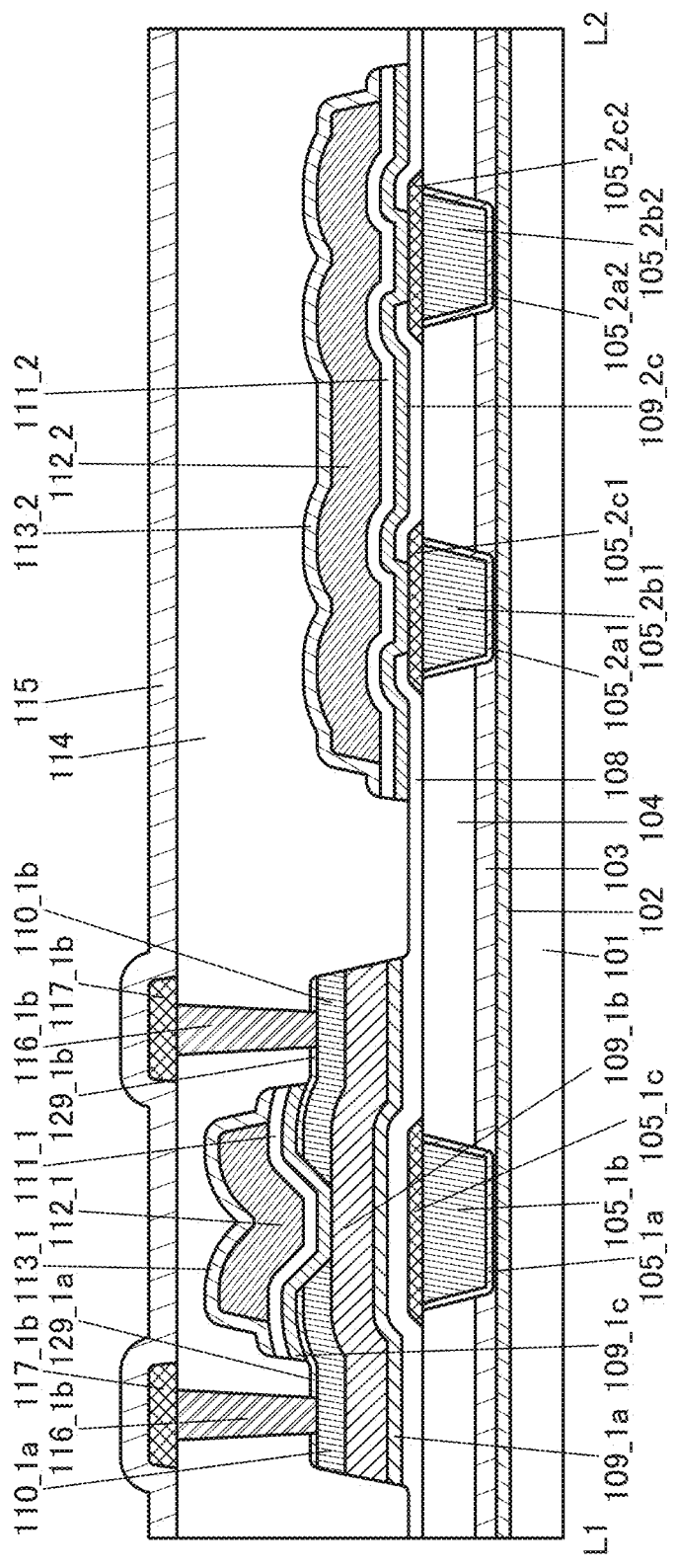
FIG. 16 illustrates a semiconductor device of one embodiment of the present invention.

FIG. 15 is a plan view of the semiconductor device 1000. FIG. 16 is a cross-sectional view of a portion taken along dashed-dotted line L1-L2 in FIG. 15. FIGS. 17A to 17C are cross-sectional views of portions taken along dashed-dotted lines W1-W2, W3-W4, and W5-W6 in FIG. 15. In FIG. 16, the cross-sectional view along L1-L2 is taken in the channel length direction of the semiconductor device 1000, and in FIGS. 17A to 17C, the cross-sectional views along W1-W2, W3-W4, and W5-W6 are taken in the channel width direction of the semiconductor device 1000.

FIGS. 14B and 14C each show an example of a $V_g$-$I_d$ curve, which is one of the electrical characteristics of a transistor. In the $V_g$-$I_d$ curves in FIGS. 14B and 14C, the horizontal axis and the vertical axis represent voltage between a gate and a source ($V_g$) of the transistor and current flowing to a drain ($I_d$) of the transistor on a logarithmic scale, respectively.

The transistor 100 is a transistor including a back gate. FIG. 14B shows an example of the $V_g$-$I_d$ curve of the transistor 100 when the potential of the back gate is set to the same as that of the source or the gate. FIG. 14C shows an example of the $V_g$-$I_d$ curve of the transistor 200 when the potential of the back gate is set to the same as that of the source or the gate. As shown in FIGS. 14B and 14C, the transistors 100 and 200 have different transistor characteristics. The $V_g$ in the $V_g$-$I_d$ curve of the transistor 200 is shifted in the positive direction compared with that in the $V_g$-$I_d$ curve of the transistor 100. In other words, the transistor 200 has higher $V_{th}$ than the transistor 100.

The transistors 100 and 200 are described with reference to drawings.

[Transistor 100]

The transistor 100 is a kind of top-gate transistor. The transistor 100 includes an electrode 105_1a, an electrode 105_1b, an electrode 105_1c, an insulating layer 108, a semiconductor layer 109_1a, a semiconductor layer 109_1b, a semiconductor layer 109_1c, an electrode 110_1a, an electrode 110_1b, a layer 129_1a, a layer 129_1b, an insulating layer 111_1, an electrode 112_1, and an insulating layer 113_1 (see FIG. 15, FIG. 16, and FIGS. 17A to 17C).

The transistor 100 illustrated in FIG. 15, FIG. 16, and FIGS. 17A to 17C is provided over the substrate 101 with an insulating layer 102 and an insulating layer 103 located therebetween. Specifically, an insulating layer 104 is provided over the insulating layer 103, the insulating layers 103 and 104 are partly removed, and the electrode 105_1a and the electrode 105_1b are embedded. The electrode 105_1c is provided over the electrode 105_1a and the electrode 105_1b, and the insulating layer 108 is provided over the electrode 105_1c and the insulating layer 104. The insulating layer 108 has a projection, the semiconductor layer 109_1a is provided over the projection, and the semiconductor layer 109_1b is provided over the semiconductor layer 109_1a.

The transistor 100 includes the electrode 110_1a over the semiconductor layer 109_1b and the electrode 110_1b over the semiconductor layer 109_1b. One of the electrode 110_1a and the electrode 110_1b can function as one of a source electrode and a drain electrode, and the other can function as the other of the source electrode and the drain electrode. Thus, a portion of the semiconductor layer 109_1b can function as the source region and another portion can function as the drain region. Furthermore, a portion of the semiconductor layer 109_1b between the source region and the drain region can function as a channel formation region.

The transistor 100 further includes the layer 129_1a over the electrode 110_1a and the layer 129_1b over the electrode 110_1b. The semiconductor layer 109_1c covering the layer 129_1a, the layer 129_1b, the electrode 110_1a, the electrode 110_1b, the semiconductor layer 109_1b, and the semiconductor layer 109_1a is provided. The semiconductor layer 109_1c includes a region in contact with a side surface of the electrode 110_1a, a region in contact with a side surface of the electrode 110_1b, a region in contact with the portion of the semiconductor layer 109_1b, a region in contact with a side surface of the semiconductor layer 109_1b, and a region in contact with a side surface of the semiconductor layer 109_1a.

The insulating layer 111_1 is provided over the semiconductor layer 109_1c, and the electrode 112_1 is provided over the insulating layer 111_1. The insulating layer 111_1 and the electrode 112_1 include a region overlapping with the portion of the semiconductor layer 109_1b.

The transistor 100 further includes the insulating layer 113_1 over the electrode 112_1. The insulating layers 111_1 and 113_1 extend beyond an end portion of the electrode 112_1 and have a region where the insulating layers 111_1 and 113_1 are in contact with each other in the extended portion.

In this embodiment, an insulating layer 114 is provided over the semiconductor layer 109_1c and the insulating layer 113_1.

An electrode 116_1a is provided in an opening which overlaps with the electrode 110_1a and which is provided in the insulating layer 114, the semiconductor layer 109_1c, and the layer 129_1a. An electrode 116_1b is provided in an opening which overlaps with the electrode 110_1b and which is provided in the insulating layer 114, the semiconductor layer 109_1c, and the layer 129_1a. An electrode 116_1c is provided in an opening which overlaps with the electrode 112_1 and which is provided in the insulating layer 115, the insulating layer 114, and the insulating layer 113_1.

In this embodiment, an electrode 117_1a, an electrode 117_1b, and an electrode 117_1c are provided over the electrode 116_1a, the electrode 116_1b, and the electrode 116_1c, respectively. The electrode 117_1a is electrically connected to the electrode 110_1a through the electrode 116_1a. The electrode 117_1b is electrically connected to the electrode 110_1b through the electrode 116_1b. The electrode 117_1c is electrically connected to the electrode 112_1 through the electrode 116_1c.

In this embodiment, the insulating layer 115 is provided over the insulating layer 114, the electrode 116_1c, the electrode 116_1b, and the electrode 116_1c.

[Gate Electrode and Back Gate Electrode]

One of the electrodes 105_1 and 112_1 can function as a gate electrode and the other can function as a back gate electrode. In general, a gate electrode and a back gate electrode are formed using a conductive layer and positioned so that the channel formation region of the semiconductor layer is located between the gate electrode and the back gate electrode. Thus, the back gate electrode can function in a manner similar to that of the gate electrode. The potential of the back gate electrode may be the same as that of the gate electrode or may be a ground potential or a predetermined potential. By changing the potential of the back gate electrode independently of the potential of the gate electrode, the threshold voltage of the transistor can be changed.

The electrode 105_1 and the electrode 112_1 can each function as a gate electrode. Thus, the insulating layers 106, 107, 108, and 111_1 can each function as a gate insulating layer.

In the case where one of the electrode 105_1 and the electrode 112_1 is referred to as a "gate electrode" or a "gate", the other can be referred to as a "back gate electrode" or a "back gate". For example, in the transistor 100, in the case where the electrode 105_1 is referred to as a "gate electrode", the electrode 112_1 is referred to as a "back gate electrode". In the case where the electrode 112_1 is used as a "gate electrode", the transistor 100 can be regarded as a kind of bottom-gate transistor. Alternatively, one of the electrode 105_1 and the electrode 112_1 may be referred to as a "first gate electrode" or a "first gate", and the other may be referred to as a "second gate electrode" or a "second gate".

By providing the electrode 105_1 and the electrode 112_1 with the semiconductor layer 109_1b provided therebetween and setting the potentials of the electrode 105_1 and the electrode 112_1 to be the same, a region of the semiconductor layer 109_1b through which carriers flow is enlarged in the thickness direction; thus, the number of transferred carriers is increased. As a result, the on-state current and the field-effect mobility of the transistor 100 are increased.

Therefore, the transistor 100 has large on-state current for its area. That is, the area occupied by the transistor 100 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer to cover the semiconductor layer in the plan view, the electric field blocking function can be enhanced.

Since the electrode 105_1 and the electrode 112_1 each have a function of blocking an electric field from the outside, charges of charged particles and the like generated over the electrode 112_1 or under the electrode 105_1 do not influence the channel formation region in the semiconductor layer 109_1b. Thus, degradation due to a stress test (e.g., a negative gate bias temperature (−GBT) stress test in which negative charges are applied to a gate) can be reduced. In addition, the electrode 105_1 and the electrode 112_1 can block an electric field generated from the drain electrode so as not to affect the semiconductor layer. Thus, changes in the rising voltage of on-state current due to changes in drain voltage can be suppressed. Note that this effect is significant when a potential is applied to the electrodes 105_1 and 112_1.

The GBT stress test is one kind of acceleration test and can evaluate, in a short time, a change by long-term use (i.e., a change over time) in characteristics of a transistor. In particular, the amount of change in threshold voltage of the transistor between before and after the GBT stress test is an important indicator when the reliability of the transistor is examined. If the amount of change in the threshold voltage between before and after the GBT stress test is small, the transistor has higher reliability.

By providing the electrodes 105_1 and 112_1 and setting the potentials of the electrodes 105_1 and 112_1 to be the same, the amount of change in threshold voltage is reduced. Accordingly, a variation in electrical characteristics among a plurality of transistors is also reduced.

The transistor including the back gate electrode has a smaller change in threshold voltage by a positive GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

[Transistor 200]

The transistor 200 is a kind of top-gate transistor. The transistor 200 includes an electrode 105_2a1, an electrode 105_2b1, an electrode 105_2c1, an electrode 105_2a2, an electrode 105_2b2, an electrode 105_2c2, the insulating layer 108, a semiconductor layer 109_2c, an insulating layer 111_2, an electrode 112_2, and an insulating layer 113_2 (see FIG. 15, FIG. 16, and FIGS. 17A to 17C).

The transistor 200 illustrated in FIG. 15, FIG. 16, and FIGS. 17A to 17C is provided over the substrate 101 with the insulating layer 102 and the insulating layer 103 located therebetween. Specifically, the insulating layer 104 is provided over the insulating layer 103, the insulating layers 103 and 104 are partly removed, and the electrode 105_2a1, the electrode 105_2b1, the electrode 105_2a2, and the electrode 105_2b2 are embedded. The electrode 105_2c1 is provided over the electrode 105_2a1 and the electrode 205_2b1, and the electrode 105_2c2 is provided over the electrode 105_2a2 and the electrode 105_2b2. The insulating layer 108 is provided over the electrode 105_2c1, the electrode 105_2c2, and the insulating layer 104. The electrode 105_2a1, the electrode 105_2b1, the electrode 105_2c1, the electrode 105_2a2, the electrode 105_2b2, and the electrode 105_2c2 can function as one of a source electrode and a drain electrode. When the electrode 105_2a1, the electrode 105_2b1, and the electrode 105_2c1 function as one of the source electrode and the drain electrode, the electrode 105_2a2, the electrode 105_2b2, and the electrode 105_2c2 function as the other of the source electrode and the drain electrode.

The transistor 200 includes the semiconductor layer 109_2c over the insulating layer 108.

A portion of the semiconductor layer 109_2c is a first portion overlapping with the electrode 105_2c1. Another portion of the semiconductor layer 109_2c is a second portion overlapping with the electrode 105_2c2. Furthermore, another portion of the semiconductor layer 109_2c between the first portion and the second portion can function as a channel formation region.

The transistor 200 includes the insulating layer 111_2 over the semiconductor layer 109_2c and the electrode 112_2 over the insulating layer 111_2. The insulating layer 111_2 and the electrode 112_2 include a region overlapping with the portion of the semiconductor layer 109_2c.

The transistor 200 further includes the insulating layer 113_2 over the electrode 112_2. The insulating layers 111_2 and 113_2 extend beyond an end portion of the electrode 112_2 and have a region where the insulating layers 111_2 and 113_2 are in contact with each other in the extended portion.

In this embodiment, the insulating layer 114 is provided over the semiconductor layer 109_2c and the insulating layer 113_2, and the insulating layer 115 is provided over the insulating layer 114.

In this specification and the like, the electrode 105_1a, the electrode 105_1b, and the electrode 105_1c may be collectively referred to as an "electrode 105", for example. The semiconductor layer 109_1c and the semiconductor layer 109_2c may be collectively referred to as a "semiconductor layer 109c", for example. The electrode 105_2a1 and the electrode 105_2a2 may be collectively referred to as an "electrode 105_2a". The electrode 105_1a, the electrode 105_2a1, and the electrode 105_2a2 may be collectively referred to as an "electrode 105a". In the other structures, similar description may be used.

In the transistor 100, a channel is formed in the semiconductor layer 109b. In the transistor 200, a channel is formed in the semiconductor layer 109c. The semiconductor layer 109b and the semiconductor layer 109c are preferably formed using semiconductor materials having different physical properties. When the semiconductor layer 109b and the semiconductor layer 109c are formed using semiconductor materials having different physical properties, the transistor 100 and the transistor 200 can have different electrical characteristics. When semiconductors having different energy bandgaps are used for the semiconductor layers 109b and 109c, for example, the transistors 100 and 200 can have different field-effect mobilities.

When a semiconductor having lower electron affinity than that of the semiconductor layer 109b is used for the semiconductor layer 109c, for example, the transistor 200 can have higher $V_{th}$ than the transistor 100.

When the semiconductor layer 109_2b1 is provided in contact with the electrode 110_2a and the semiconductor layer 109_2c, variation in electrical characteristics of the transistor 200 can be reduced. When the semiconductor layer 109_2b2 is provided in contact with the electrode 110_2b and the semiconductor layer 109_2c, variation in electrical characteristics of the transistor 200 can be reduced.

<Materials>
[Substrate]

There is no particular limitation on a material used for the substrate 101 as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed. In this case, at least one of the gate, the source, and the drain of the transistor 100 and/or the transistor 200 may be electrically connected to the device.

Further alternatively, as the substrate 101, a glass substrate of barium borosilicate glass, aluminoborosilicate glass, or the like, a ceramic substrate, a quartz substrate, or a sapphire substrate can be used. Note that a flexible substrate may be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulating Layer]

The insulating layers 102 to 104, 108, 111, and 113 to 115 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 102 and/or the insulating layer 103 be formed using an insulating material that is relatively impermeable to impurities. The insulating layer 102 and/or the insulating layer 103 may each be formed to have, for example, a single-layer structure or a stacked-layer structure including an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum. Examples of such an insulating material include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride.

When the insulating material that is relatively impermeable to impurities is used for the insulating layer 102 and/or the insulating layer 103, impurity diffusion from the substrate 101 side can be suppressed, and the reliability of the transistor can be improved. When the insulating material that is relatively impermeable to impurities is used for the insulating layer 115, impurity diffusion from layers above the insulating layer 115 can be suppressed, and the reliability of the transistor can be improved.

Note that a stack of a plurality of insulating layers formed with these materials may be used as the insulating layer 102 and/or the insulating layer 103. One of the insulating layer 102 and the insulating layer 103 may be omitted.

When a composite material obtained using a target containing an oxide semiconductor is used for the semiconductor layer 109, the hydrogen concentrations in the insulating layers are preferably lowered in order to prevent an increase in the hydrogen concentration in the semiconductor layer 109. Specifically, the hydrogen concentration in the insulating layer that is measured by SIMS is set lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is particularly preferable to lower the hydrogen concentrations of the insulating layers 104, 106 to 108, 111, and 114. It is preferable to lower at least the hydrogen concentrations of the insulating layers 108, 111, and 114 in contact with the semiconductor layer 109.

Furthermore, the nitrogen concentrations in the insulating layers are preferably low in order to prevent an increase in the nitrogen concentration in the semiconductor layer 109. Specifically, the nitrogen concentration in the insulating layer, which is measured by SIMS, is set lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that a region of the insulating layer 108 which is in contact with at least the semiconductor layer 109 and a region of the insulating layer 111 which is in contact with at least the semiconductor layer 109 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating layer 108 and the insulating layer 111, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ can be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density of a signal due to nitrogen dioxide (NO$_2$) is higher than or equal to $1\times10^{17}$ spins/cm$^3$ and lower than $1\times10^{18}$ spins/cm$^3$ as the insulating layer 108 and the insulating layer 111, for example.

Note that nitrogen oxide (NO$_x$) such as nitrogen dioxide (NO$_2$) forms a state in the insulating layer. The state is positioned in the energy gap of the oxide semiconductor layer. Thus, when nitrogen oxide (NO$_x$) is diffused to the interface between the insulating layer and the oxide semiconductor layer, an electron can potentially be trapped by the state on the insulating layer side. As a result, the trapped electrons remain in the vicinity of the interface between the insulating layer and the oxide semiconductor layer; thus, the threshold voltage of the transistor is shifted in the positive direction. Therefore, a shift in the threshold voltage of the transistor can be reduced when a film with a low nitrogen oxide content is used as the insulating layer 108 and the insulating layer 111.

As an insulating layer that releases little nitrogen oxide (NO$_x$), for example, a silicon oxynitride layer can be used. The silicon oxynitride layer is a film of which the amount of released ammonia is larger than the amount of released nitrogen oxide (NO$_x$) in thermal desorption spectroscopy (TDS); the typical amount of released ammonia is greater than or equal to $1\times10^{18}$/cm$^3$ and less than or equal to $5\times10^{19}$/cm$^3$. Note that the released amount of ammonia is the total amount of ammonia released by heat treatment in a range from 50° C. to 650° C. or a range from 50° C. to 550° C. in TDS.

Since nitrogen oxide (NO$_x$) reacts with ammonia and oxygen in heat treatment, the use of an insulating layer that releases a large amount of ammonia reduces nitrogen oxide (NO$_x$).

At least one of the insulating layers 108, 111, and 114 is preferably formed using an insulating layer from which oxygen is released by heating. Specifically, it is preferable to use an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that oxygen released by heating is also referred to as excess oxygen.

The insulating layer containing excess oxygen can be formed by performing treatment for adding oxygen to an insulating layer. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

A heat-resistant organic material such as a polyimide, an acrylic-based resin, a benzocyclobutene-based resin, a polyamide, or an epoxy-based resin may be used to form the insulating layer 114. Other than the above organic materials, a low-dielectric constant material (low-k material), a siloxane-based resin, phosphosilicate glass (PSG), borophosphosilicate glass (BPSG), or the like can be used. Note that the insulating layer 114 may be formed by stacking a plurality of insulating layers formed using any of these materials.

Note that the siloxane-based resin corresponds to a resin including an Si—O—Si bond formed using a siloxane-based material as a starting material. The siloxane-based resin may contain, as a substituent, an organic group (e.g., an alkyl group or an aryl group) or a fluoro group. The organic group may contain a fluoro group.

There is no particular limitation on the method for forming the insulating layer 114, and any of the following methods which depend on a material thereof can be used: a sputtering method; an SOG method; spin coating; dipping; spray coating; a droplet discharging method (e.g., an ink-jet method); a printing method (e.g., screen printing or offset printing); or the like. When the baking step of the insulating layer 114 also serves as heat treatment for another layer, the transistor can be manufactured efficiently.

Any of the above insulating layers may be used as the layer 129. In the case where the layer 129 is an insulating layer, an insulating layer which is less likely to release oxygen and/or which is less likely to absorb oxygen is preferably used.

[Electrode]

As a conductive material for forming the electrodes 105, 110, 112, 116, and 117, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or a silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used.

A stack of a plurality of conductive layers formed with the above materials may be used. For example, a stacked-layer structure formed using a material containing the above metal element and a conductive material containing oxygen may be used. Alternatively, a stacked-layer structure formed using a material containing the above metal element and a conductive material containing nitrogen may be used. Further alternatively, a stacked-layer structure formed using a material containing the above metal element, a conductive material containing oxygen, and a conductive material containing nitrogen may be used.

Note that in the case where the above composite material is used for the semiconductor layer and a stacked-layer structure formed using a combination of a material including any of the metal elements listed above and a conductive material including oxygen is used as the gate electrode, the conductive material including oxygen is preferably provided on the semiconductor layer side. By providing the conductive material including oxygen on the semiconductor layer side, oxygen released from the conductive material is likely to be supplied to the semiconductor layer.

The electrode 116 may be formed using, for example, a conductive material with high embeddability, such as tungsten or polysilicon. A conductive material with high embeddability and a barrier layer (a diffusion prevention layer) such as a titanium layer, a titanium nitride layer, or a tantalum nitride layer may be used in combination. Note that the electrode 116 may be referred to as a contact plug.

In particular, the electrode 105 in contact with the insulating layers 103 and 104 is preferably formed using a conductive material that is relatively impermeable to impurities. Furthermore, the electrode 116 in contact with the insulating layers 114 and 115 is preferably formed using a conductive material that is relatively impermeable to impurities. As an example of the conductive material that is relatively impermeable to impurities, tantalum nitride can be given.

When the insulating layers 103 and 115 are formed using an insulating material that is relatively impermeable to impurities and the electrodes 105 and 116 are formed using a conductive material that is relatively impermeable to impurities, diffusion of impurities into the transistors 100 and 200 can be further suppressed. Thus, the reliability of the transistors 100 and 200 can be further increased.

Any of the above conductive materials may be used for the layer 129. In the case where the layer 129 is formed using a conductive material, a conductive material which is less likely to release oxygen and/or which is less likely to absorb oxygen is preferably used.

[Semiconductor Layer]

For the semiconductor layer 109, any one of the composite materials in Embodiments 1 to 4 is used. The composite material has a structure including a plurality of stacks of the first region and the second region. The thickness of each of the first region and the second region is greater than or equal to 0.5 nm and less than or equal to 5 nm. The semiconductor layer 109 has a stacked structure in which at least three stacks are repeated.

A switching element, specifically a transistor including a well potential structure, can be manufactured by utilizing a structure like a superlattice included in the composite material.

This embodiment can be freely combined with any of the other embodiments.

(Embodiment 7)

The transistors disclosed in Embodiment 6 can be used in a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

Figure 18A:
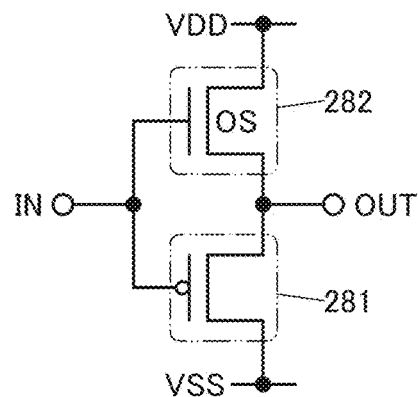
FIGS. 18A to 18C are each a circuit diagram of a semiconductor device of one embodiment of the present invention.
Figure 18B:
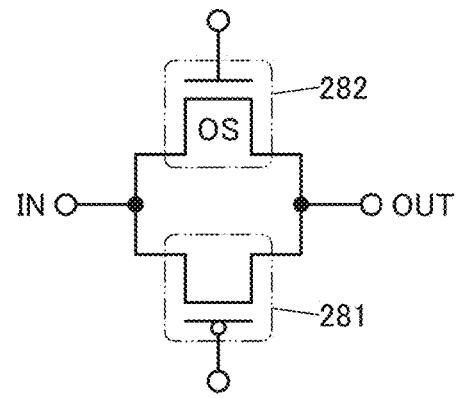
Figure 18C:
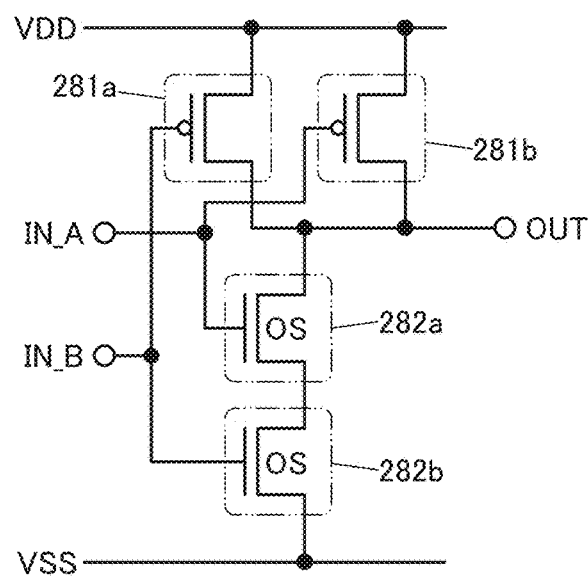

Examples of a semiconductor circuit including the transistor disclosed in this specification and the like are illustrated in circuit diagrams in FIGS. 18A to 18C. In the circuit diagrams and the like, "OS" is given beside the circuit symbol of a transistor which is preferably an OS transistor.

The semiconductor circuit illustrated in FIG. 18A has a configuration of an inverter circuit in which the p-channel transistor 281 and the n-channel transistor 282 are connected to each other in series and in which gates of the transistors are connected to each other.

The semiconductor circuit illustrated in FIG. 18B has a configuration of an analog switch circuit in which the p-channel transistor 281 and the n-channel transistor 282 are connected to each other in parallel.

The semiconductor circuit illustrated in FIG. 18C has a configuration of a NAND circuit including a transistor 281a, a transistor 281b, a transistor 282a, and a transistor 282b. A potential output from the NAND circuit changes depending on the combination of potentials input to an input terminal IN_A and an input terminal IN_B.

<Example of Memory Element>

Figure 19A:
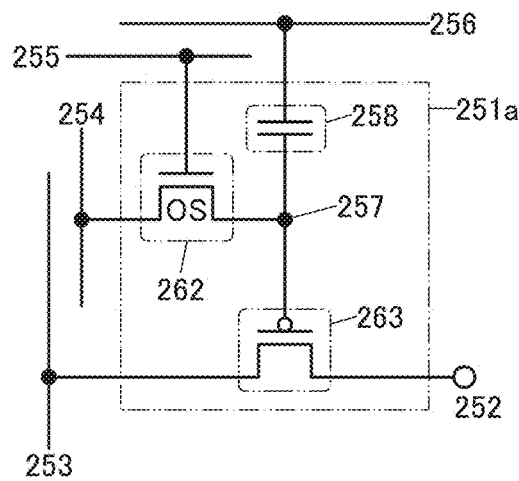
FIGS. 19A to 19D are each a circuit diagram of a semiconductor device of one embodiment of the present invention.

The semiconductor circuit illustrated in FIG. 19A has a configuration of a memory element 251a in which one of a source and a drain of a transistor 262 is connected to a gate of a transistor 263 and one electrode of a capacitor 258. The circuit illustrated in FIG. 19B has a configuration of a memory element 261a in which one of the source and the drain of the transistor 262 is connected to one electrode of the capacitor 258.

In each of the memory elements 251a and 261a, charges injected through the wiring 254 and the transistor 262 can be stored at a node 257. The transistor 262 is an OS transistor, which enables charges to be stored at the node 257 for a long period.

The memory element 251a includes the transistor 263. Although the transistor 263 is a p-channel transistor in FIG. 19A, the transistor 263 may be an n-channel transistor. For example, the transistor 281 or the transistor 282 may be used as the transistor 263. An OS transistor may also be used as the transistor 263.

Figure 19B:
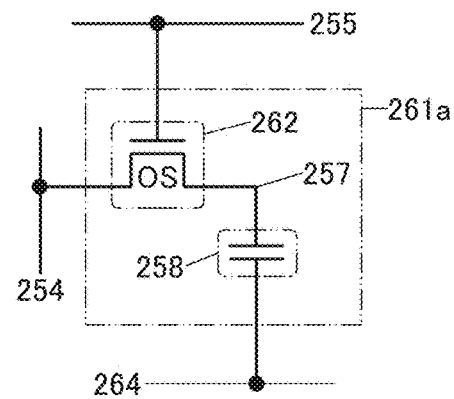

The memory element 251a illustrated in FIG. 19A and the memory element 261a illustrated in FIG. 19B are described in detail here.

The memory element 251a includes the transistor 263 using a first semiconductor, the transistor 262 using a second semiconductor, and the capacitor 258.

As the transistor 262, any of the OS transistors disclosed in the above embodiments can be used. When a transistor having a low off-state current is used as the transistor 262, data can be retained at the node 257 for a long period. In other words, power consumption of the memory element can be reduced because refresh operation becomes unnecessary or the frequency of refresh operation can be extremely low.

In FIG. 19A, a wiring 252 is electrically connected to one of a source and a drain of the transistor 263, and a wiring 253 is electrically connected to the other of the source and the drain of the transistor 263. The wiring 254 is electrically connected to one of the source and the drain of the transistor 262, and a wiring 255 is electrically connected to a gate of the transistor 262. The gate of the transistor 263, the other of the source and the drain of the transistor 262, and the one electrode of the capacitor 258 are electrically connected to the node 257. A wiring 256 is electrically connected to the other electrode of the capacitor 258.

The memory element 251a in FIG. 19A has a feature that the charges supplied to the node 257 can be retained, and thus enables writing, retaining, and reading of data as follows.

[Writing and Retaining Operations]

Data writing and retaining operations of the memory element 251a will be described. First, the potential of the wiring 255 is set to a potential at which the transistor 262 is on. Accordingly, the potential of the wiring 254 is supplied to the node 257. That is, a predetermined charge is supplied to the node 257 (writing). Here, one of two kinds of charges providing different potential levels (hereinafter also referred to as a "low-level charge" and a "high-level charge") is supplied. After that, the potential of the wiring 255 is set to a potential at which the transistor 262 is off. Thus, the charge is retained at the node 257 (retaining operation).

Note that the high-level charge is a charge for supplying a higher potential to the node 257 than the low-level charge. In the case where the transistor 263 is a p-channel transistor, each of the high-level and low-level charges is a charge for supplying a potential higher than the threshold voltage of the transistor 263. In the case where the transistor 263 is an n-channel transistor, each of the high-level and low-level charges is a charge for supplying a potential lower than the threshold voltage of the transistor 263. In other words, each of the high-level and low-level charges is a charge for supplying a potential at which the transistor 263 is off.

[Reading Operation 1]

Next, operation of reading data will be described. A reading potential $V_R$ is supplied to the wiring 256 while a predetermined potential (a constant potential) different from the potential of the wiring 253 is supplied to the wiring 252, whereby data retained at the node 257 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 256 in a period during which data is not read is set to a potential higher than $V_H$ in the case where the transistor 263 is a p-channel transistor, and is set to a potential lower than $V_L$ in the case where the transistor 263 is an n-channel transistor.

For example, in the case where the transistor 263 is a p-channel transistor, $V_R$ is −2 V when $V_{th}$ of the transistor 263 is −2 V, $V_H$ is 1 V, and $V_L$ is −1 V. When the potential written to the node 257 is $V_H$ and $V_R$ is applied to the wiring 256, $V_R+V_H$, i.e., −1 V, is applied to the gate of the transistor 263. Since −1 V is higher than $V_{th}$, the transistor 263 is not turned on. Thus, the potential of the wiring 253 is not changed. When the potential written to the node 257 is $V_L$ and $V_R$ is applied to the wiring 256, $V_R+V_L$, i.e., −3 V, is applied to the gate of the transistor 263. Since −3 V is lower than $V_{th}$, the transistor 263 is turned on. Thus, the potential of the wiring 253 is changed.

In the case where the transistor 263 is an n-channel transistor, $V_R$ is 2 V when $V_{th}$ of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than $V_{th}$, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than $V_{th}$, the transistor 263 is not turned on. Thus, the potential of the wiring 253 is not changed.

By determining the potential of the wiring 253, data retained at the node 257 can be read.

The memory element 261a illustrated in FIG. 19B is different from the memory element 251a in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261a in a manner similar to that of the memory element 251a.

[Reading Operation 2]

Operation of reading data of the memory element 261a will be described. When a potential at which the transistor 262 is turned on is supplied to the wiring 255, the wiring 254 which is in a floating state and the capacitor 258 are brought into conduction, and the charge is redistributed between the wiring 254 and the capacitor 258. As a result, the potential of the wiring 254 is changed. The amount of change in the potential of the wiring 254 varies depending on the potential of the node 257 (or the charge accumulated in the node 257).

For example, the potential of the wiring 254 after the charge redistribution is $(C_B \times V_{B0} + C \times V)/(C_B + C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0 (V_1 > V_0)$, the potential of the wiring 254 in the case of retaining the potential $V_1$ $(=(C_B \times V_{B0} + C \times V)/(C_B + C))$ is higher than the potential of the wiring 254 in the case of retaining the potential $V_0$ $(=(C_B \times V_{B0} + C \times V_0)/(C_B + C))$.

Then, by comparing the potential of the wiring 254 with a predetermined potential, data can be read.

When including a transistor using a composite material and having an extremely low off-state current, the memory element described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory element, high voltage is not needed for data writing and deterioration of the element is less likely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

Figure 19C:
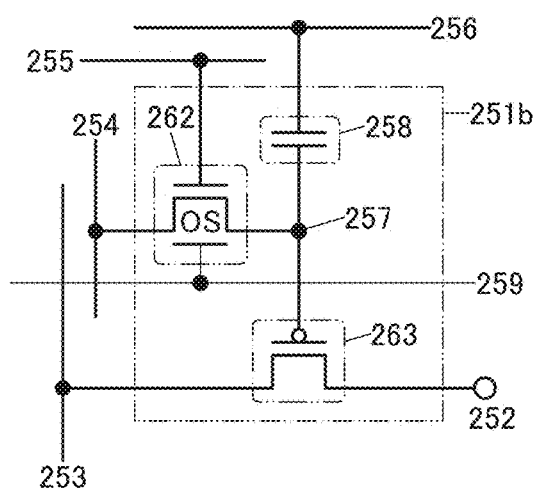
Figure 19D:
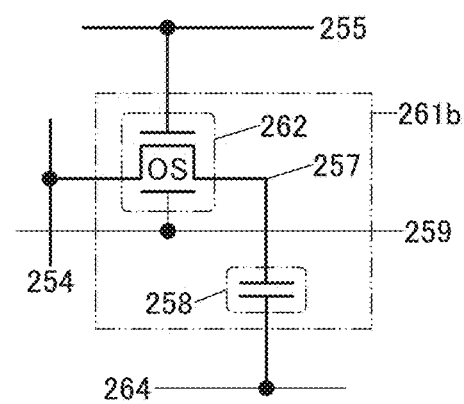

The transistor 262 may be a transistor including a back gate. By controlling the potential supplied to the back gate, the threshold voltage of the transistor 262 can be appropriately changed. A memory element 251b illustrated in FIG. 19C has substantially the same circuit configuration as the memory element 251a. The memory element 251b is different from the memory element 251a in that a transistor including a back gate is used as the transistor 262. A memory element 261b illustrated in FIG. 19D has substantially the same circuit configuration as the memory element 261a. The memory element 261b is different from the memory element 261a in that a transistor including a back gate is used as the transistor 262.

In each of the memory elements 251b and 261b, the back gate of the transistor 262 is electrically connected to a wiring 259. By controlling the potential supplied to the wiring 259, the threshold voltage of the transistor 262 can be appropriately changed.

<Examples of Memory Device>

FIGS. 20A and 20B are circuit diagrams showing examples of a memory device including any of the above memory elements. A memory device 300 illustrated in FIG. 20A includes a memory circuit 310 and a voltage retention circuit 320. A memory device 300a illustrated in FIG. 20B includes a memory circuit 310a and the voltage retention circuit 320. The memory circuits 310 and 310a each include a plurality of memory elements. FIGS. 20A and 20B illustrate the case where three memory elements 261b (memory elements 261b_1 to 261b_3) are provided.

In the memory device 300 illustrated in FIG. 20A, the memory element 261b_1 included in the memory circuit 310 is electrically connected to a wiring 255_1 and a wiring 254_1. The memory element 261b_2 included in the memory circuit 310 is electrically connected to a wiring 255_2 and a wiring 254_2. The memory element 261b_3 included in the memory circuit 310 is electrically connected to a wiring 255_3 and a wiring 254_3. The memory elements 261b_1 to 261b_3 included in the memory circuit 310 are electrically connected to the wiring 264.

In the memory device 300a illustrated in FIG. 20B, the memory elements 261b_1 to 261b_3 included in the memory circuit 310a are electrically connected to the wiring 255. The memory element 261b_1 included in the memory circuit 310a is electrically connected to the wiring 254_1 and a wiring 264_1. The memory element 261b_2 included in the memory circuit 310a is electrically connected to the wiring 254_2 and a wiring 264_2. The memory element 261b_3 included in the memory circuit 310a is electrically connected to the wiring 254_3 and a wiring 264_3.

Note that the above description of the memory element 261b can be referred to for configurations, operations, and the like of the memory elements 261b_1 to 261b_3. Thus, detailed description is omitted here.

The voltage retention circuit 320 includes a transistor 323 and a capacitor 324. In FIGS. 20A and 20B, the transistor 323 is a transistor including a back gate; however, the transistor 323 may be a transistor without a back gate. In FIGS. 20A and 20B, one of a source and a drain of the transistor 323 is electrically connected to a terminal 321. The other of the source and the drain, a gate, and the back gate of the transistor 323 are electrically connected to the wiring 259. One electrode of the capacitor 324 is electrically connected to the wiring 259. The other electrode of the capacitor 324 is electrically connected to a wiring 322.

By controlling the potential of the wiring 322, the potential of the wiring 259 can be changed. In the reading operation and the writing operation of the memory devices 300 and 300a, a potential is supplied to the wiring 322 so that the potential of the wiring 259 is higher than a negative potential (a potential lower than GND) described later and lower than a potential corresponding to $V_{th}$ of the transistor 262 (a potential at which the transistor 262 is turned on).

In the case where gates of the transistors 262 in the memory elements 261b_1 to 261b_3 are electrically connected to the wiring 255 as in the memory device 300a, the potential of the wiring 259 may be higher than a potential corresponding to $V_{th}$ of the transistor 262.

By controlling the potential of the wiring 259, the operation speed of the transistor 262 can be increased. Furthermore, apparent $V_{th}$ of the transistor 262 can be decreased. Thus, the data writing speed and the data reading speed can be increased.

In the retention operation of the memory circuit 310, a fixed potential is supplied to the wiring 322. For example, GND is supplied. After that, a negative potential (a potential lower than GND) is supplied to the terminal 321. When a negative potential is supplied to the terminal 321, the gate potential of the transistor 323 becomes relatively high, so that the transistor 323 is turned on. Consequently, the negative potential is supplied to the wiring 259 through the transistor 323. More accurately, the wiring 259 is supplied with a potential higher than the negative potential by $V_{th}$. Note that the wiring 259 is supplied with the negative potential in this embodiment and the like for easy understanding.

When the wiring 259 is supplied with a negative potential, the potential of the back gate of the transistor 262 is decreased, and the transistor 262 is turned off; thus, data written to the memory circuit 310 can be retained. Furthermore, by supplying the negative potential to the back gate of the transistor 262, apparent $V_{th}$ of the transistor is increased. Thus, even when the potential of the gate of the transistor 262 is changed, data written to the memory circuit 310 can be retained.

Next, a potential higher than or equal to GND is supplied to the terminal 321. For example, GND is supplied. Since the potential of the wiring 259 is the negative potential, the potential of the gate of the transistor becomes the negative potential. Accordingly, the transistor 323 is turned off. Even when power supply to the memory device 300 (memory device 300a) is stopped after that, the transistors 323 and 262 can remain off.

The voltage retention circuit 320 has a function of suppressing a change in the potential of the wiring 259 in the retention operation of the memory device 300 (memory device 300a). The voltage retention circuit 320 has a function of suppressing a change in the potential of the wiring 259 even when power supply to the memory device 300 (memory device 300a) is stopped. In other words, the voltage retention circuit 320 has a function of retaining the voltage of the wiring 259. The transistor 323 is preferably a transistor having a low off-state current to retain the voltage of the wiring 259. For example, when the capacitance of the capacitor 324 is 10 pF and an acceptable increase in the potential of the wiring 259 is 0.5 V, a period during which the potential of the wiring 259 is increased by 0.5 V is an hour in the case where the off-state current of the transistor 323 is $1.39 \times 10^{-15}$ A, a day in the case where the off-state current of the transistor 323 is $5.79 \times 10^{-17}$ A, a year in the case where the off-state current of the transistor 323 is $1.59 \times 10^{-19}$ A, and ten years in the case where the off-state current of the transistor 323 is $1.59 \times 10^{-20}$ A. When the off-state current of the transistor 323 is lower than or equal to $1.59 \times 10^{-20}$ A, data written to the memory circuit 310 can be retained for ten years or more.

For example, by using an OS transistor as the transistor 323, an extremely low off-state current of the transistor can be achieved. In order to reduce the off-state current, the transistor 323 preferably has a long channel length. Alternatively, the transistor 323 preferably has a short channel width. Alternatively, the transistor 323 preferably has a channel length longer than a channel width.

The transistor 323 is particularly preferably a transistor having a low off-state current at $V_g$ of 0 V. Thus, a transistor having high $V_{th}$ is preferably used as the transistor 323. As the transistor having high $V_{th}$, the transistor 200 or the like described above can be used. Since the transistor 262 writes or reads data, a transistor having low $V_{th}$ is preferably used as the transistor 262. Furthermore, a transistor having a high on-state current and high field-effect mobility is preferably used as the transistor 262. The transistor 100 or the like described above can be used as the transistor 262.

This embodiment can be freely combined with any of the other embodiments.

(Embodiment 8)

In this embodiment, examples of CPUs including semiconductor devices such as the transistor of one embodiment of the present invention and the above-described memory device will be described.

For a semiconductor layer of the transistor, any one of the composite materials described in Embodiments 1 to 4 is used. With the composite material including the stack of the first region and the second region, the first region bends an energy band and carriers mainly flow in the second region; thus, high electrical characteristics (e.g., a high on-state current value or high field-effect mobility) are obtained, and high-speed switching can be realized. Since carriers more hardly flow in the first region of the composite material than the second region thereof, the transistor of one embodiment of the present invention is a normally-off transistor which is in a non-conduction state (also referred to as an off state) even when the gate voltage is 0V.

<Configuration of CPU>

Figure 21:
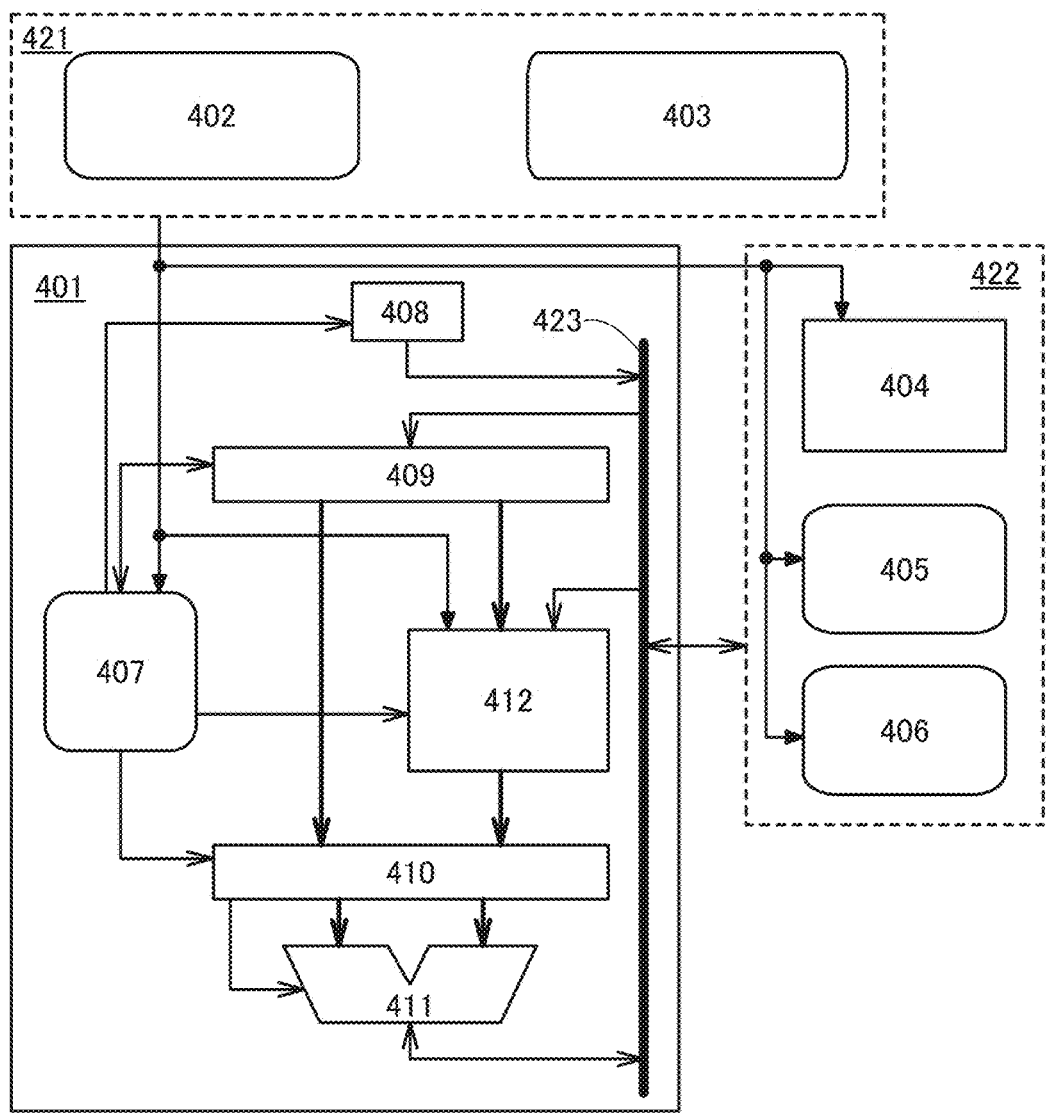
FIG. 21 is a block diagram illustrating a semiconductor device of one embodiment of the present invention.

A semiconductor device 400 shown in FIG. 21 includes a CPU core 401, a power management unit 421, and a peripheral circuit 422. The power management unit 421 includes a power controller 402 and a power switch 403. The peripheral circuit 422 includes a cache 404 including cache memory, a bus interface (BUS I/F) 405, and a debug interface (Debug I/F) 406. The CPU core 401 includes a data bus 423, a control unit 407, a program counter (PC) 408, a pipeline register 409, a pipeline register 410, an arithmetic logic unit (ALU) 411, and a register file 412. Data is transmitted between the CPU core 401 and the peripheral circuit 422 such as the cache 404 via the data bus 423.

The semiconductor device (cell) can be used for many logic circuits typified by the power controller 402 and the control unit 407, particularly to all logic circuits that can be constituted using standard cells. Accordingly, the semiconductor device 400 can be small. The semiconductor device 400 can have reduced power consumption. The semiconductor device 400 can have a higher operating speed. The semiconductor device 400 can have a smaller power supply voltage variation.

When p-channel Si transistors and the transistor described in any of Embodiments 1 to 4 which includes the composite material (a material having a structure in which a region with a small amount of gallium and a region with a large amount of gallium are stacked like a superlattice) in a channel formation region are used in the semiconductor device (cell) and the semiconductor device (cell) is used in the semiconductor device 400, the semiconductor device 400 can be small. The semiconductor device 400 can have reduced power consumption. The semiconductor device 400 can have a higher operating speed. Particularly when the Si transistors are only p-channel ones, the manufacturing cost can be reduced.

The control unit 407 has functions of totally controlling operations of the PC 408, the pipeline register 409, the pipeline register 410, the ALU 411, the register file 412, the cache 404, the bus interface 405, the debug interface 406, and the power controller 402 to decode and execute instructions contained in a program such as input applications.

The ALU 411 has a function of performing a variety of arithmetic operations such as four arithmetic operations and logic operations.

The cache 404 has a function of temporarily storing frequently-used data. The PC 408 is a register having a function of storing an address of an instruction to be executed next. Note that although not shown in FIG. 21, the cache 404 is provided with a cache controller for controlling the operation of the cache memory.

The pipeline register 409 has a function of temporarily storing instruction data.

The register file 412 includes a plurality of registers including a general purpose register and can store data that is read from the main memory, data obtained as a result of arithmetic operations in the ALU 411, or the like.

The pipeline register 410 has a function of temporarily storing data used for arithmetic operations of the ALU 411, data obtained as a result of arithmetic operations of the ALU 411, or the like.

The bus interface 405 has a function as a path for data between the semiconductor device 400 and various devices outside the semiconductor device 400. The debug interface 406 has a function as a path of a signal for inputting an instruction to control debugging to the semiconductor device 400.

The power switch 403 has a function of controlling supply of a power source voltage to various circuits included in the semiconductor device 400 other than the power controller 402. The above various circuits belong to several different power domains. The power switch 403 controls whether the power supply voltage is supplied to the various circuits in the same power domain. In addition, the power controller 402 has a function of controlling the operation of the power switch 403.

The semiconductor device 400 having the above structure is capable of performing power gating. A description will be given of an example of the power gating operation sequence.

First, by the CPU core 401, timing for stopping the supply of the power supply voltage is set in a register of the power controller 402. Then, an instruction of starting power gating is sent from the CPU core 401 to the power controller 402. Then, various registers and the cache 404 included in the semiconductor device 400 start data storing. Then, the power switch 403 stops the supply of a power supply voltage to the various circuits other than the power controller 402 included in the semiconductor device 400. Then, an interrupt signal is input to the power controller 402, whereby the supply of the power supply voltage to the various circuits included in the semiconductor device 400 is started. Note that a counter may be provided in the power controller 402 to be used to determine the timing of starting the supply of the power supply voltage regardless of input of an interrupt signal. Next, the various registers and the cache 404 start data recovery. Then, the instruction is resumed in the control unit 407.

Such power gating can be performed in the whole processor or one or a plurality of logic circuits forming the processor. Furthermore, power supply can be stopped even for a short time. Consequently, power consumption can be reduced finely in terms of a space or time.

In performing power gating, data held by the CPU core 401 or the peripheral circuit 422 is preferably restored in a short time. In that case, the power can be turned on or off in a short time, and an effect of saving power becomes significant.

In order that the data held by the CPU core 401 or the peripheral circuit 422 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and the SRAM cell which are capable of backup operation preferably include transistors including a composite material (the material having a structure in which a region with a small amount of gallium and a region with a large amount of gallium are stacked like a superlattice) in a channel formation region. Consequently, the transistor has a low off-state current; thus, the flip-flop circuit and the SRAM cell which are capable of backup operation can retain data for a long time without power supply. When the transistor has a high switching speed, the flip-flop circuit and the SRAM cell which are capable of backup operation can save and restore data in a short time in some cases.

Figure 22:
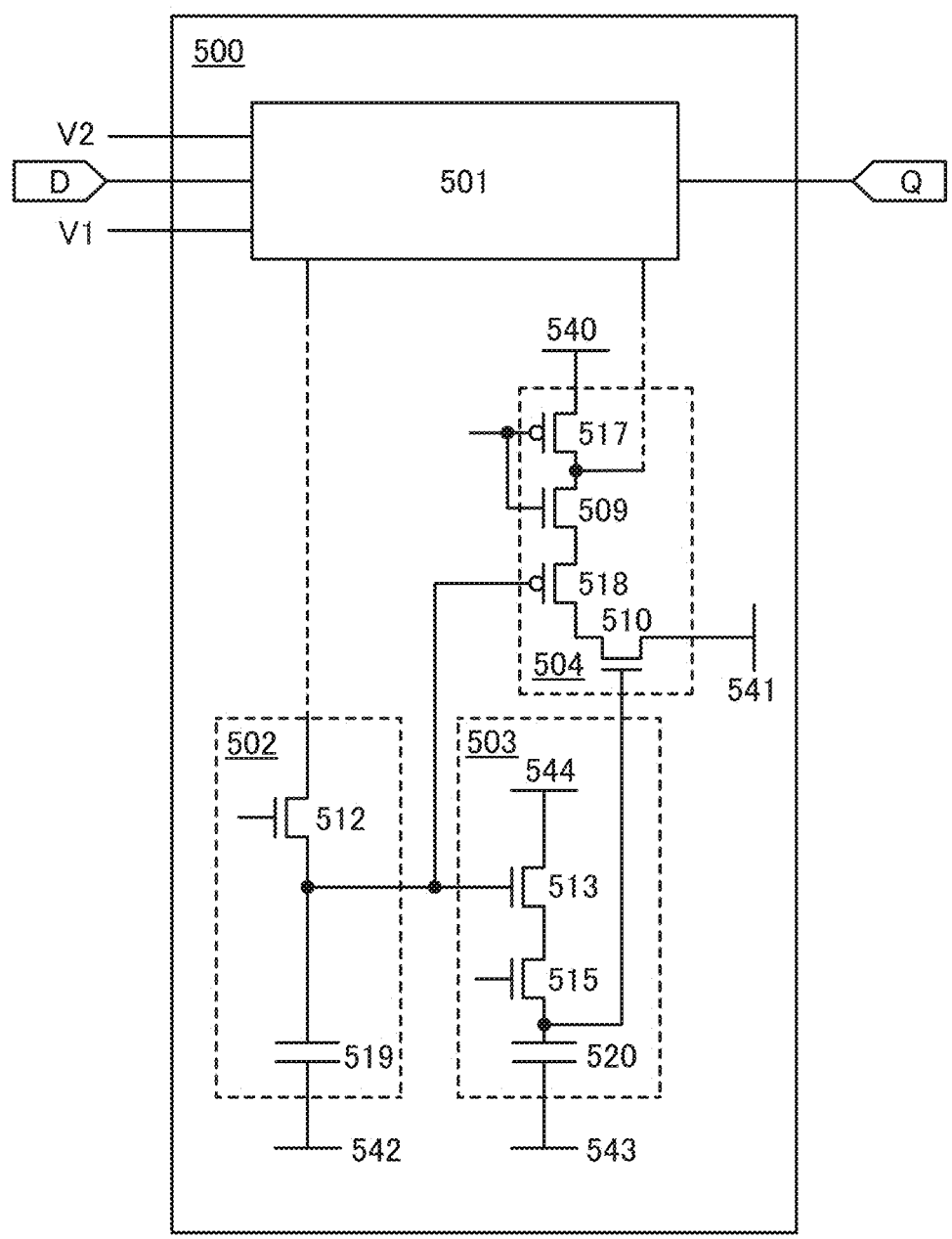
FIG. 22 is a circuit diagram illustrating a semiconductor device of one embodiment of the present invention.

An example of the flip-flop circuit capable of backup operation is described using FIG. 22.

A semiconductor device 500 shown in FIG. 22 is an example of the flip-flop circuit capable of backup operation. The semiconductor device 500 includes a first memory circuit 501, a second memory circuit 502, a third memory circuit 503, and a read circuit 504. As a power supply voltage, a potential difference between a potential V1 and a potential V2 is supplied to the semiconductor device 500. One of the potential V1 and the potential V2 is at a high level, and the other is at a low level. An example of the structure of the semiconductor device 500 when the potential V1 is at a low level and the potential V2 is at a high level will be described below.

The first memory circuit 501 has a function of retaining data when a signal D including the data is input in a period during which the power supply voltage is supplied to the semiconductor device 500. Furthermore, the first memory circuit 501 outputs a signal Q including the retained data in the period during which the power supply voltage is supplied to the semiconductor device 500. On the other hand, the first memory circuit 501 cannot retain data in a period during which the power supply voltage is not supplied to the semiconductor device 500. That is, the first memory circuit 501 can be referred to as a volatile memory circuit.

The second memory circuit 502 has a function of reading the data held in the first memory circuit 501 to store (or restore) it. The third memory circuit 503 has a function of reading the data held in the second memory circuit 502 to store (or restore) it. The read circuit 504 has a function of reading the data held in the second memory circuit 502 or the third memory circuit 503 to store (or return) it in (to) the first memory circuit 501.

In particular, the third memory circuit 503 has a function of reading the data held in the second memory circuit 502 to store (or restore) it even in the period during which the power supply voltage is not supplied to the semiconductor device 500.

As shown in FIG. 22, the second memory circuit 502 includes a transistor 512 and a capacitor 519. The third memory circuit 503 includes a transistor 513, a transistor 515, and a capacitor 520. The read circuit 504 includes a transistor 510, a transistor 518, a transistor 509, and a transistor 517.

The transistor 512 has a function of charging and discharging the capacitor 519 in accordance with data held in the first memory circuit 501. The transistor 512 is desirably capable of charging and discharging the capacitor 519 at a high speed in accordance with data held in the first memory circuit 501. Specifically, the transistor 512 desirably contains crystalline silicon (preferably polycrystalline silicon, further preferably single crystal silicon) in a channel formation region.

The conduction state or the non-conduction state of the transistor 513 is determined in accordance with the charge held in the capacitor 519. The transistor 515 has a function of charging and discharging the capacitor 520 in accordance with the potential of a wiring 544 when the transistor 513 is in a conduction state. It is desirable that the off-state current of the transistor 515 be extremely low. Specifically, the transistor 515 desirably contains a composite material (the material in which a region with a small amount of gallium and a region with a large amount of gallium are stacked like a superlattice) in a channel formation region.

Specific connection relations between the elements are described. One of a source and a drain of the transistor 512 is connected to the first memory circuit 501. The other of the source and the drain of the transistor 512 is connected to one electrode of the capacitor 519, a gate of the transistor 513, and a gate of the transistor 518. The other electrode of the capacitor 519 is connected to the wiring 542. One of a source and a drain of the transistor 513 is connected to the wiring 544. The other of the source and the drain of the transistor 513 is connected to one of a source and a drain of the transistor 515. The other of the source and the drain of the transistor 515 is connected to one electrode of the capacitor 520 and a gate of the transistor 510. The other electrode of the capacitor 520 is connected to the wiring 543. One of a source and a drain of the transistor 510 is connected to a wiring 541. The other of the source and the drain of the transistor 510 is connected to one of a source and a drain of the transistor 518. The other of the source and the drain of the transistor 518 is connected to one of a source and a drain of the transistor 509. The other of the source and the drain of the transistor 509 is connected to one of a source and a drain of the transistor 517 and the first memory circuit 501. The other of the source and the drain of the transistor 517 is connected to a wiring 540. Furthermore, although a gate of the transistor 509 is connected to a gate of the transistor 517 in FIG. 22, the gate of the transistor 509 is not necessarily connected to the gate of the transistor 517.

The transistor described in the above embodiment as an example can be applied to the transistor 515. Because of the low off-state current of the transistor 515, the semiconductor device 500 can retain data for a long time without power supply. The favorable switching characteristics of the transistor 515 allow the semiconductor device 500 to perform high-speed backup and recovery.

The structure described in this embodiment can be used in appropriate combination with the structure described in any of the other embodiments.

(Embodiment 9)

In this embodiment, an example of an imaging device including the transistor or the like of one embodiment of the present invention will be described.

<Imaging Device>

An imaging device of one embodiment of the present invention will be described below.

Figure 23A:
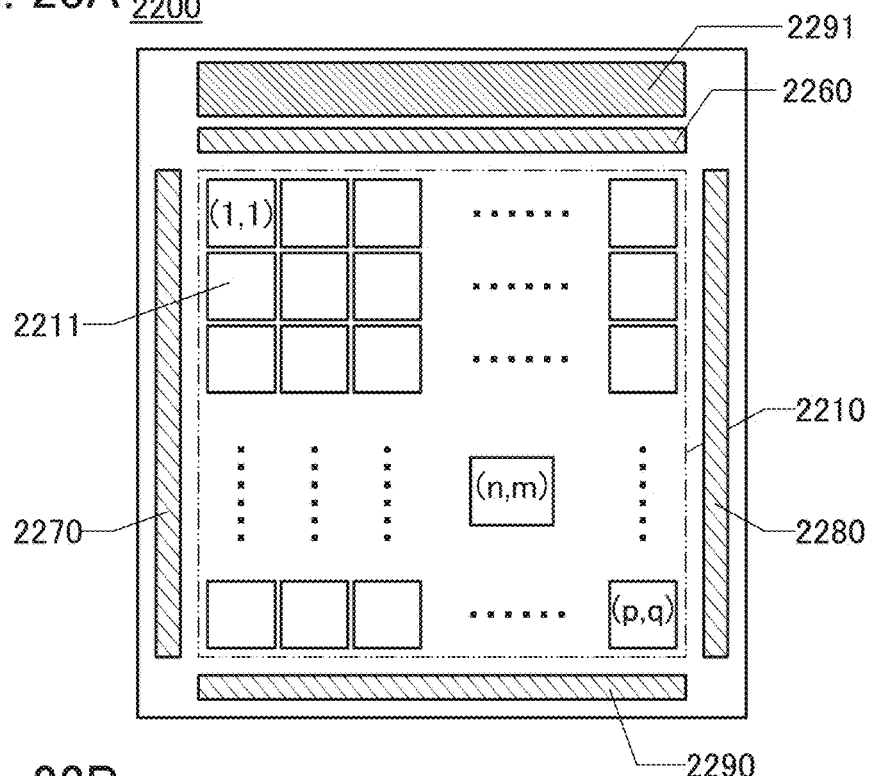
FIGS. 23A and 23B are top views each illustrating a semiconductor device of one embodiment of the present invention.

FIG. 23A is a plan view illustrating an example of an imaging device 2200 of one embodiment of the present invention. The imaging device 2200 includes a pixel portion 2210 and peripheral circuits for driving the pixel portion 2210 (a peripheral circuit 2260, a peripheral circuit 2270, a peripheral circuit 2280, and a peripheral circuit 2290). The pixel portion 2210 includes a plurality of pixels 2211 arranged in a matrix with p rows and q columns (p and q are each an integer of 2 or more). The peripheral circuit 2260, the peripheral circuit 2270, the peripheral circuit 2280, and the peripheral circuit 2290 are each connected to the plurality of pixels 2211, and a signal for driving the plurality of pixels 2211 is supplied. In this specification and the like, in some cases, a "peripheral circuit" or a "driver circuit" indicate all of the peripheral circuits 2260, 2270, 2280, and 2290. For example, the peripheral circuit 2260 can be regarded as part of the peripheral circuit.

The imaging device 2200 preferably includes a light source 2291. The light source 2291 can emit detection light P1.

The peripheral circuit includes at least one of a logic circuit, a switch, a buffer, an amplifier circuit, and a converter circuit. The peripheral circuit may be formed over a substrate where the pixel portion 2210 is formed. A semiconductor device such as an IC chip may be used as part or the whole of the peripheral circuit. Note that as the peripheral circuit, one or more of the peripheral circuits 2260, 2270, 2280, and 2290 may be omitted.

Figure 23B:
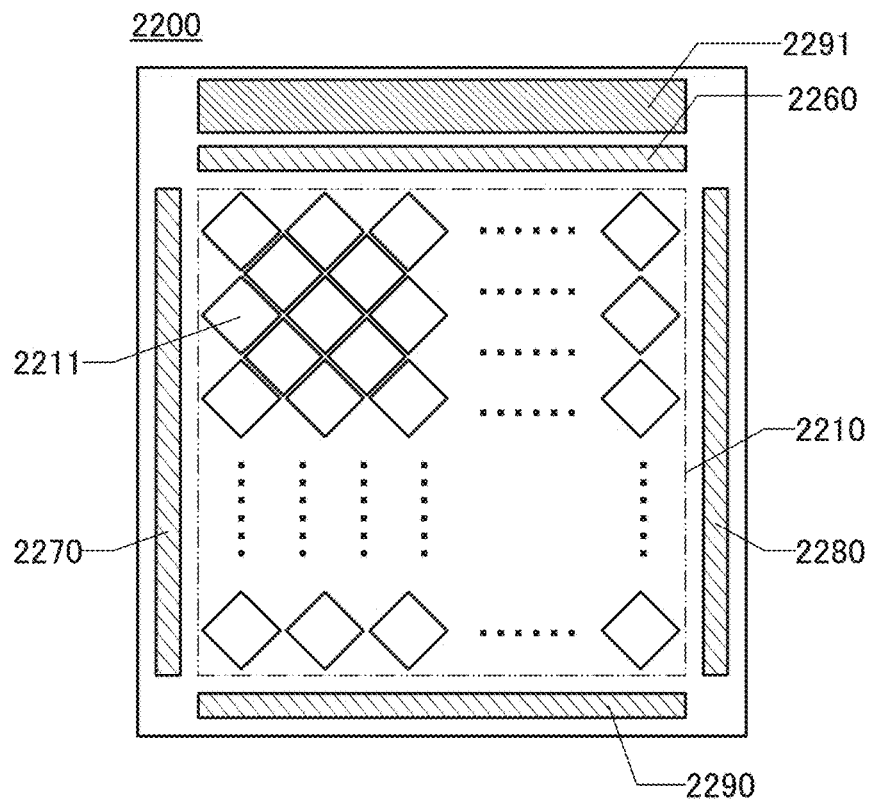

As illustrated in FIG. 23B, the pixels 2211 may be provided to be inclined in the pixel portion 2210 included in the imaging device 2200. When the pixels 2211 are obliquely arranged, the distance between pixels (pitch) can be shortened in the row direction and the column direction. Accordingly, the quality of an image taken with the imaging device 2200 can be improved.

Configuration Example 1 of Pixel

The pixel 2211 included in the imaging device 2200 is formed with a plurality of subpixels 2212, and each subpixel 2212 is combined with a filter (color filter) which transmits light in a specific wavelength band, whereby data for achieving color image display can be obtained.

Figure 24A:
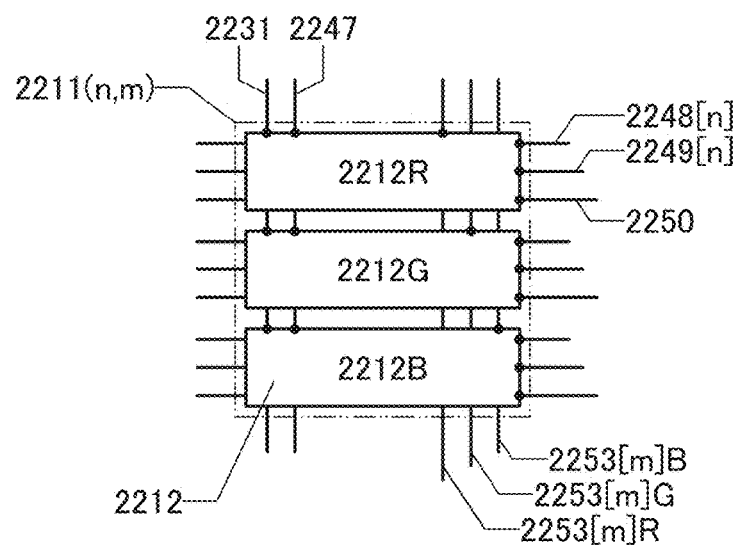
FIGS. 24A and 24B are block diagrams each illustrating a semiconductor device of one embodiment of the present invention.

FIG. 24A is a top view showing an example of the pixel 2211 with which a color image is obtained. The pixel 2211 illustrated in FIG. 24A includes a subpixel 2212 provided with a color filter that transmits light in a red (R) wavelength band (also referred to as a subpixel 2212R), a subpixel 2212 provided with a color filter that transmits light in a green (G) wavelength band (also referred to as a subpixel 2212G), and a subpixel 2212 provided with a color filter that transmits light in a blue (B) wavelength band (also referred to as a subpixel 2212B). The subpixel 2212 can function as a photosensor.

The subpixel 2212 (the subpixel 2212R, the subpixel 2212G, and the subpixel 2212B) is electrically connected to a wiring 2231, a wiring 2247, a wiring 2248, a wiring 2249, and a wiring 2250. In addition, the subpixel 2212R, the subpixel 2212G, and the subpixel 2212B are connected to respective wirings 2253 which are independently provided.

In this specification and the like, for example, the wiring 2248 and the wiring 2249 that are connected to the pixel 2211 in the n-th row are referred to as a wiring 2248[n] and a wiring 2249[n]. For example, the wiring 2253 connected to the pixel 2211 in the m-th column is referred to as a wiring 2253[m]. Note that in FIG. 24A, the wirings 2253 connected to the subpixel 2212R, the subpixel 2212G, and the subpixel 2212B in the pixel 2211 in the m-th column are referred to as a wiring 2253[m]R, a wiring 2253[m]G, and a wiring 2253[m]B. The subpixels 2212 are electrically connected to the peripheral circuit through the above wirings.

Figure 24B:
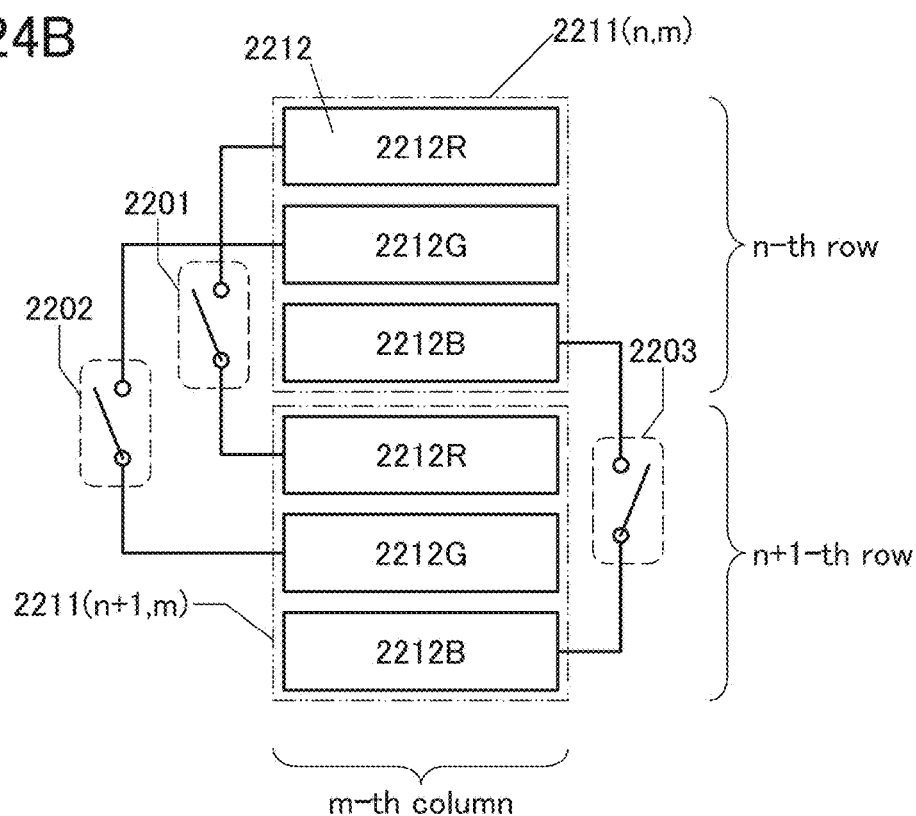

The imaging device 2200 has a structure in which the subpixel 2212 is electrically connected to the subpixel 2212 in an adjacent pixel 2211 which is provided with a color filter transmitting light in the same wavelength band as the subpixel 2212, via a switch. FIG. 24B shows a connection example of the subpixels 2212: the subpixel 2212 in the pixel 2211 arranged in the n-th (n is an integer greater than or equal to 1 and less than or equal to p) row and the m-th (m is an integer greater than or equal to 1 and less than or equal to q) column and the subpixel 2212 in the adjacent pixel 2211 arranged in an (n+1)-th row and the m-th column. In FIG. 24B, the subpixel 2212R arranged in the n-th row and the m-th column and the subpixel 2212R arranged in the (n+1)-th row and the m-th column are connected to each other via a switch 2201. The subpixel 2212G arranged in the n-th row and the m-th column and the subpixel 2212G arranged in the (n+1)-th row and the m-th column are connected to each other via a switch 2202. The subpixel 2212B arranged in the n-th row and the m-th column and the subpixel 2212B arranged in the (n+1)-th row and the m-th column are connected to each other via a switch 2203.

The color filter used in the subpixel 2212 is not limited to red (R), green (G), and blue (B) color filters, and color filters that transmit light of cyan (C), yellow (Y), and magenta (M) may be used. By provision of the subpixels 2212 that sense light in three different wavelength bands in one pixel 2211, a full-color image can be obtained.

The pixel 2211 including the subpixel 2212 provided with a color filter transmitting yellow (Y) light may be provided, in addition to the subpixels 2212 provided with the color filters transmitting red (R), green (G), and blue (B) light. The pixel 2211 including the subpixel 2212 provided with a color filter transmitting blue (B) light may be provided, in addition to the subpixels 2212 provided with the color filters transmitting cyan (C), yellow (Y), and magenta (M) light. When the subpixels 2212 sensing light in four different wavelength bands are provided in one pixel 2211, the reproducibility of colors of an obtained image can be increased.

For example, in FIG. 24A, in regard to the subpixel 2212 sensing light in a red wavelength band, the subpixel 2212 sensing light in a green wavelength band, and the subpixel 2212 sensing light in a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 2212 provided in the pixel 2211 may be one, two or more subpixels are preferably provided. For example, when two or more subpixels 2212 sensing light in the same wavelength band are provided, the redundancy is increased, and the reliability of the imaging device 2200 can be increased.

When an infrared (IR) filter that transmits infrared light and absorbs or reflects visible light is used as the filter, the imaging device 2200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 2211 may be provided with a lens. An arrangement example of the pixel 2211, a filter 2254, and a lens 2255 is described with reference to cross-sectional views in FIGS. 25A and 25B. With the lens 2255, the photoelectric conversion element can receive incident light efficiently. Specifically, as illustrated in FIG. 25A, light 2256 enters a photoelectric conversion element 2220 through the lens 2255, the filter 2254 (a filter 2254R, a filter 2254G, and a filter 2254B), a pixel circuit 2230, and the like which are provided in the pixel 2211.

As indicated by a region surrounded with dashed dotted lines, however, part of the light 2256 indicated by arrows might be blocked by some wirings 2257. Thus, a preferable structure is such that the lens 2255 and the filter 2254 are provided on the photoelectric conversion element 2220 side as illustrated in FIG. 25B, whereby the photoelectric conversion element 2220 can efficiently receive the light 2256. When the light 2256 enters the photoelectric conversion element 2220 from the photoelectric conversion element 2220 side, the imaging device 2200 with high sensitivity can be provided.

Figure 25A:
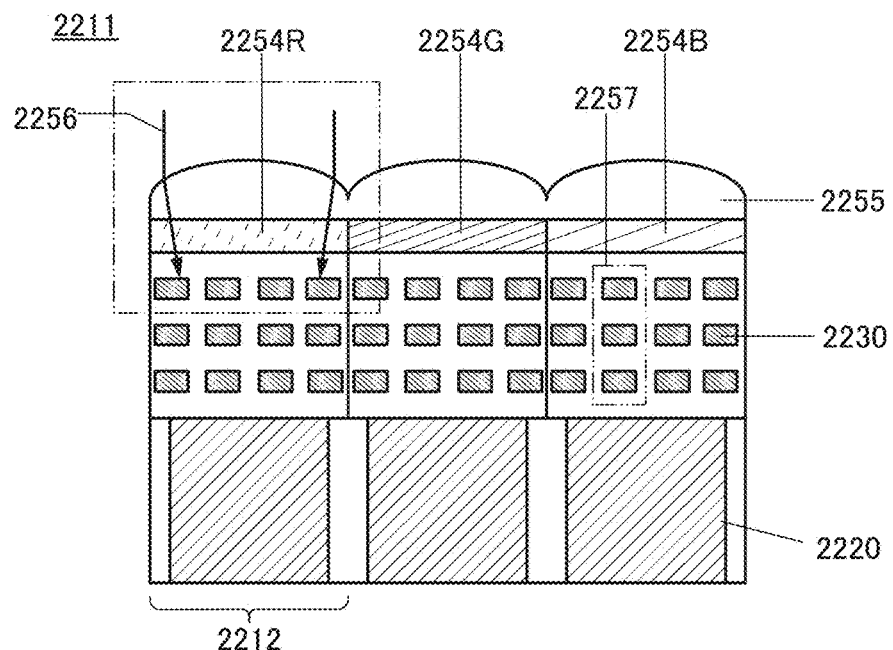
FIGS. 25A and 25B are cross-sectional views each illustrating a semiconductor device of one embodiment of the present invention.
Figure 25B:
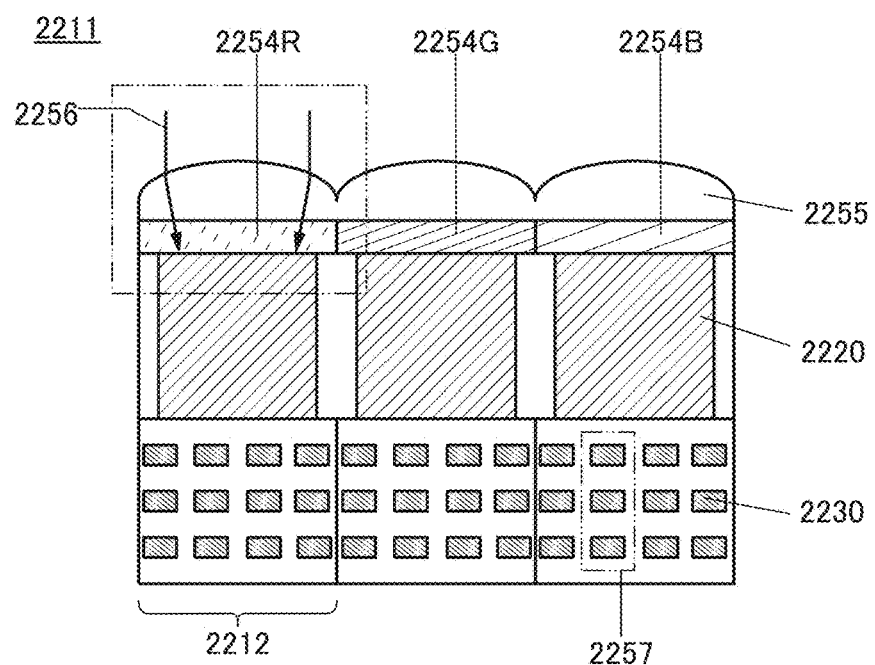

As the photoelectric conversion element 2220 illustrated in FIGS. 25A and 25B, a photoelectric conversion element in which a p-n junction or a p-i-n junction is formed may be used.

The photoelectric conversion element 2220 may be formed using a substance that has a function of absorbing a radiation and generating charges. Examples of the substance that has a function of absorbing a radiation and generating charges include selenium, lead iodide, mercury iodide, gallium arsenide, cadmium telluride, and cadmium zinc alloy.

For example, when selenium is used for the photoelectric conversion element 2220, the photoelectric conversion element 2220 can have a light absorption coefficient in a wide wavelength band, such as visible light, ultraviolet light, infrared light, X-rays, and gamma rays.

One pixel 2211 included in the imaging device 2200 may include the subpixel 2212 with a first filter in addition to the subpixel 2212 illustrated in FIGS. 24A and 24B.

Configuration Example 2 of Pixel

An example of a pixel including a transistor including silicon and a transistor including a composite material (a material in which a region with a small amount of gallium and a region with a large amount of gallium are stacked like a superlattice) is described below. A transistor similar to any of the transistors described in the above embodiments can be used as each of the transistors.

Figure 26:
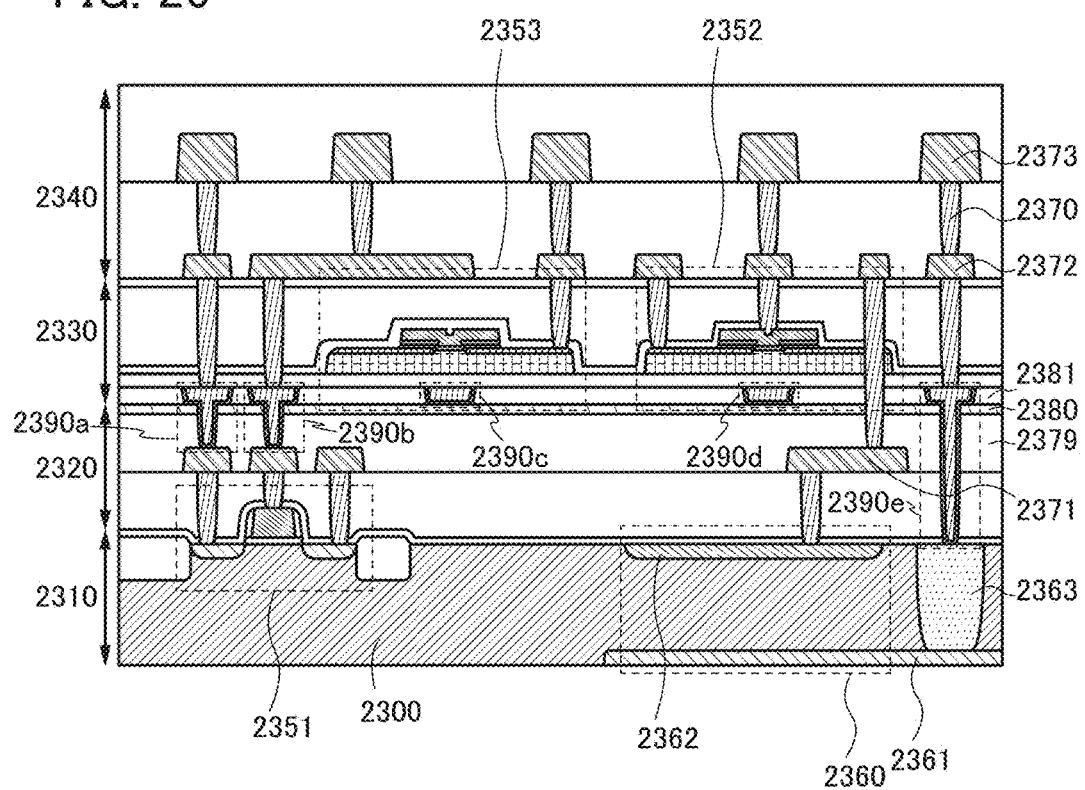
FIG. 26 is a cross-sectional view illustrating a semiconductor device of one embodiment of the present invention.

FIG. 26 is a cross-sectional view of an element included in an imaging device. The imaging device illustrated in FIG. 26 includes a transistor 2351 including silicon over a silicon substrate 2300, transistors 2352 and 2353 which include a composite material and are stacked over the transistor 2351, and a photodiode 2360 provided in the silicon substrate 2300. The transistors and the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes a wiring 2372 and a wiring 2373.

In the example of the cross-sectional view in FIG. 26, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including a composite material, the layer 2310 may include the transistor including a composite material. Alternatively, the layer 2310 may be omitted, and the pixel may include only transistors including a composite material.

Note that the silicon substrate 2300 may be an SOI substrate. Furthermore, the silicon substrate 2300 can be replaced with a substrate made of germanium, silicon germanium, silicon carbide, gallium arsenide, aluminum gallium arsenide, indium phosphide, gallium nitride, or an organic semiconductor.

Here, an insulator 2380 is provided between the layer 2310 including the transistor 2351 and the photodiode 2360 and the layer 2330 including the transistors 2352 and 2353. However, there is no limitation on the position of the insulator 2380. An insulator 2379 is provided under the insulator 2380, and an insulator 2381 is provided over the insulator 2380.

Conductors 2390a to 2390e are provided in openings formed in the insulators 2379 and 2381. The conductors 2390a, 2390b, and 2390e function as plugs and wirings. The conductor 2390c functions as a back gate of the transistor 2353. The conductor 2390d functions as a back gate of the transistor 2352.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the composite material. Thus, the hydrogen may cause a reduction of the reliability of the transistor 2352, the transistor 2353, and the like. For this reason, in the case where the transistor including a composite material is provided over the transistor including a silicon-based semiconductor, it is preferable that the insulator 2380 having a function of blocking hydrogen be provided between the transistors. When hydrogen is confined in layers below the insulator 2380, the reliability of the transistor 2351 can be improved. In addition, hydrogen can be prevented from diffusing from the layers below the insulator 2380 into layers above the insulator 2380; thus, the reliability of the transistor 2352, the transistor 2353, and the like can be increased. The conductors 2390a, 2390b, and 2390e can prevent hydrogen from diffusing into the layers provided thereover through the via holes formed in the insulator 2380, resulting in improvement in the reliability of the transistors 2352 and 2353 and the like.

In the cross-sectional view in FIG. 26, the photodiode 2360 in the layer 2310 and the transistor in the layer 2330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of lens and the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structure described in this embodiment can be used in appropriate combination with the structure described in any of the other embodiments.

(Embodiment 10)

In this embodiment, a semiconductor wafer, a chip, and an electronic component of one embodiment of the present invention will be described.

<Semiconductor Wafer and Chip>

Figure 27A:
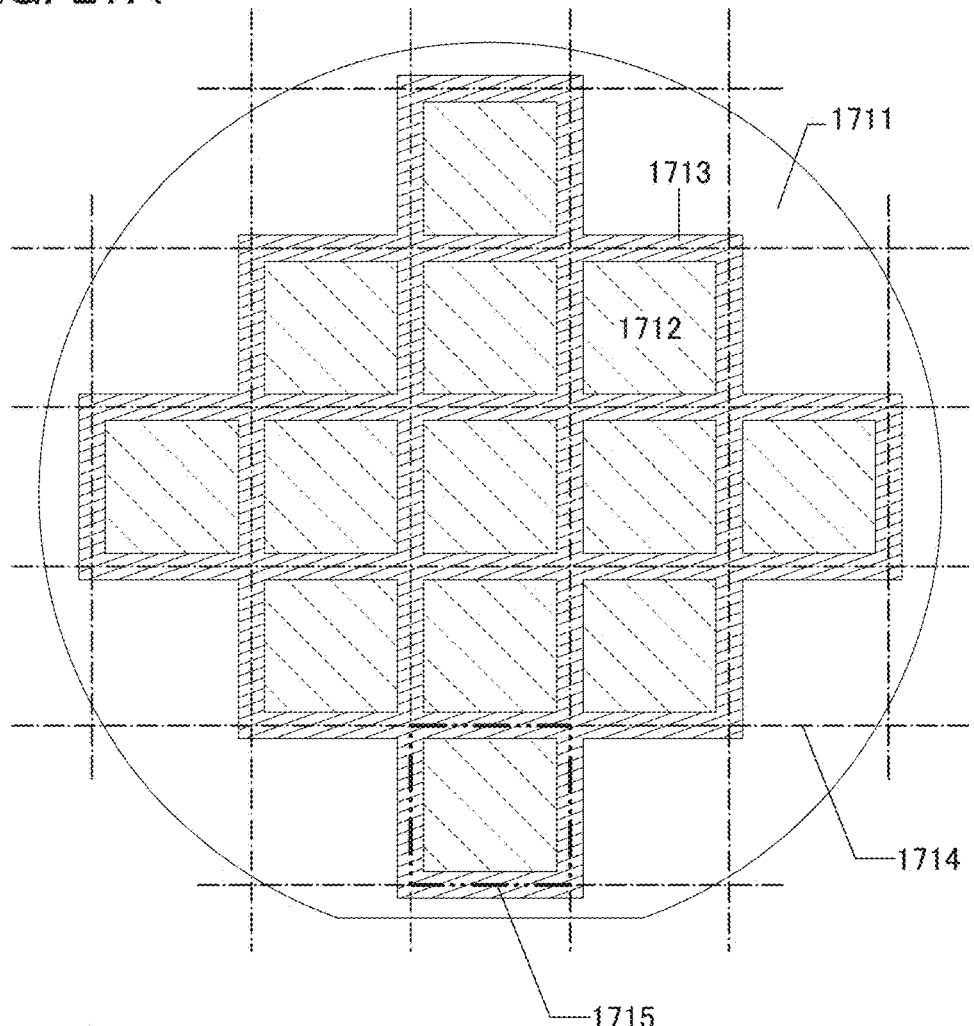
FIGS. 27A and 27B are top views illustrating a semiconductor device of one embodiment of the present invention.

FIG. 27A is a top view illustrating a substrate 1711 before dicing treatment. As the substrate 1711, a semiconductor substrate (also referred to as a "semiconductor wafer") can be used, for example. A plurality of circuit regions 1712 are provided over the substrate 1711. The semiconductor device according to one embodiment of the present invention, a CPU, an RF tag, an image sensor, or the like can be provided in the circuit region 1712.

Figure 27B:
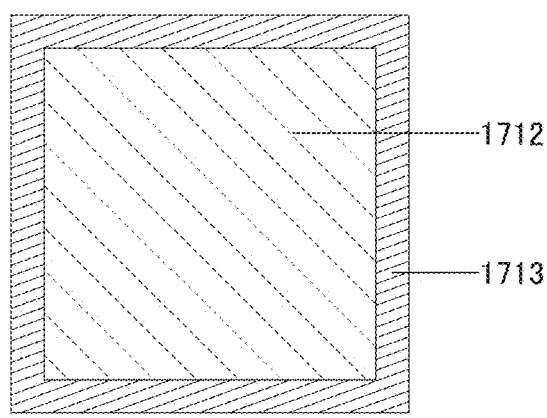

The plurality of circuit regions 1712 are each surrounded by a separation region 1713. Separation lines (also referred to as "dicing lines") 1714 are set at a position overlapping with the separation regions 1713. The substrate 1711 can be cut along the separation lines 1714 into chips 1715 including the circuit regions 1712. FIG. 27B is an enlarged view of the chip 1715.

A conductive layer or a semiconductor layer may be provided in the separation regions 1713. Providing a conductive layer or a semiconductor layer in the separation regions 1713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 1713 allows a reduction in the usage of the pure water. Therefore, the cost of manufacturing semiconductor devices can be reduced. Thus, semiconductor devices can be manufactured with improved productivity.

For a semiconductor layer provided in the separation regions 1713, a material having a bandgap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 28A:
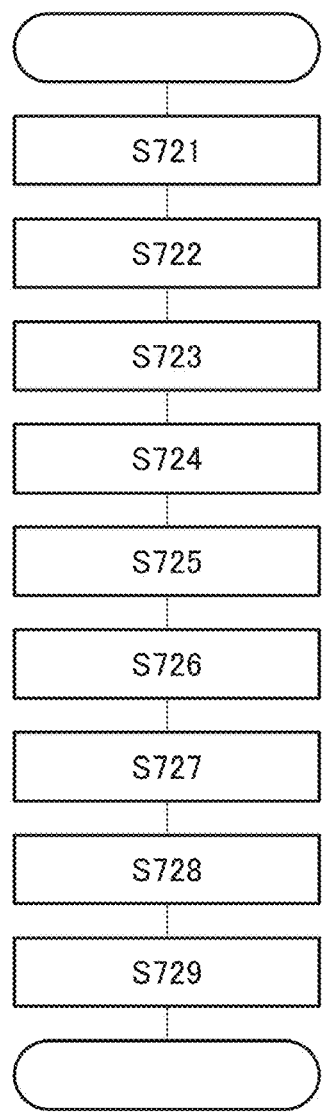
FIGS. 28A and 28B are a flowchart and a perspective view of a semiconductor device illustrating one embodiment of the present invention.
Figure 28B:
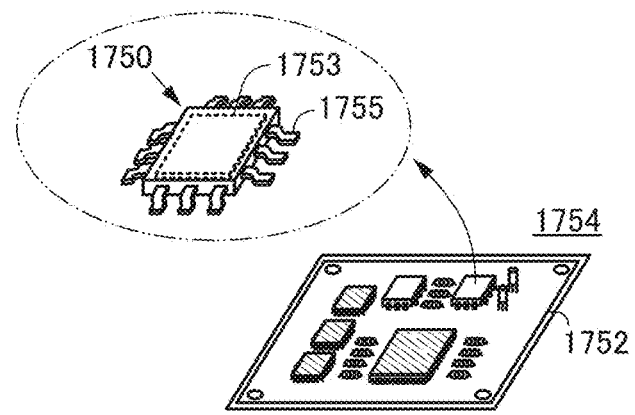

FIGS. 28A and 28B show an example where the chip 1715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in any of the above embodiments is combined with components other than the semiconductor device in an assembly process (post-process).

The post-process will be described with reference to a flowchart in FIG. 28A. After an element substrate including the semiconductor device described in any of the above embodiments is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 1715) in a dicing step (Step S722). Then, the separated chips are individually picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S724). As the metal wire, a silver wire or a gold wire can be used. Ball bonding or wedge bonding can be used as the wire bonding.

The wire-bonded chip is subjected to a molding step of sealing the chip with an epoxy resin or the like (Step S725). Through the molding step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

FIG. 28B is a perspective schematic diagram of a completed electronic component. FIG. 28B is a perspective schematic diagram illustrating a quad flat package (QFP) as an example of the electronic component. An electronic component 1750 in FIG. 28B includes a lead 1755 and a semiconductor device 1753. As the semiconductor device 1753, the semiconductor device described in any of the above embodiments can be used.

The electronic component 1750 in FIG. 28B is mounted on a printed circuit board 1752, for example. A plurality of electronic components 1750 are combined and electrically connected to each other over the printed circuit board 1752; thus, a substrate on which the electronic components are mounted (a circuit board 1754) is completed. The completed circuit board 1754 is provided in an electronic device or the like.

The structure described in this embodiment can be used in appropriate combination with the structure described in any of the other embodiments.

(Embodiment 11)

In this embodiment, an example of a display device that includes the transistor described in Embodiment 5 will be described below with reference to FIG. 29, FIG. 30, FIG. 31, and FIG. 32.

Figure 29:
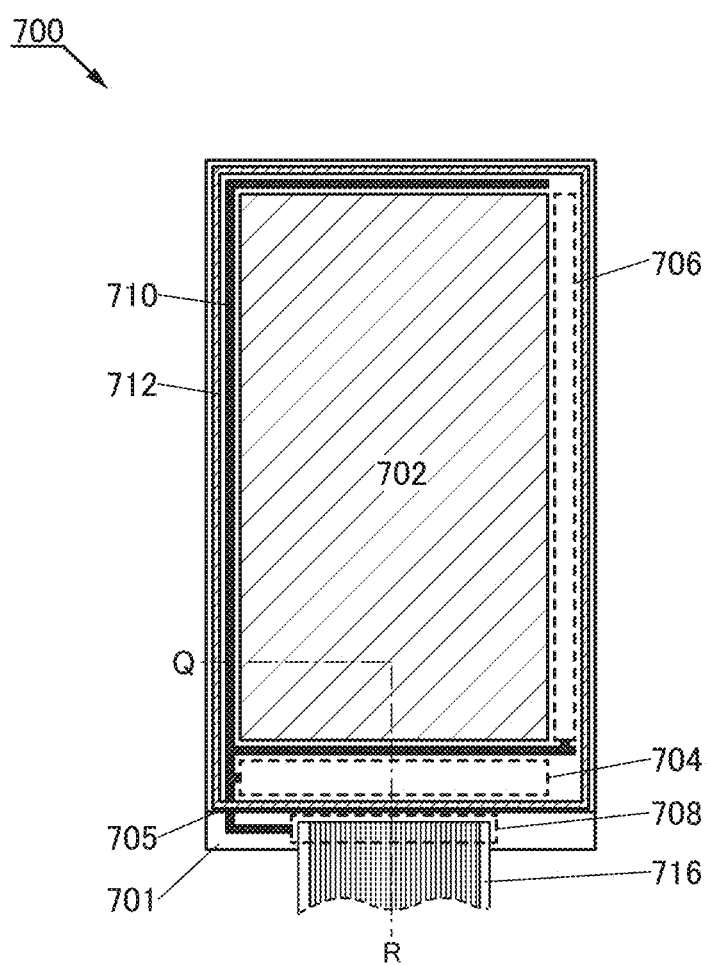
FIG. 29 is a top view illustrating one embodiment of a display device.

FIG. 29 is a top view illustrating an example of a display device. A display device 700 illustrated in FIG. 29 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 29, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include any of a variety of elements. As examples of the elements, electroluminescent (EL) element (e.g., an EL element containing organic and inorganic materials, an organic EL element, an inorganic EL element, or an LED), a light-emitting transistor element (a transistor which emits light depending on current), an electron emitter, a liquid crystal element, an electronic ink display, an electrophoretic element, an electrowetting element, a plasma display panel (PDP), a micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Display devices having electronic ink or electrophoretic elements include electronic paper and the like. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used to obtain a full-color display device in which white light (W) is used for a backlight (e.g., an organic EL element, an inorganic EL element, an LED, or a fluorescent lamp). As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 30:
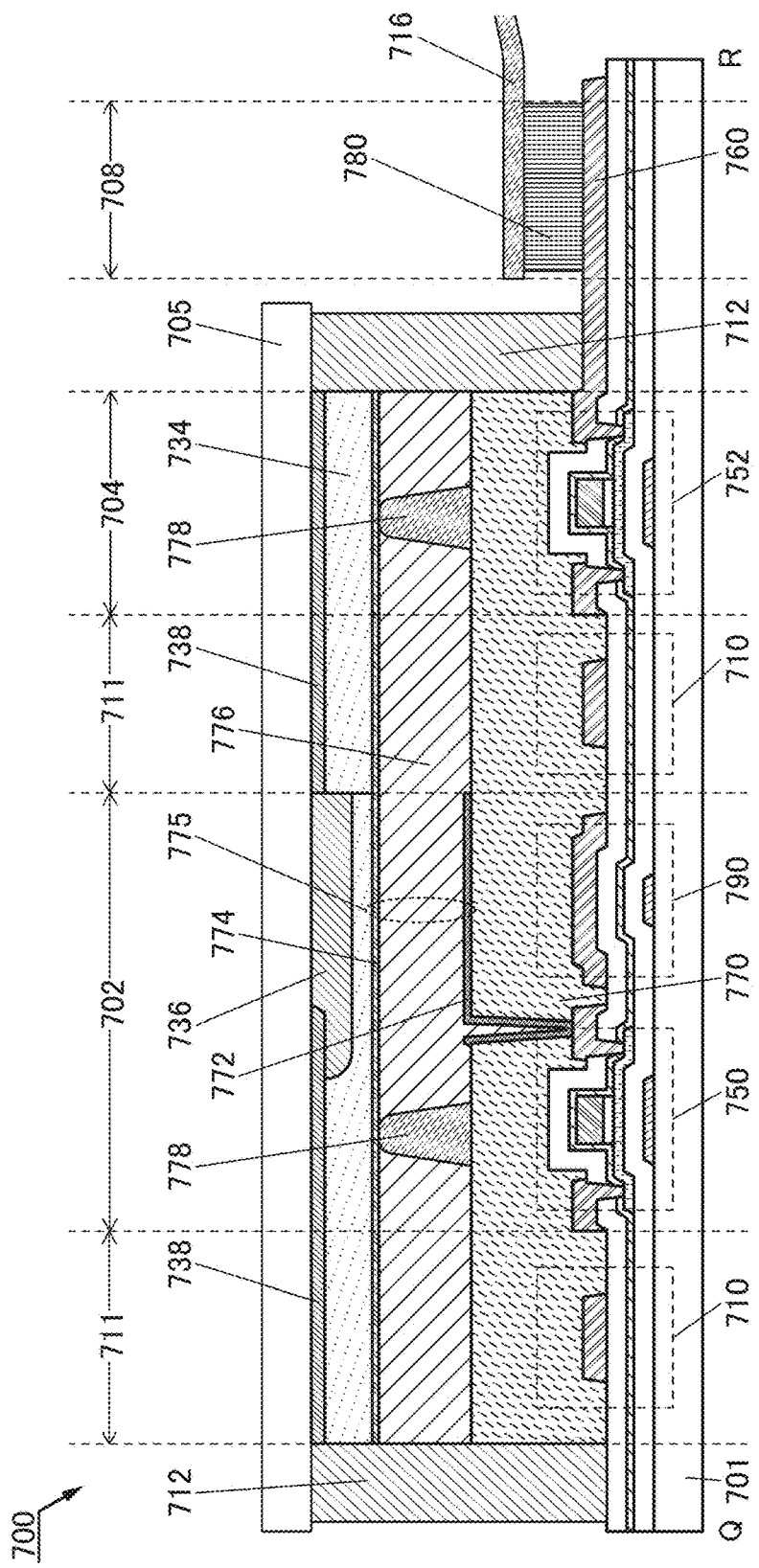
FIG. 30 is a cross-sectional view illustrating one embodiment of a display device.
Figure 31:
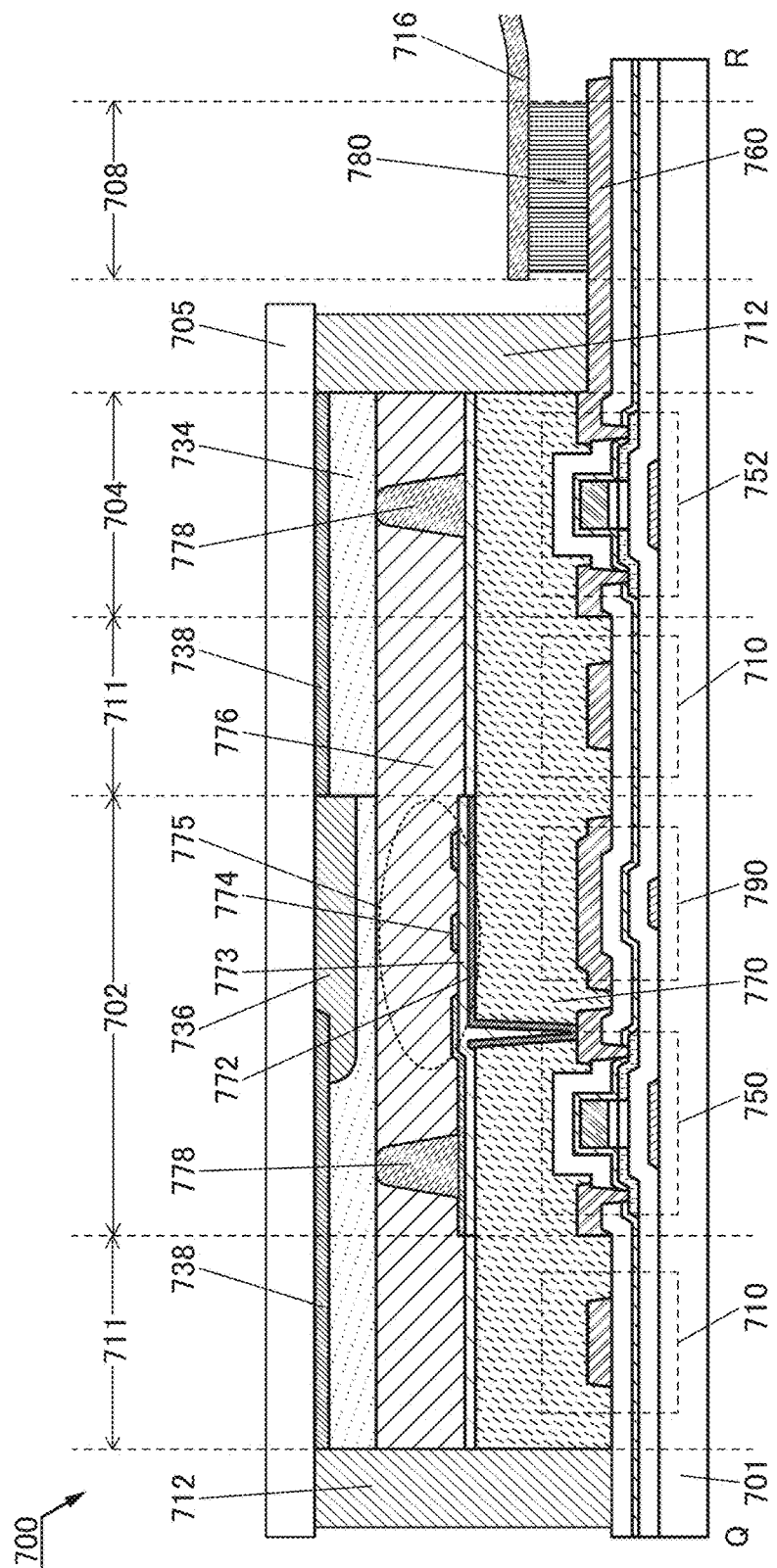
FIG. 31 is a cross-sectional view illustrating one embodiment of a display device.
Figure 32:
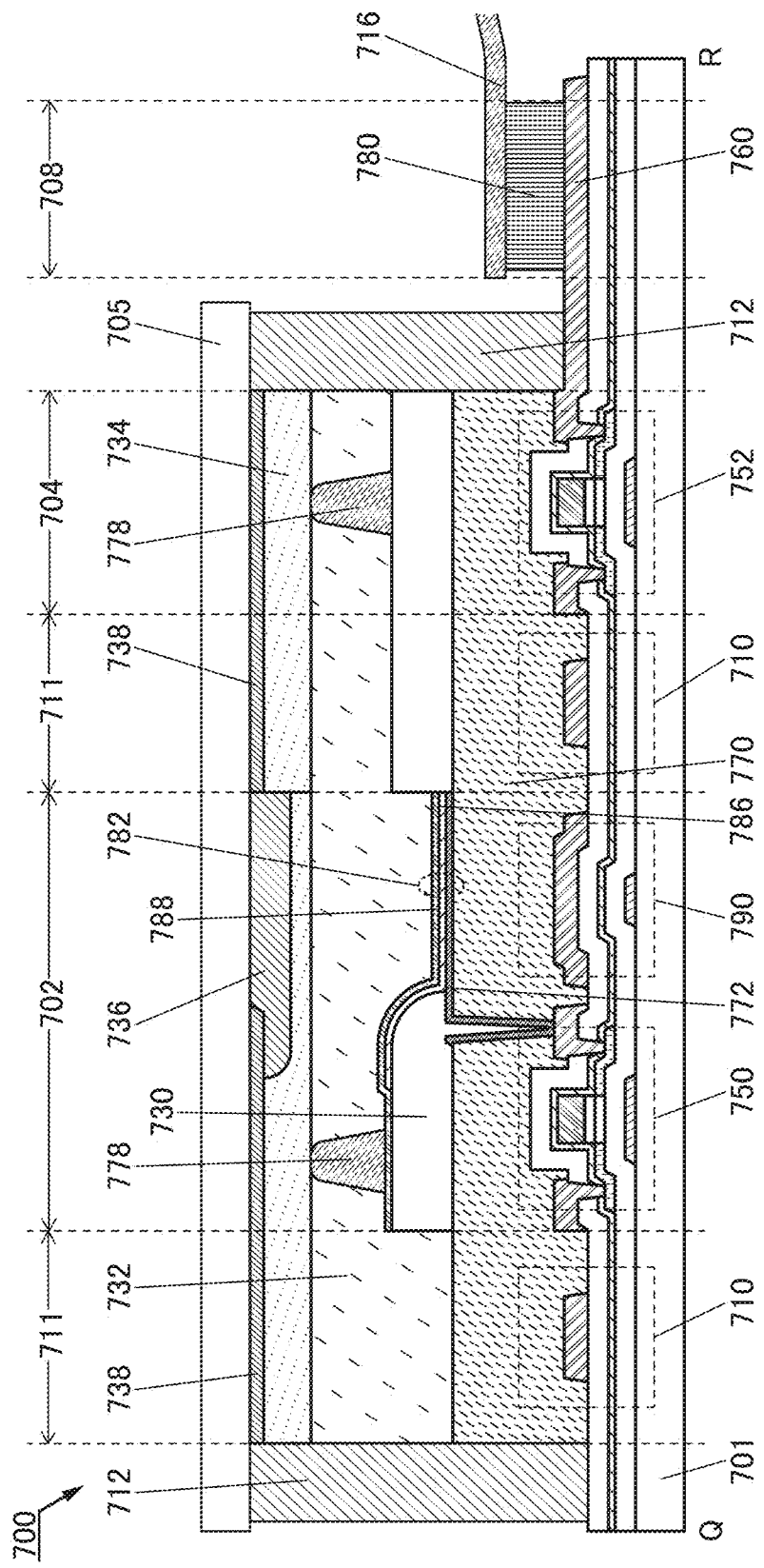
FIG. 32 is a cross-sectional view illustrating one embodiment of a display device.

In this embodiment, a structure including a liquid crystal element and an EL element as display elements is described with reference to FIG. 30, FIG. 31, and FIG. 32. Note that FIG. 30 and FIG. 31 are each a cross-sectional view taken along dashed-dotted line Q-R shown in FIG. 29 and show a structure including a liquid crystal element as a display element. FIG. 32 is a cross-sectional view taken along dashed-dotted line Q-R in FIG. 29 and illustrates the structure including an EL element as a display element.

Portions common to FIG. 30, FIG. 31, and FIG. 32 are described first, and then different portions are described.

[Common Portions in Display Devices]

The display device 700 illustrated in FIG. 30, FIG. 31, and FIG. 32 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 800A described above. Note that the transistor 750 and the transistor 752 may each have the structure of any of the other transistors described in the above embodiments.

The transistors used in this embodiment each include the composite material described in any one of Embodiments 1 to 4. The transistor can have low off-state current. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor including the composite material in the semiconductor layer, which is used in this embodiment, can have relatively high field-effect mobility and thus is capable of high-speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a lower electrode that is formed through a step of processing the same conductive film as a conductive film functioning as a first gate electrode of the transistor 750 and an upper electrode that is formed through a step of processing the same conductive film as a conductive film functioning as a source electrode or a drain electrode of the transistor 750. Furthermore, between the lower electrode and the upper electrode, an insulating film that is formed through a step of forming the same insulating film as an insulating film functioning as a first gate insulating film of the transistor 750 and an insulating film that is formed through a step of forming the same insulating film as an insulating film functioning as a protective insulating film of the transistor 750 are provided. That is, the capacitor 790 has a stacked-layer structure in which the insulating films functioning as a dielectric film are positioned between a pair of electrodes.

In FIG. 30, FIG. 31, and FIG. 32, a planarization insulating film 770 is provided over the transistor 750, the transistor 752, and the capacitor 790.

Although FIG. 30, FIG. 31, and FIG. 32 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion".

The signal line 710 is formed through the same process as the conductive films functioning as source electrodes and drain electrodes of the transistors 750 and 752. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

[Structure Example of Display Device Using Liquid Crystal Element]

The display device 700 illustrated in FIG. 30 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 illustrated in FIG. 30 can display an image in such a manner that transmission or non-transmission of light is controlled by the alignment state in the liquid crystal layer 776 which is changed depending on the voltage applied to the conductive film 772 and the conductive film 774.

The conductive film 772 is electrically connected to the conductive film that functions as a source electrode and a drain electrode included in the transistor 750. The conductive film 772 is formed over the planarization insulating film 770 to function as a pixel electrode, i.e., one electrode of the display element.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light.

In the case where a conductive film that reflects visible light is used as the conductive film 772, the display device 700 becomes a reflective-type liquid crystal display device. In the case where a conductive film that transmits visible light is used as the conductive film 772, the display device 700 becomes a transmissive liquid crystal display device.

When a structure over the conductive film 772 is changed, a driving method of the liquid crystal element can be changed. An example of this case is illustrated in FIG. 31. The display device 700 illustrated in FIG. 31 is an example of employing a transverse electric field mode (e.g., an FFS mode) as a driving mode of the liquid crystal element. In the structure illustrated in FIG. 31, an insulating film 773 is provided over the conductive film 772 and the conductive film 774 is provided over the insulating film 773. In such a structure, the conductive film 774 functions as a common electrode, and an electric field generated between the conductive film 772 and the conductive film 774 through the insulating film 773 can control the alignment state of the liquid crystal layer 776.

Although not illustrated in FIG. 30 and FIG. 31, the conductive film 772 and/or the conductive film 774 may be provided with an alignment film on a side in contact with the liquid crystal layer 776. Although not illustrated in FIG. 30 and FIG. 31, an optical member (optical substrate) or the like, such as a polarizing member, a retardation member, or an anti-reflection member, may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Moreover, the liquid crystal material which exhibits a blue phase has a small viewing angle dependence.

In the case where a liquid crystal element is used as the display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, or an advanced super view (ASV) mode can be employed.

[Display Device Including Light-emitting Element]

The display device 700 illustrated in FIG. 32 includes a light-emitting element 782. The light-emitting element 782 includes the conductive film 772, an EL layer 786, and a conductive film 788. The display device 700 shown in FIG. 32 is capable of displaying an image by light emission from the EL layer 786 included in the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. The quantum dot containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharging method (also referred to as an ink-jet method), a coating method, or a gravure printing method. A low molecular material, a middle molecular material (including an oligomer and a dendrimer), or a high molecular material may be included in the EL layer 786.

In the display device 700 in FIG. 32, an insulating film 730 is provided over the planarization insulating film 770 and the conductive film 772. The insulating film 730 covers part of the conductive film 772. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 772 side, or a dual-emission structure in which light is emitted to both the conductive film 772 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 32, the structure is not limited thereto. In the case where the EL layer 786 is formed by a separate coloring method, the coloring film 736 is not necessarily provided.

At least part of this embodiment can be implemented in combination with any of the other embodiments described in this specification as appropriate.

(Embodiment 12)

In this embodiment, electronic devices including the transistor or the like of one embodiment of the present invention will be described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio units and digital audio players), copiers, facsimiles, printers, multifunction printers, automated teller machines (ATM), and vending machines. FIGS. 33A to 33F illustrate specific examples of these electronic devices.

Figure 33A:
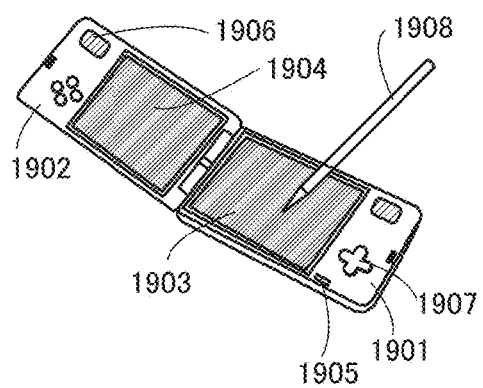
FIGS. 33A to 33F are perspective views each illustrating an electronic device of one embodiment of the present invention.

FIG. 33A illustrates a portable game machine including a housing 1901, a housing 1902, a display portion 1903, a display portion 1904, a microphone 1905, a speaker 1906, an operation key 1907, a stylus 1908, and the like. Although the portable game machine in FIG. 33A has the two display portions 1903 and 1904, the number of display portions included in a portable game machine is not limited to this. Integrated circuits such as a sensor and a CPU are provided in the housing 1901 or the housing 1902. When the composite material described in any one of Embodiments 1 to 4 is used for a semiconductor element such as a sensor or a CPU, a device having high electrical characteristics (e.g., high on-state current) and high reliability can be provided.

For semiconductor elements used in pixels and driver circuits thereof which are used in the display portion 1903 and the display portion 1904, the composite material described in any one of Embodiments 1 to 4 can be used. Consequently, a display portion with low power consumption can be provided.

Figure 33B:
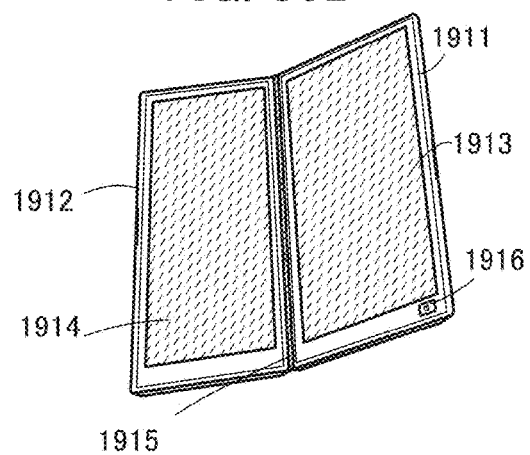

FIG. 33B illustrates a portable data terminal including a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. An image on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by provision of a touch panel in a display device. Alternatively, the position input function can be added by provision of a photoelectric conversion element called a photosensor in a pixel portion of a display device. Integrated circuits such as a sensor and a CPU are provided in the housing 1911 or the housing 1912. When the composite material described in any one of Embodiments 1 to 4 is used for a semiconductor element such as a sensor or a CPU, a device having high electrical characteristics (e.g., high on-state current) and high reliability can be provided.

For semiconductor elements used in pixels and driver circuits thereof which are used in the display portion 1913 and the display portion 1914, the composite material described in any one of Embodiments 1 to 4 can be used. Consequently, a display portion with low power consumption can be provided.

Figure 33C:
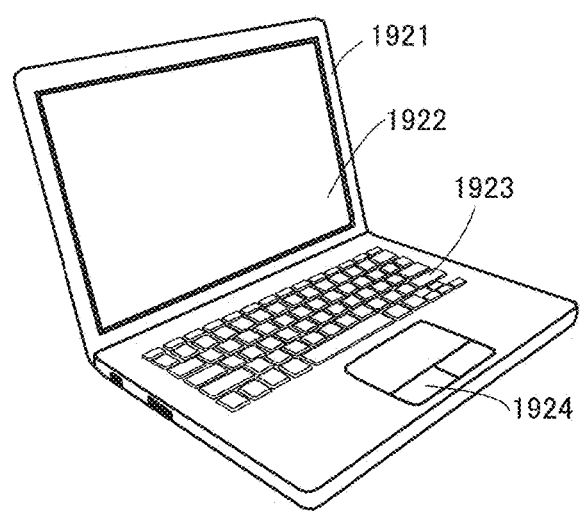

FIG. 33C illustrates a laptop personal computer including a housing 1921, a display portion 1922, a keyboard 1923, a pointing device 1924, and the like. Integrated circuits such as a sensor and a CPU are provided in the housing 1921. When the composite material described in any one of Embodiments 1 to 4 is used for a semiconductor element such as a sensor or a CPU, a device having high electrical characteristics (e.g., high on-state current) and high reliability can be provided.

Figure 33D:
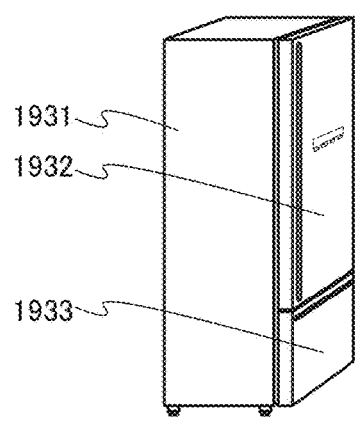

FIG. 33D illustrates an electric refrigerator-freezer including a housing 1931, a door for a refrigerator 1932, a door for a freezer 1933, and the like. In the housing 1931, a temperature sensor and a reader are provided, data on a product taken in and out is read by the reader, the data on the product is sent to an arithmetic device in the refrigerator, and the arithmetic device makes the memory device store data on the product as necessary. When the composite material described in any one of Embodiments 1 to 4 is used for a semiconductor element in a temperature sensor, a reader, an arithmetic device, or a memory device, a device having high electrical characteristics (e.g., high on-state current) and high reliability can be provided.

Figure 33E:
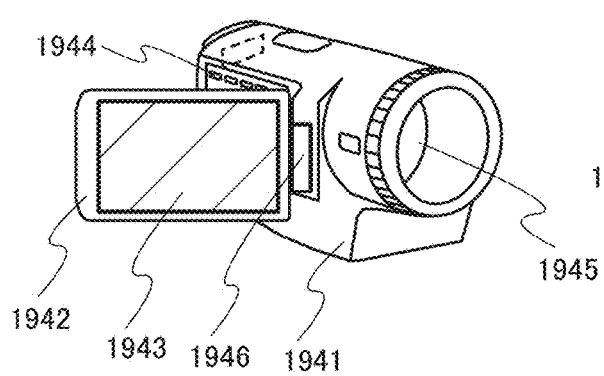

FIG. 33E illustrates a video camera including a first housing 1941, a second housing 1942, a display portion 1943, operation keys 1944, a lens 1945, a joint 1946, and the like. The operation keys 1944 and the lens 1945 are provided in the first housing 1941, and the display portion 1943 is provided in the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942. In the first housing 1941, a memory device, an image processing circuit, and an imaging element are provided. When the composite material described in any one of Embodiments 1 to 4 is used for a semiconductor element used in the memory device, the image processing circuit, or the imaging element, a device having high electrical characteristics (e.g., high on-state current) and high reliability can be provided.

Figure 33F:
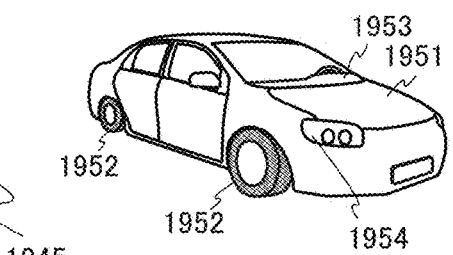
Figure 34A:
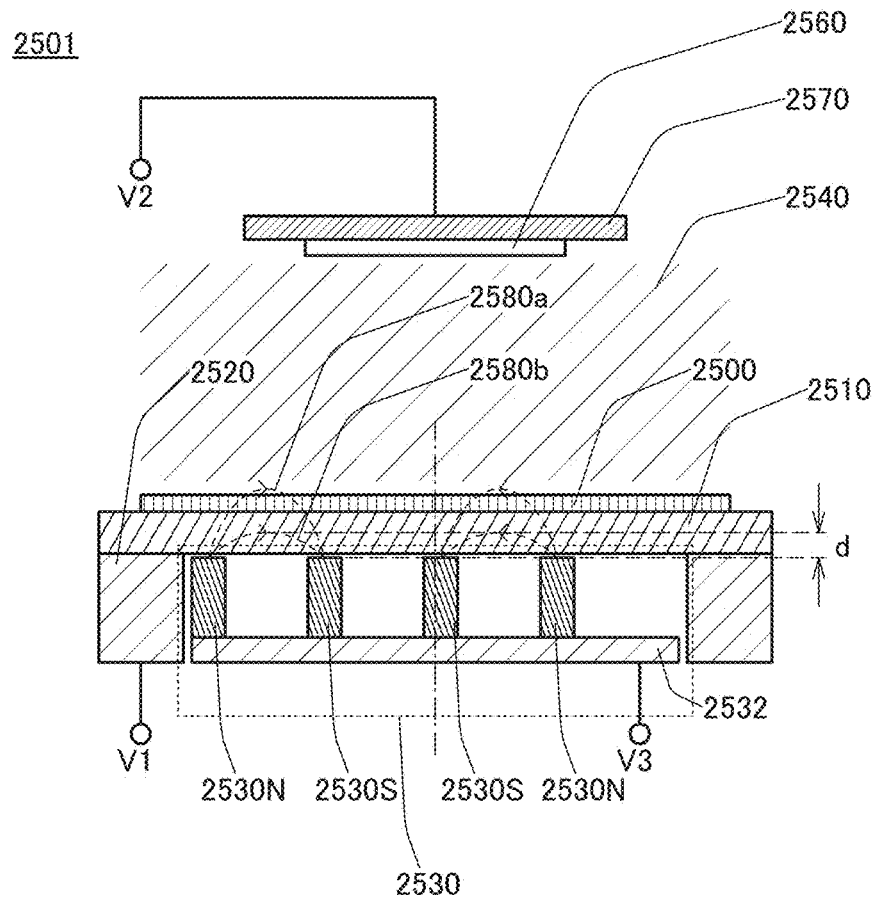
FIGS. 34A and 34B illustrate a sputtering apparatus.
Figure 34B:
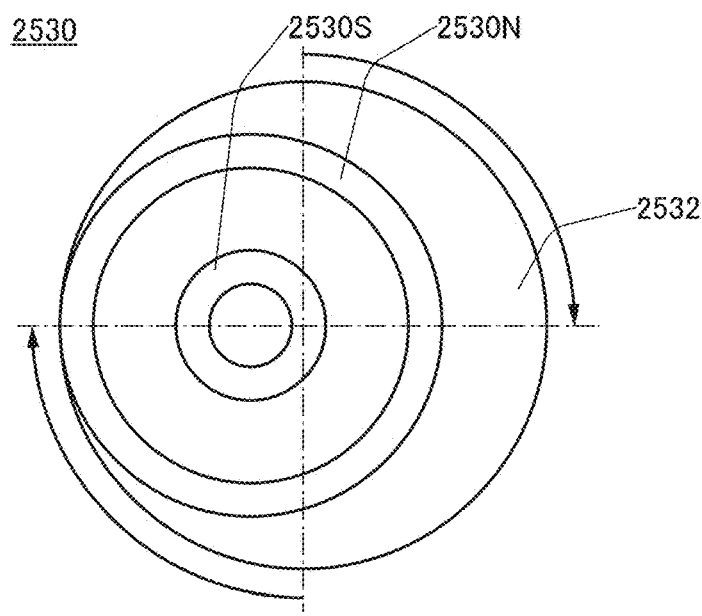
Figure 35A:
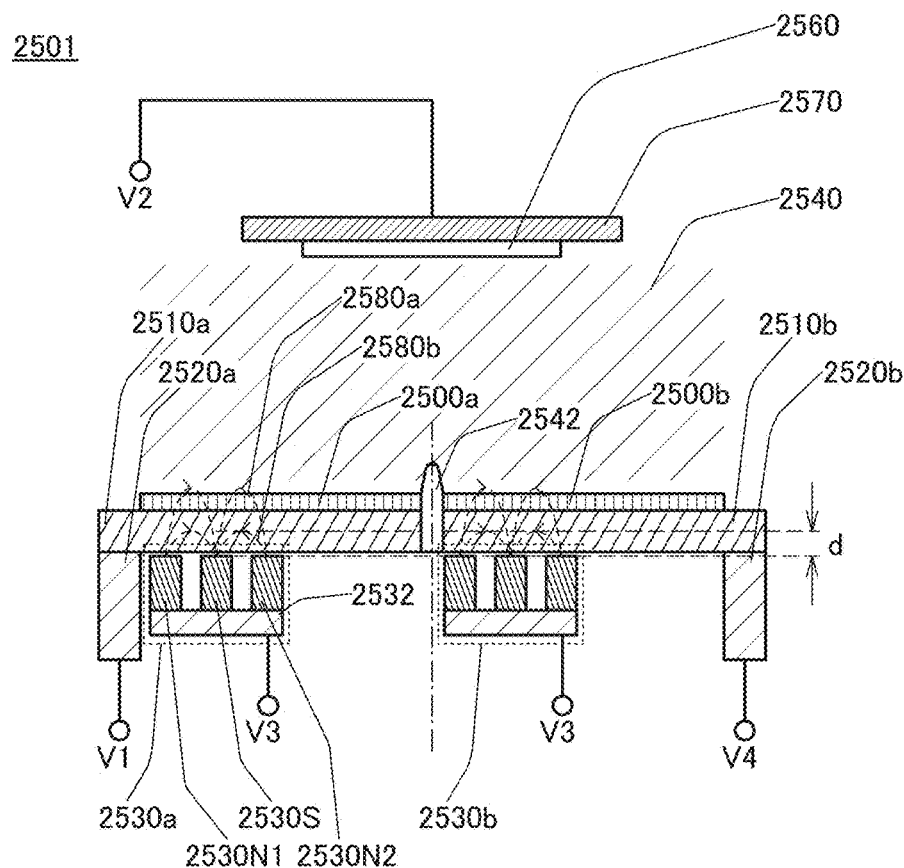
FIGS. 35A and 35B illustrate a sputtering apparatus.
Figure 35B:
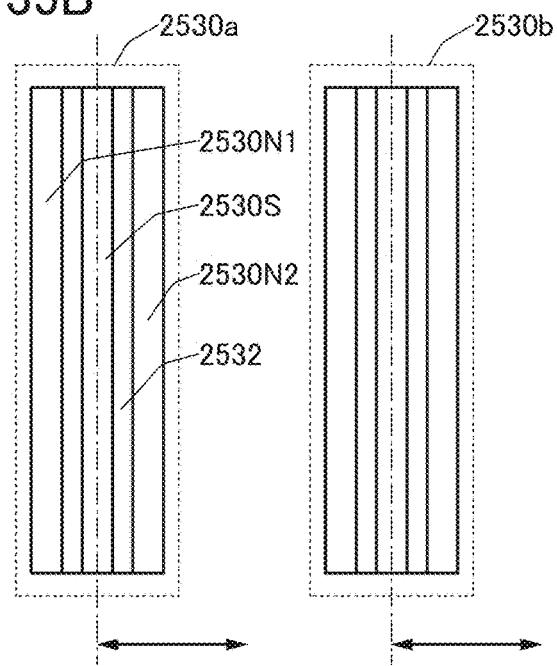
Figure 36A:
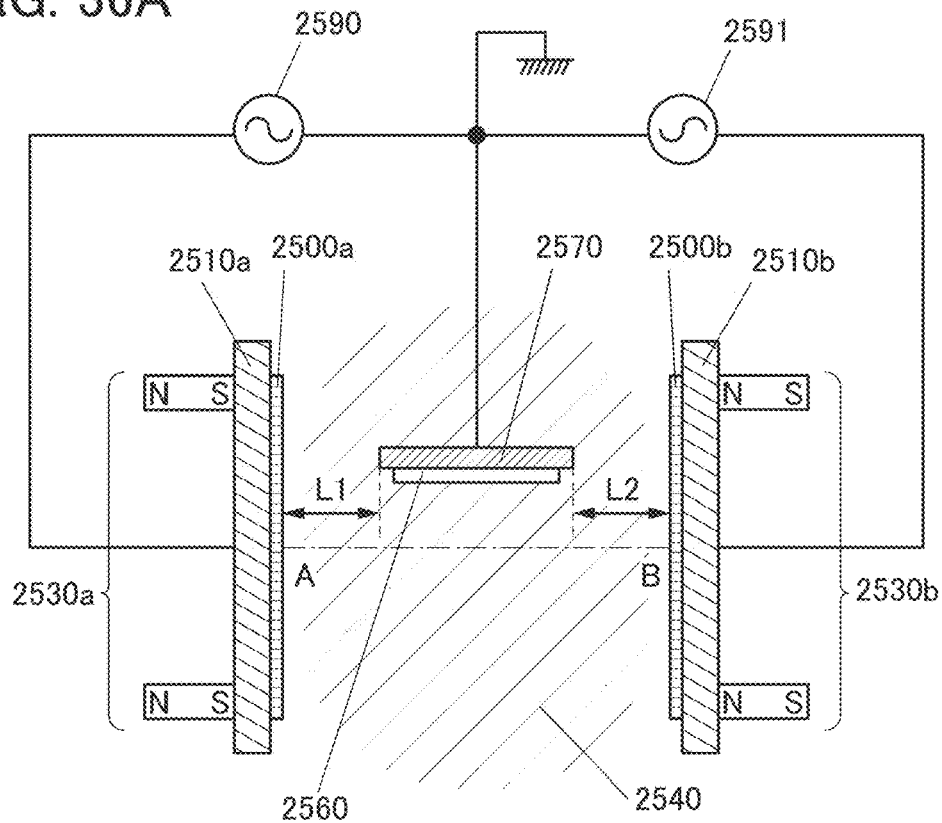
FIGS. 36A to 36C illustrate a sputtering apparatus.
Figure 36B:
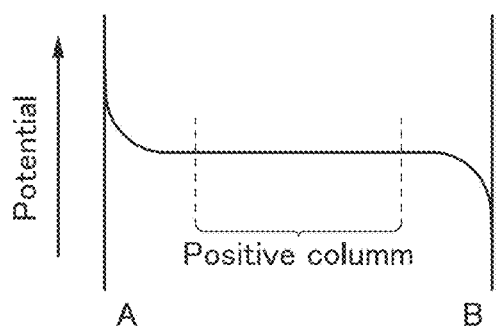
Figure 36C:
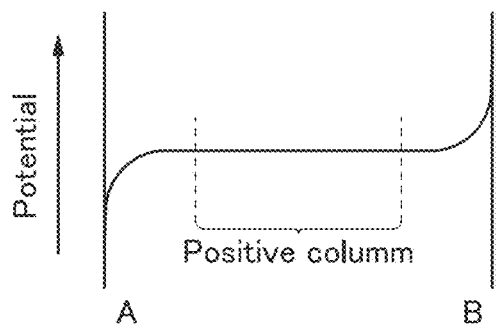
Figure 37:
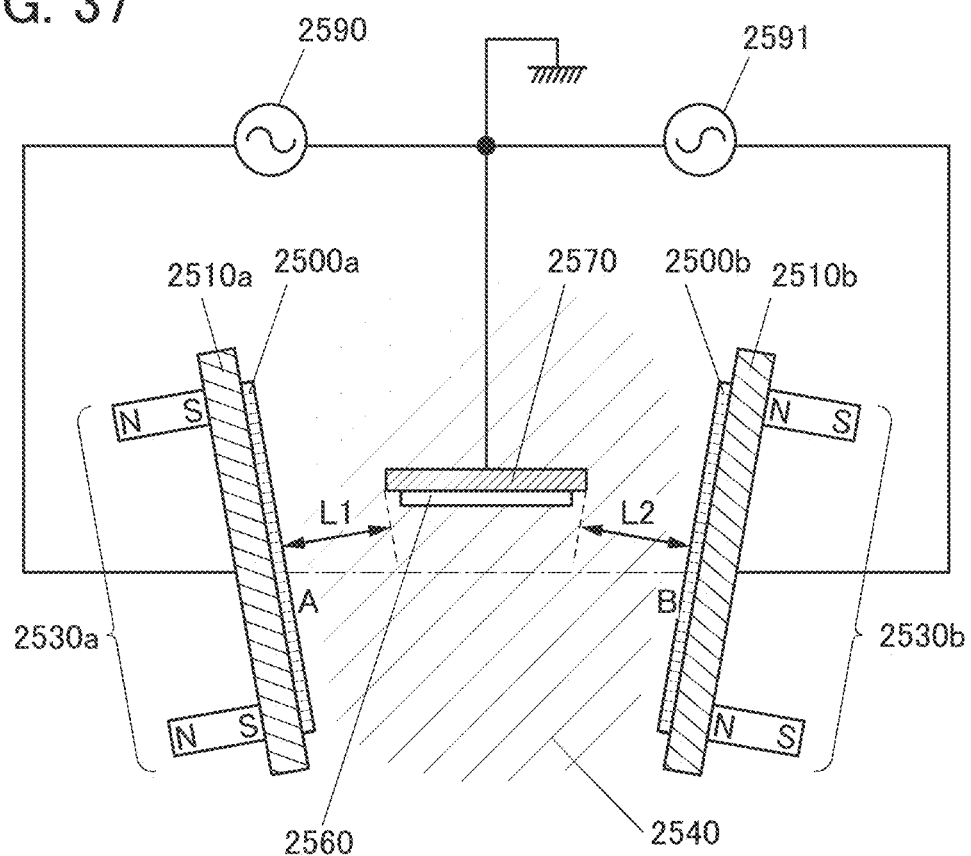
FIG. 37 illustrates a sputtering apparatus.
Figure 38:
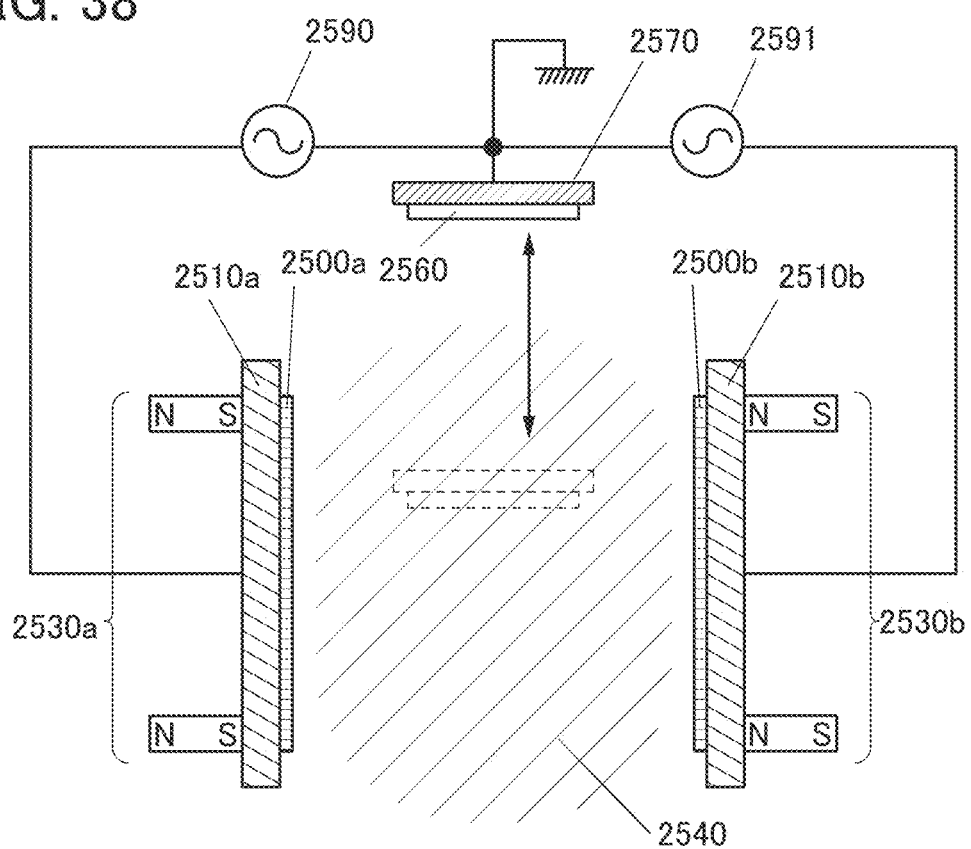
FIG. 38 illustrates a sputtering apparatus.
Figure 39A:
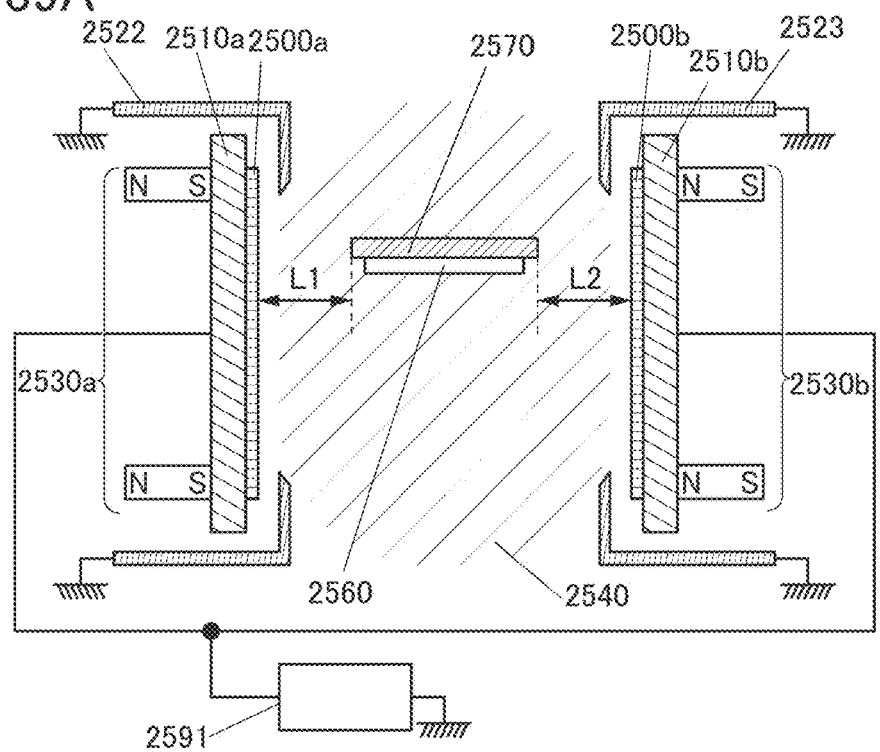
FIGS. 39A and 39B illustrate a sputtering apparatus.
Figure 39B:
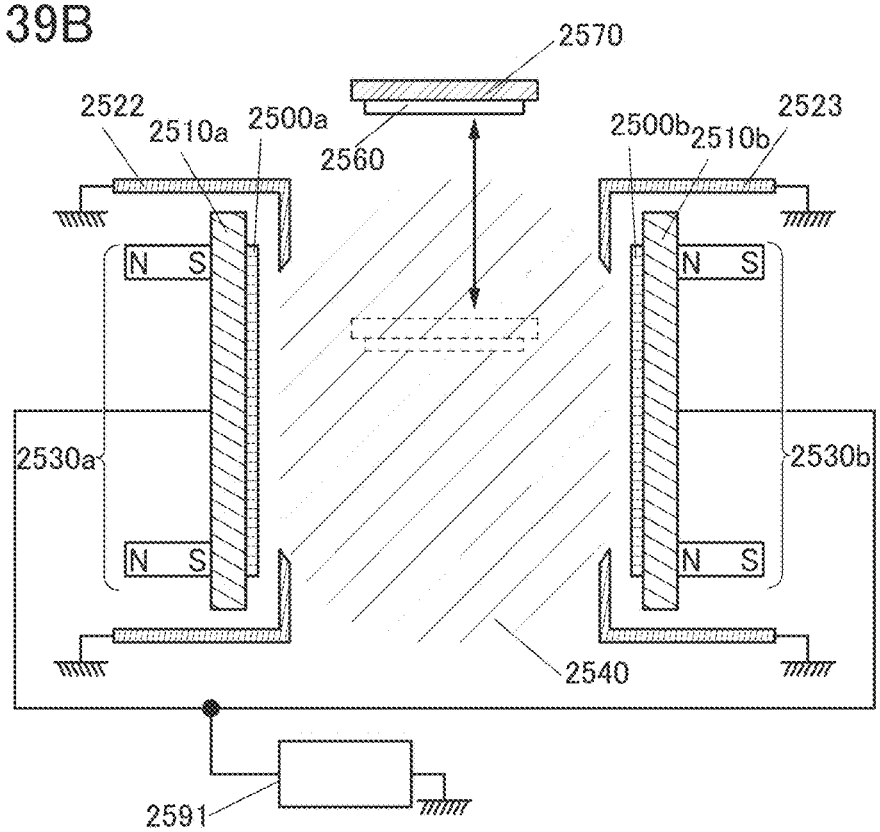
Figure 40:
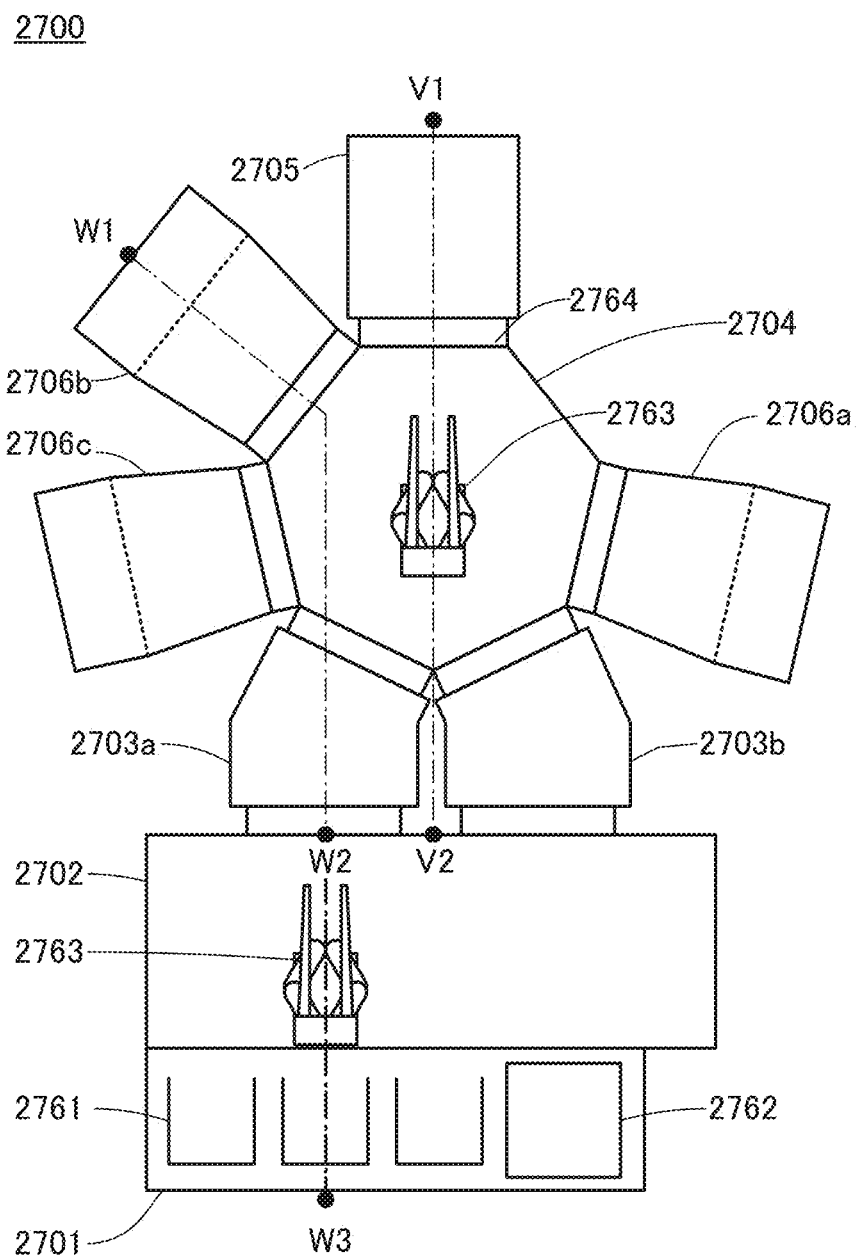
FIG. 40 is a top view illustrating an example of a deposition apparatus.
Figure 41A:
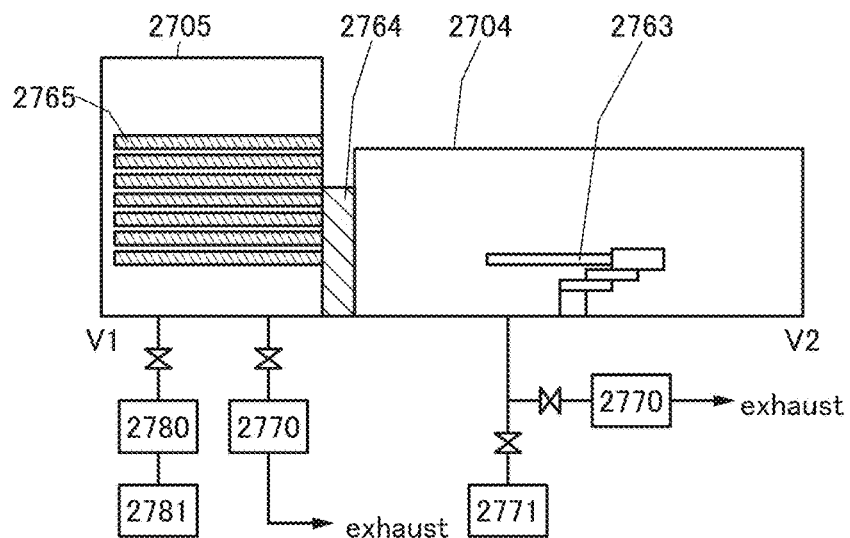
FIGS. 41A to 41C are cross-sectional views illustrating an example of a deposition apparatus.
Figure 41B:
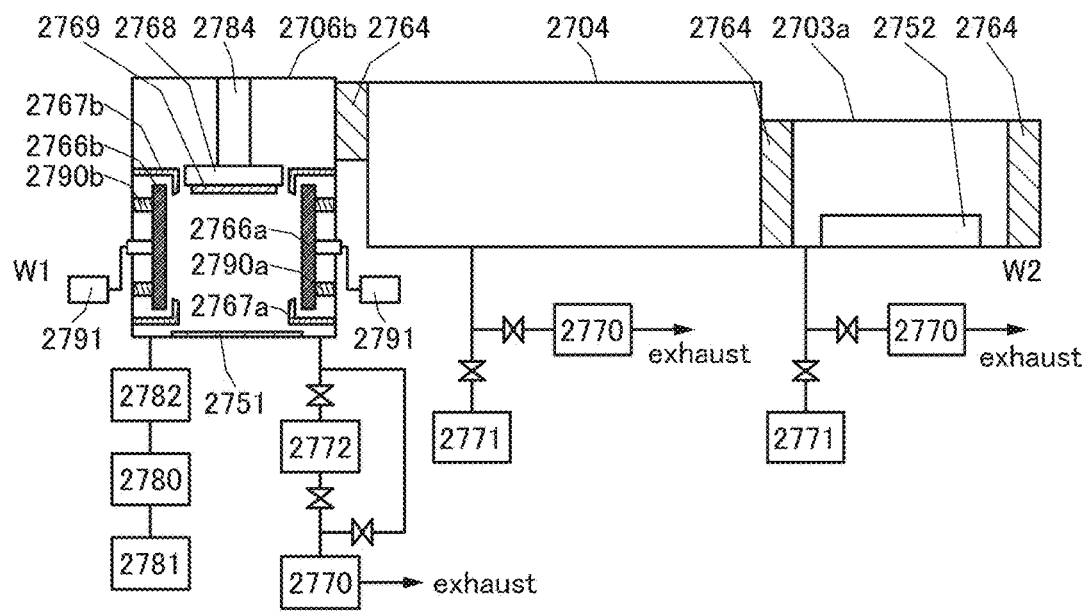
Figure 41C:
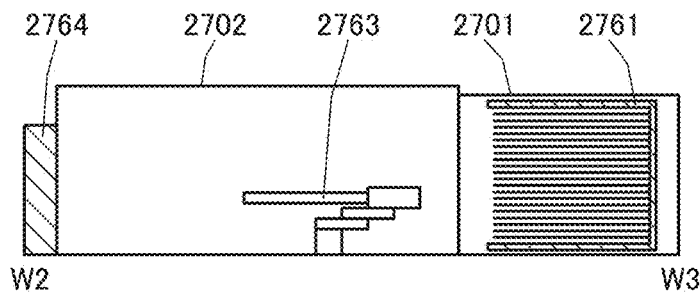

FIG. 33F illustrates an automobile including a car body 1951, wheels 1952, a dashboard 1953, lights 1954, and the like. A variety of integrated circuits such as sensors or control circuits are provided in the car body 1951 in the automobile. When the composite material described in any one of Embodiments 1 to 4 is used for a semiconductor element used in the integrated circuits such as sensors or control circuits, a device having high electrical characteristics (e.g., high on-state current) and high reliability can be provided.

The structure described in this embodiment can be used in appropriate combination with the structure described in any of the other embodiments.

EXPLANATION OF REFERENCE

10: base, 11: first region, 12: second region, and 13: third region.

This application is based on Japanese Patent Application serial no. 2016-042358 filed with Japan Patent Office on Mar. 4, 2016 and Japanese Patent Application serial no. 2016-042749 filed with Japan Patent Office on Mar. 4, 2016, the entire contents of which are hereby incorporated by reference.

The invention claimed is:

1. A semiconductor device comprising:
a semiconductor element including a composite comprising first regions and second regions,
wherein:
one of the second regions is in contact with one of the first regions,
the one of the first regions and the one of the second regions are arranged in a thickness direction of the composite,
the first regions each include at least In, Ga, and Zn,
the second regions each include In and Zn,
the second regions have a lower Ga concentration than the first regions,
the second regions serve as a well portion of a well potential,
the second regions have a smaller bandgap than the first regions, and
the one of the second regions is between the first regions in the thickness direction of the composite.

2. The semiconductor device according to claim 1, wherein a thickness of each of the first regions is greater than or equal to 0.5 nm and less than or equal to 5 nm.

3. The semiconductor device according to claim 1, wherein a thickness of each of the second regions is greater than or equal to 0.5 nm and less than or equal to 5 nm.

4. The semiconductor device according to claim 1, wherein the first regions and the second regions are alternately stacked.

5. The semiconductor device according to claim 1, wherein the composite has an atomic ratio of In:Ga:Zn =4:2:3 or a neighborhood.

6. The semiconductor device according to claim 1, wherein the composite has an atomic ratio of In:Ga:Zn =5:2:5 or a neighborhood.

7. The semiconductor device according to claim 1, wherein the composite has an atomic ratio of In:Ga:Zn =6:1:6 or a neighborhood.

8. A semiconductor device comprising:
a semiconductor element including a composite comprising first regions and second regions
wherein:
one of the second regions is in contact with one of the first regions,
the one of the first regions and the one of the second regions are arranged in a thickness direction of the composite,
the first regions and the second regions each include at least In, Ga, and Zn,
the second regions have a lower Ga concentration than the first regions,
the second regions serve as a well portion of a well potential,
the second regions have a smaller bandgap than the first regions, and
the one of the second regions is between the first regions in the thickness direction of the composite.

9. The semiconductor device according to claim 8, wherein a thickness of each of the first regions is greater than or equal to 0.5 nm and less than or equal to 5 nm.

10. The semiconductor device according to claim 8, wherein a thickness of each of the second regions is greater than or equal to 0.5 nm and less than or equal to 5 nm.

* * * * *